(12) United States Patent
Yamazaki et al.

(10) Patent No.: US 8,598,013 B2
(45) Date of Patent: Dec. 3, 2013

(54) METHOD FOR MANUFACTURING SOI SUBSTRATE AND SEMICONDUCTOR DEVICE

(75) Inventors: Shunpei Yamazaki, Setagaya (JP); Hideto Ohnuma, Atsugi (JP); Yoichi Iikubo, Machida (JP); Yoshiaki Yamamoto, Atsugi (JP); Kenichiro Makino, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 582 days.

(21) Appl. No.: 12/247,470

(22) Filed: Oct. 8, 2008

(65) Prior Publication Data

US 2009/0137101 A1    May 28, 2009

(30) Foreign Application Priority Data

Oct. 10, 2007    (JP) .................... 2007-265012

(51) Int. Cl.
*H01L 21/30*    (2006.01)
*H01L 21/46*    (2006.01)

(52) U.S. Cl.
USPC .... 438/458; 438/459; 438/406; 257/E21.568; 257/E21.57; 257/E21.561

(58) Field of Classification Search
USPC .............. 438/458, 459, 406; 257/E21.568, 257/E21.57, E21.561
See application file for complete search history.

(56) References Cited

U.S. PATENT DOCUMENTS

| 5,374,564 A | 12/1994 | Bruel |
| 6,110,845 A | 8/2000 | Seguchi et al. |
| 6,127,702 A | 10/2000 | Yamazaki et al. |

(Continued)

FOREIGN PATENT DOCUMENTS

| EP | 1 039 513 | 9/2000 |
| EP | 1 045 448 | 10/2000 |

(Continued)

OTHER PUBLICATIONS

Ion-Cutting of Si Onto Glass by Pulsed and Direct-Current Plasma Immersion Ion Implantation, Lu. F. et al., 2003, Journal of Vacuum Science & Technology B, vol. 21, No. 5, pp. 2109-2113.

(Continued)

*Primary Examiner* — Kimberly Rizkallah
*Assistant Examiner* — Maria Ligai
(74) *Attorney, Agent, or Firm* — Eric J. Robinson; Robinson Intellectual Property Law Office, P.C.

(57) ABSTRACT

To provide a method for manufacturing an SOI substrate provided with a semiconductor layer which can be used practically even when a substrate having a low heat-resistant temperature, such as a glass substrate or the like is used. The semiconductor layer is transferred to a supporting substrate by the steps of irradiating a semiconductor wafer with ions from one surface to form a damaged layer; forming an insulating layer over one surface of the semiconductor wafer; attaching one surface of the supporting substrate to the insulating layer formed over the semiconductor wafer and performing heat treatment to bond the supporting substrate to the semiconductor wafer; and performing separation at the damaged layer into the semiconductor wafer and the supporting substrate. The damaged layer remaining partially over the semiconductor layer is removed by wet etching and a surface of the semiconductor layer is irradiated with a laser beam.

23 Claims, 38 Drawing Sheets

(56) References Cited

U.S. PATENT DOCUMENTS

| | | |
|---|---|---|
| 6,271,101 B1 | 8/2001 | Fukunaga |
| 6,335,231 B1 | 1/2002 | Yamazaki et al. |
| 6,372,609 B1 | 4/2002 | Aga et al. |
| 6,380,046 B1 | 4/2002 | Yamazaki |
| 6,388,652 B1 | 5/2002 | Yamazaki et al. |
| 6,468,923 B1 | 10/2002 | Yonehara et al. |
| 6,534,380 B1 * | 3/2003 | Yamauchi et al. ............ 438/455 |
| 6,602,761 B2 | 8/2003 | Fukunaga |
| 6,653,209 B1 | 11/2003 | Yamagata |
| 6,686,623 B2 | 2/2004 | Yamazaki |
| 6,767,802 B1 | 7/2004 | Maa et al. |
| 6,778,164 B2 | 8/2004 | Yamazaki et al. |
| 6,803,264 B2 | 10/2004 | Yamazaki et al. |
| 6,855,584 B2 | 2/2005 | Yamazaki et al. |
| 6,875,633 B2 | 4/2005 | Fukunaga |
| 6,884,694 B2 | 4/2005 | Park et al. |
| 6,927,148 B2 | 8/2005 | Ito |
| 7,015,083 B2 | 3/2006 | Yamazaki et al. |
| 7,064,049 B2 | 6/2006 | Ito et al. |
| 7,119,365 B2 | 10/2006 | Takafuji et al. |
| 7,148,124 B1 | 12/2006 | Usenko |
| 7,176,525 B2 | 2/2007 | Fukunaga |
| 7,199,024 B2 | 4/2007 | Yamazaki |
| 7,256,776 B2 | 8/2007 | Yamazaki et al. |
| 7,291,523 B2 | 11/2007 | Yamazaki et al. |
| 7,338,882 B2 | 3/2008 | Park et al. |
| 7,354,844 B2 | 4/2008 | Endo et al. |
| 7,364,984 B2 | 4/2008 | Endo et al. |
| 7,410,882 B2 | 8/2008 | Wong et al. |
| 7,416,960 B2 | 8/2008 | Endo et al. |
| 7,473,971 B2 | 1/2009 | Yamazaki et al. |
| 7,476,576 B2 | 1/2009 | Yamazaki et al. |
| 7,535,053 B2 | 5/2009 | Yamazaki |
| 7,579,654 B2 | 8/2009 | Couillard et al. |
| 7,619,250 B2 | 11/2009 | Takafuji et al. |
| 7,820,524 B2 | 10/2010 | Miyairi et al. |
| 7,867,873 B2 | 1/2011 | Murakami et al. |
| 8,034,694 B2 | 10/2011 | Ohnuma et al. |
| 2002/0011627 A1 | 1/2002 | Takemura et al. |
| 2003/0183876 A1 | 10/2003 | Takafuji et al. |
| 2003/0232487 A1 * | 12/2003 | Letertre et al. ............ 438/459 |
| 2004/0104424 A1 | 6/2004 | Yamazaki |
| 2004/0183133 A1 * | 9/2004 | Takafuji et al. ............ 257/347 |
| 2005/0009252 A1 | 1/2005 | Yamazaki et al. |
| 2005/0042798 A1 | 2/2005 | Nagao et al. |
| 2006/0040469 A1 * | 2/2006 | Aga et al. ............ 438/458 |
| 2006/0043072 A1 | 3/2006 | Chen et al. |
| 2007/0063281 A1 | 3/2007 | Takafuji et al. |
| 2007/0087488 A1 | 4/2007 | Moriwaka |
| 2007/0108510 A1 | 5/2007 | Fukunaga |
| 2007/0141803 A1 | 6/2007 | Boussagol et al. |
| 2007/0173000 A1 | 7/2007 | Yamazaki |
| 2007/0184632 A1 | 8/2007 | Yamazaki et al. |
| 2007/0238312 A1 | 10/2007 | Murakami et al. |
| 2007/0281172 A1 * | 12/2007 | Couillard et al. ............ 428/446 |
| 2007/0281399 A1 | 12/2007 | Cites et al. |
| 2007/0281440 A1 | 12/2007 | Cites et al. |
| 2007/0291022 A1 | 12/2007 | Yamazaki et al. |
| 2008/0138963 A1 | 6/2008 | Yamazaki et al. |
| 2008/0188060 A1 * | 8/2008 | Neyret ............ 438/458 |
| 2008/0261376 A1 | 10/2008 | Yamazaki et al. |
| 2009/0001469 A1 * | 1/2009 | Yoshida et al. ............ 257/347 |
| 2009/0104750 A1 | 4/2009 | Yamazaki et al. |
| 2009/0111248 A1 | 4/2009 | Ohnuma et al. |

FOREIGN PATENT DOCUMENTS

| | | |
|---|---|---|
| EP | 1 688 990 | 8/2006 |
| JP | 11-097379 | 4/1999 |
| JP | 11-163363 | 6/1999 |
| JP | 2000-124092 | 4/2000 |
| JP | 2000-349266 | 12/2000 |
| JP | 2001-168308 | 6/2001 |
| JP | 2003-173968 | 6/2003 |
| JP | 2003-324188 | 11/2003 |
| JP | 2004-047378 A | 2/2004 |
| JP | 2004-080035 | 3/2004 |
| JP | 2004-087606 | 3/2004 |
| JP | 2005-072073 A | 3/2005 |
| JP | 2005-203596 | 7/2005 |
| JP | 2005-252244 | 9/2005 |
| JP | 2006-216807 | 8/2006 |
| WO | WO-2007/142911 | 12/2007 |

OTHER PUBLICATIONS

UV-Optics for Excimer Laser Based Crystallization Processes, Kahlert. H. et al., 2001, Materials Research Society Symposia Proceedings, vol. 685E, D6.2.1-D6.2.6.

* cited by examiner

Without Processing

Wet Etching

Laser Beam Irradiation

Wet Etching + Laser Beam Irradiation

Wet Etching + Laser Beam Irradiation + Dry Etching

Wet Etching + Laser Beam Irradiation + Wet Etching

Without Processing

Wet Etching

Laser Beam Irradiation

Wet Etching + Laser Beam Irradiation

Wet Etching + Laser Beam Irradiation + Dry Etching

Wet Etching + Laser Beam Irradiation + Wet Etching

FIG. 28

| Accelerating voltage | Ratio of hydrogen atom (H) (X : Y) | Ratio of hydrogen ion species (X : Y/3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

METHOD FOR MANUFACTURING SOI SUBSTRATE AND SEMICONDUCTOR DEVICE

BACKGROUND OF THE INVENTION

1. Field of the Invention

The present invention relates to a method for manufacturing a silicon-on-insulator (SOI) substrate having a so-called SOI structure in which a semiconductor layer is provided on an insulating surface, and a method for manufacturing semiconductor device having an SOI structure.

2. Description of the Related Art

Integrated circuits have been developed, which use a semiconductor substrate called a silicon-on-insulator (hereinafter also referred to as an SOI) that has a thin single crystal semiconductor layer over an insulating surface, instead of a silicon wafer that is manufactured by thinly slicing an ingot of a single crystal semiconductor. An integrated circuit using an SOI substrate has been attracting attention because parasitic capacitance between drains of the transistors and the substrate is reduced and the performance of the semiconductor integrated circuit is improved.

As a method for manufacturing SOI substrates, a hydrogen ion implantation separation method is known (for example, see Patent Document 1: Japanese Published Patent Application No. 2000-124092). The hydrogen ion implantation separation method is a method in which hydrogen ions are implanted into a silicon wafer to form a damaged layer at a predetermined depth from a surface of the silicon wafer, and the silicon wafer is separated at the damaged layer, whereby a thin silicon layer is bonded to another silicon wafer. In addition to the heat treatment for separation of a silicon layer, it is necessary to perform heat treatment in an oxidizing atmosphere to form an oxide film over the silicon layer, remove the oxide film, and perform heat treatment at 1000° C. to 1300° C. to increase bonding strength.

On the other hand, a semiconductor device in which an insulating substrate such as high heat resistance glass substrate is provided with a silicon layer is disclosed (e.g., see Reference 2: Japanese Published Patent Application No. H11-163363). This semiconductor device has a structure in which the entire surface of crystallized glass having a distortion point of greater than or equal to 750° C. is protected by an insulating silicon film and a silicon layer obtained by a hydrogen ion implantation separation method is attached onto the insulating silicon film.

SUMMARY OF THE INVENTION

In an ion irradiation step which is performed to form a damaged layer, the silicon layer is damaged by being irradiated with ions. In heat treatment to increase the bonding strength between the silicon layer and a supporting substrate, damage to the silicon layer by an ion irradiation step is repaired.

However, when a substrate having a low heat-resistant temperature, such as a glass substrate or the like, is used for the supporting substrate, heat treatment at a temperature of greater than or equal to 1000° C. cannot be performed and the damage to the silicon layer by the above ion irradiation step cannot be sufficiently repaired.

In the conventional hydrogen ion implantation separation method, after separating a silicon layer from a silicon wafer, a CMP process is required in order to planarize the separation surface and thin the silicon layer to a predetermined thickness. Therefore, a conventional SOI substrate is unsuitable for increase in area and there exist factors of impeding productivity and reduction in manufacturing cost.

In view of the foregoing problems, an object of the present invention is to provide a method for manufacturing an SOI substrate in which a substrate having a low heat-resistant temperature, such as a glass substrate or the like, is used. In addition, another object of the present invention is to manufacture a highly reliable semiconductor device using such an SOI substrate.

A semiconductor wafer is irradiated with ions from one surface to form a damaged layer. Then, an insulating layer is formed over one surface of the semiconductor wafer, and one surface of a supporting substrate is bonded to the insulating layer formed over the semiconductor wafer and heat treatment is performed, so that the supporting substrate and the semiconductor wafer are bonded to each other. Next, the semiconductor wafer is separated at the damaged layer in a state where the semiconductor layer remains over one surface of the supporting substrate. After that, the semiconductor layer is etched by wet etching and irradiated with a laser beam.

Further, after irradiating the semiconductor layer with the laser beam, one of dry etching and wet etching or a combination of the both etchings may be performed.

By forming a damaged layer in a semiconductor wafer and separating the semiconductor wafer at the damaged layer, a semiconductor layer is transferred to a supporting substrate and the semiconductor layer is etched by wet etching and irradiated with a laser beam, whereby an SOI substrate having the semiconductor layer with reduced crystal defects and high planarity can be manufactured. Further, an SOI substrate in which a substrate having a low heat-resistant temperature, such as a glass substrate or the like, is used can be manufactured. Furthermore, a highly reliable semiconductor device using such an SOI substrate can be manufactured.

By using a semiconductor layer included in such an SOI substrate, a semiconductor device that includes various semiconductor elements, memory elements, integrated circuits, or the like which have high performance and high reliability can be manufactured with high yield.

BRIEF DESCRIPTION OF THE DRAWINGS

In the accompanying drawings:

FIG. 28 is a table listing fitting parameters (hydrogen atom ratios and hydrogen ion species ratios).

DETAILED DESCRIPTION OF THE INVENTION

Figure 1A:
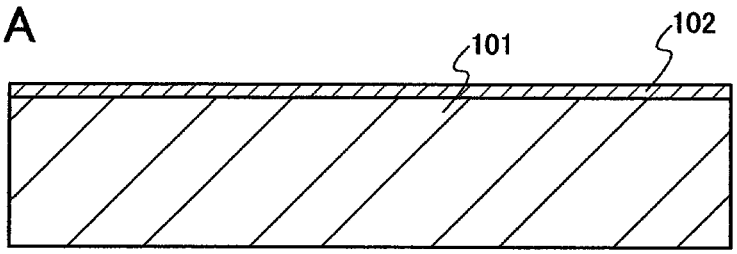
FIGS. 1A to 1D are views illustrating a method for manufacturing an SOI substrate according to the present invention.

The embodiment modes according to the present invention will hereinafter be described referring to the accompanying drawings. It is easily understood by those who skilled in the art that the embodiment modes and details herein disclosed can be modified in various ways without departing from the purpose and the spirit of the present invention. Therefore, the present invention is not construed as being limited to the description of the following embodiment modes. Note that the same portions or portions having a similar function are denoted by the same reference numeral through different diagrams in a structure of the present invention to be described hereinafter, and repetitive description thereof is omitted.

Embodiment Mode 1

In this embodiment mode, a method for manufacturing an SOI substrate including the steps of forming a damaged layer in a semiconductor wafer, separating the semiconductor wafer at the damaged layer, etching a semiconductor layer which is bonded to a supporting substrate having an insulating surface by wet etching and irradiating the semiconductor layer with laser beam will be described with reference to drawings. Further, in this embodiment mode, a method for manufacturing an SOI substrate, an object of which is to provide a semiconductor layer for a substrate having a low heat-resistant temperature, such as a glass substrate, will also be described. Specifically, a method for manufacturing an SOI substrate in which the semiconductor wafer is irradiated with an ion beam, and then bonded to the supporting substrate to be separated will be described.

First, a semiconductor wafer 101 is prepared. The semiconductor wafer 101 is processed into a desired size and shape. As the semiconductor wafer 101, for example, a single crystal silicon substrate, a germanium substrate, a semiconductor substrate made of a compound such as gallium arsenide and indium phosphide, or the like can be given. As the semiconductor wafer of the single crystal silicon substrate, typically, substrates which are 5 inches (125 mm) in diameter, 6 inches (150 mm) in diameter, 8 inches (200 mm) in diameter, and 12 inches (300 mm) in diameter, and which are circular, can be given. Note that the shape of the single crystal silicon substrate is not limited to a circular shape and a silicon substrate which is processed into a rectangular shape can also be used.

A first insulating layer 102 containing nitrogen is formed over one surface of the semiconductor wafer 101 (see FIG. 1A). The first insulating layer 102 containing nitrogen is preferably formed in order to prevent impurity contamination from the supporting substrate when part of the semiconductor wafer 101 is bonded to the supporting substrate to form a semiconductor layer having a single crystal structure later. That is, the first insulating layer 102 containing nitrogen serves as a barrier layer for preventing impurities such as mobile ions or moisture included in the supporting substrate from diffusing into the semiconductor layer having a single crystal structure. Accordingly, when the impurity contamination does not cause any problems, the first insulating layer 102 containing nitrogen can be omitted.

The first insulating layer 102 containing nitrogen is formed as a single layer structure or a stacked-layer structure of a silicon nitride layer, a silicon nitride oxide layer, or a silicon oxynitride layer by a chemical vapor deposition (CVD) method, a sputtering method, or the like. The first insulating layer 102 containing nitrogen is preferably formed to have a thickness in the range of 50 nm to 200 nm. For example, when the first insulating layer 102 is formed as a two-layer structure, the first insulating layer 102 containing nitrogen can be formed by stacking a silicon oxynitride layer and a silicon nitride oxide layer in this order from a side of the semiconductor wafer 101. Note that a chemical vapor deposition (CVD) method in this specification is to include a plasma CVD method, a thermal CVD method, and a photo CVD method in its category.

Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

Note that percentages of nitrogen, oxygen, silicon, and hydrogen fall within the ranges given above, where the total number of atoms contained in the silicon oxynitride film or the silicon nitride oxide film is defined as 100 at. %.

Figure 1B:
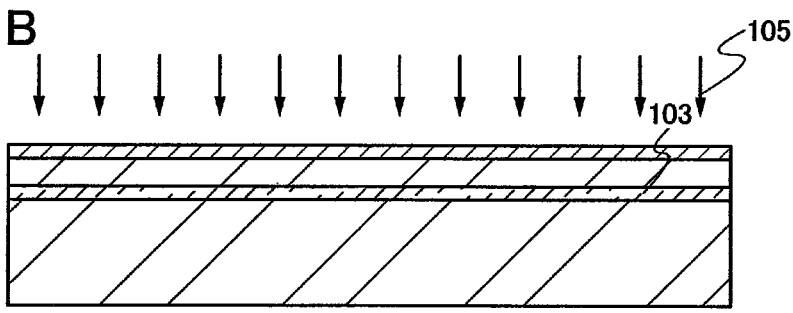

Next, the semiconductor wafer 101 is irradiated with an ion beam 105 including ions accelerated by an electric field through the first insulating layer 102, so that a damaged layer 103 is formed at a predetermined depth from one surface of the semiconductor wafer 101 (see FIG. 1B). The ion beam 105 is generated in such a manner that a source gas is excited to generate plasma of the source gas, and ions contained in the plasma are extracted from the plasma by an electric field effect.

A depth at which the damaged layer 103 is formed can be adjusted by the acceleration energy of the ion beam 105 and the incidence angle thereof. The acceleration energy can be adjusted by an acceleration voltage, dose, or the like. The damaged layer 103 is formed at a depth almost equal to the average depth at which the ions enter. The thickness of the semiconductor layer which is separated from the semiconductor wafer 101 is determined by a depth at which the semiconductor wafer 101 is irradiated with the ions. The depth at which the damaged layer 103 is formed is greater than or equal to 50 nm and less than or equal to 500 nm, preferably in the range of greater than or equal to 50 nm and less than or equal to 200 nm.

In order to irradiate the semiconductor wafer 101 with the ion beam, an ion implantation apparatus or an ion doping apparatus can be used. In an ion implantation apparatus, a source gas is excited to generate plasma, ion species are extracted from the plasma, the ion species are mass-separated, and an object to be processed is irradiated with the ion species having a predetermined mass. In an ion doping apparatus, a source gas is excited to generate plasma, ion species are extracted from the plasma, and the object to be processed is irradiated with the ion species which are not mass-separated. Note that in an ion doping apparatus provided with a mass separator, ion irradiation with mass separation can be conducted similarly to an ion implantation apparatus.

In order to form the damaged layer 103 in the semiconductor wafer 101, an ion doping method in which mass separation is not performed is preferably used rather than an ion implantation method in which mass separation is performed. Accordingly, the takt time of forming the damaged layer 103 in the semiconductor wafer 101 can be shortened.

When an ion doing apparatus is used, the ion beam 105 is generated by exciting a source gas, generating plasma, extracting ion species from the plasma and accelerating the ion species. By irradiating the semiconductor wafer 101 with the ion beam 105, the ions are introduced at a predetermined depth at a high concentration, so that the damaged layer 103 is formed.

When hydrogen ($H_2$) is used for a source gas, plasma including $H^+$, $H_2^+$, and $H_3^+$ can be generated by exciting a hydrogen gas. Proportions of ion species generated from a source gas can be changed by controlling an excitation method of plasma, a pressure of an atmosphere for generating plasma, a supply of the source gas, or the like. It is preferable that $H_3^+$ be contained in the ion beam 105 at greater than or equal to 50% with respect to the total amount of $H^+$, $H_2^+$, and $H_3^+$, and it is more preferable that the proportion of $H_3^+$ be greater than or equal to 80%.

The number of hydrogen atoms included in $H_3^+$ is larger than that included in other hydrogen ion species ($H^+$, $H_2^+$) and $H_3^+$ has a large mass; therefore, in the case of being accelerated with the same energy, the irradiation with $H_3^+$ allows the semiconductor wafer 101 to contain hydrogen in a shallower region than the irradiation with $H^+$ or $H_2^+$. Therefore, by increasing the proportion of $H_3^+$ ions included in the ion beam 105, variation in the average depth at which the hydrogen ions enter is decreased; accordingly, in the semiconductor wafer 101, the concentration profile in the hydrogen depth direction becomes steeper and the peak position of the profile can be shifted to a shallow region. It is preferable that $H_3^+$ be contained in the ion beam 105 at greater than or equal to 50% with respect to the total amount of $H^+$, $H_2^+$ and $H_3^+$, and it is more preferable that the proportion of $H_3^+$ be greater than or equal to 80%.

In the case of performing ion irradiation by an ion doping method with the use of the hydrogen gas, the acceleration voltage can be set to greater than or equal to 10 kV and less than or equal to 200 kV, and the dose can be set to greater than or equal to $1\times10^{16}$ ions/cm$^2$ and less than or equal to $6\times10^{16}$ ions/cm$^2$. By the irradiation with the hydrogen ions under this condition, the damaged layer 103 can be formed at a depth of greater than or equal to 50 nm and less than or equal to 500 nm from a surface of the semiconductor wafer 101, though depending on the ion species and its proportion in the ion beam 105.

For example, a single crystal semiconductor layer with a thickness of approximately 120 nm can be separated from the semiconductor wafer 101 when the semiconductor wafer 101 is a single crystal silicon substrate, the first insulating film 102 is formed using a silicon oxynitride film with a thickness of 50 nm and a silicon nitride oxide film with a thickness of 50 nm, the source gas is hydrogen, the acceleration voltage is 40 kV, and the dose is $2.2\times10^{16}$ ions/cm$^2$. Alternatively, when doping with the hydrogen ions is performed under the aforementioned condition except that the first insulating film 102 is a silicon oxynitride film with a thickness of 100 nm, the semiconductor layer with a thickness of approximately 70 nm can be separated from the semiconductor wafer 101.

Helium (He) can alternatively be used as a source gas of the ion beam 105. Since most of the ion species generated by exciting helium are $He^+$, the semiconductor wafer 101 can be irradiated mainly with $He^+$ even in an ion doping method in which mass separation is not performed. Therefore, microvoids can be formed in the damaged layer 103 efficiently by an ion doping method. When ion irradiation is performed using helium by an ion doping method, the acceleration voltage is set to greater than or equal to 10 kV and less than or equal to 200 kV, and the dose is set to greater than or equal to $1\times10^{16}$ ions/cm$^2$ and less than or equal to $6\times10^{16}$ ions/cm$^2$.

One or more kinds of gas selected from a halogen gas such as a chlorine gas ($Cl_2$ gas) or a fluorine gas ($F_2$ gas), a halogen compound gas such as a fluorine compound gas (e.g., $BF_3$) can be used as the source gas.

Further, the damaged layer 103 can also be formed by irradiating the semiconductor wafer 101 with ions plural times. In this case, the same source gas may be used in all ion irradiation steps or a different source gas may be used for each ion irradiation step. For example, after performing ion irradiation using a rare gas as a source gas, ion irradiation can be performed using a hydrogen gas as a source gas. Alternatively, ion irradiation can be performed using a halogen gas or a halogen compound gas, and next, ion irradiation can be performed using a hydrogen gas.

When the ion implantation apparatus is used, it is preferable to irradiate with $H_3^+$ ions by mass separation. Needless to say, irradiation with $H_2^+$ ions may be performed.

An ion irradiation method, which is one aspect of the present invention, is considered below.

In the present invention, a semiconductor wafer is irradiated with ions that are derived from hydrogen (H) (hereafter referred to as "hydrogen ion species"). More specifically, a hydrogen gas or a gas which contains hydrogen in its composition is used as a source material; a hydrogen plasma is generated; and the semiconductor wafer is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

  (1)

  (2)

  (3)

  (4)

  (5)

  (6)

  (7)

  (8)

  (9)

Figure 21:
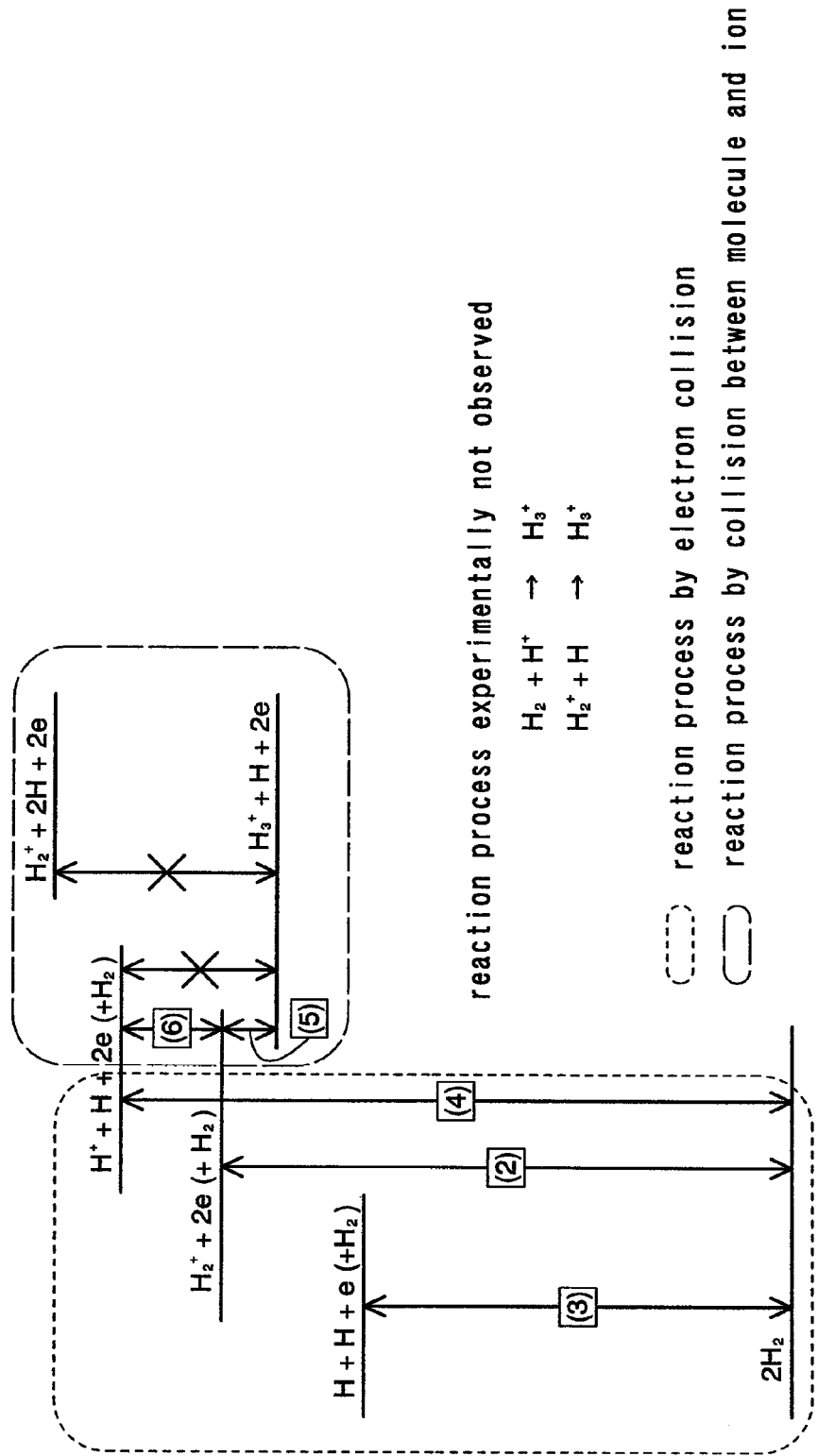
FIG. 21 is an energy diagram of hydrogen ion species.

FIG. 21 is an energy diagram which schematically illustrates some of the above reactions. Note that the energy diagram illustrated in FIG. 21 is merely a schematic diagram and does not depict the relationships of energies of the reactions exactly.

($H_3^+$ Formation Process)

As illustrated above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than approximately 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than approximately 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the difference between a potential energy at a potential before the charged particle moves and a potential energy at a potential before the collision. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be illustrated in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 22:
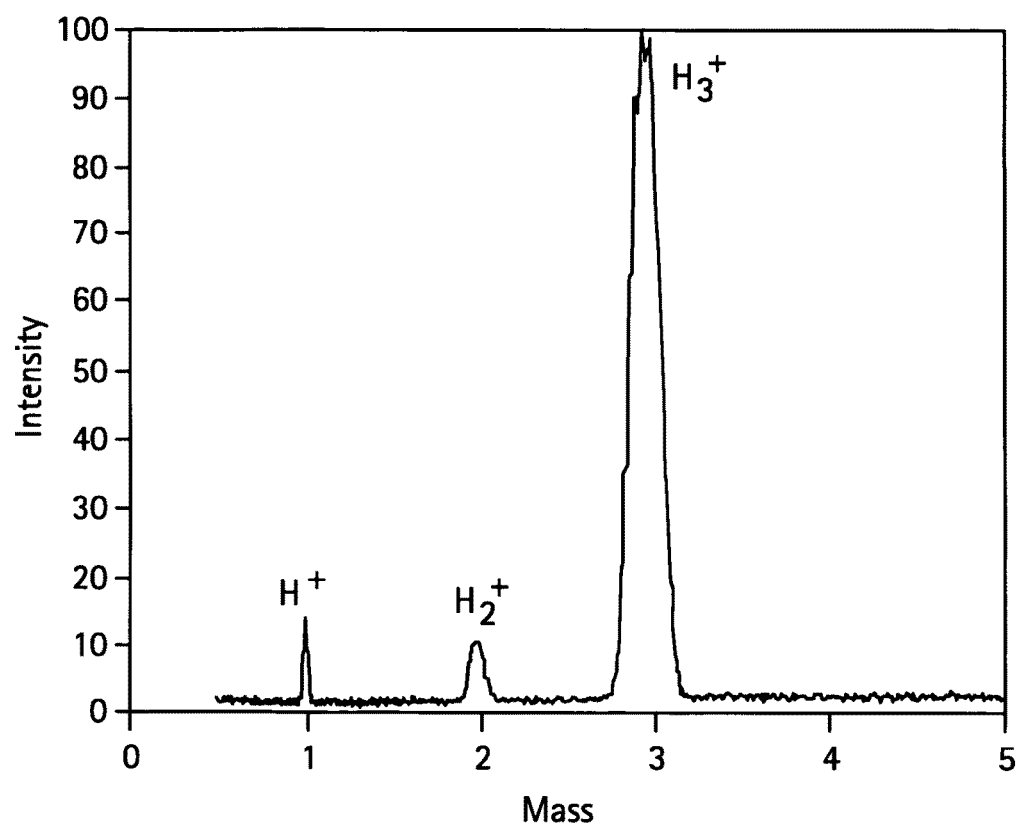
FIG. 22 is a diagram illustrating the results of ion mass spectrometry.

Here, an example, in which the proportions of ion species (particularly, the proportion of $H_3^+$) are different, is described. FIG. 22 is a graph illustrating the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 22, the number of ions with different masses is expressed as a relative proportion where the number of ions with a mass of 3 is defined as 100. It can be seen from FIG. 22 that the ratio between ion species that are generated from the ion source, i.e., the ratio between $H^+$, $H_2^+$, and $H_3^+$, is approximately 1:1:8. Note that ions at such a ratio can also be generated by an ion doping apparatus which has a plasma source portion (ion source) that generates plasma, an extraction electrode that extracts an ion beam from the plasma, and the like.

Figure 23:
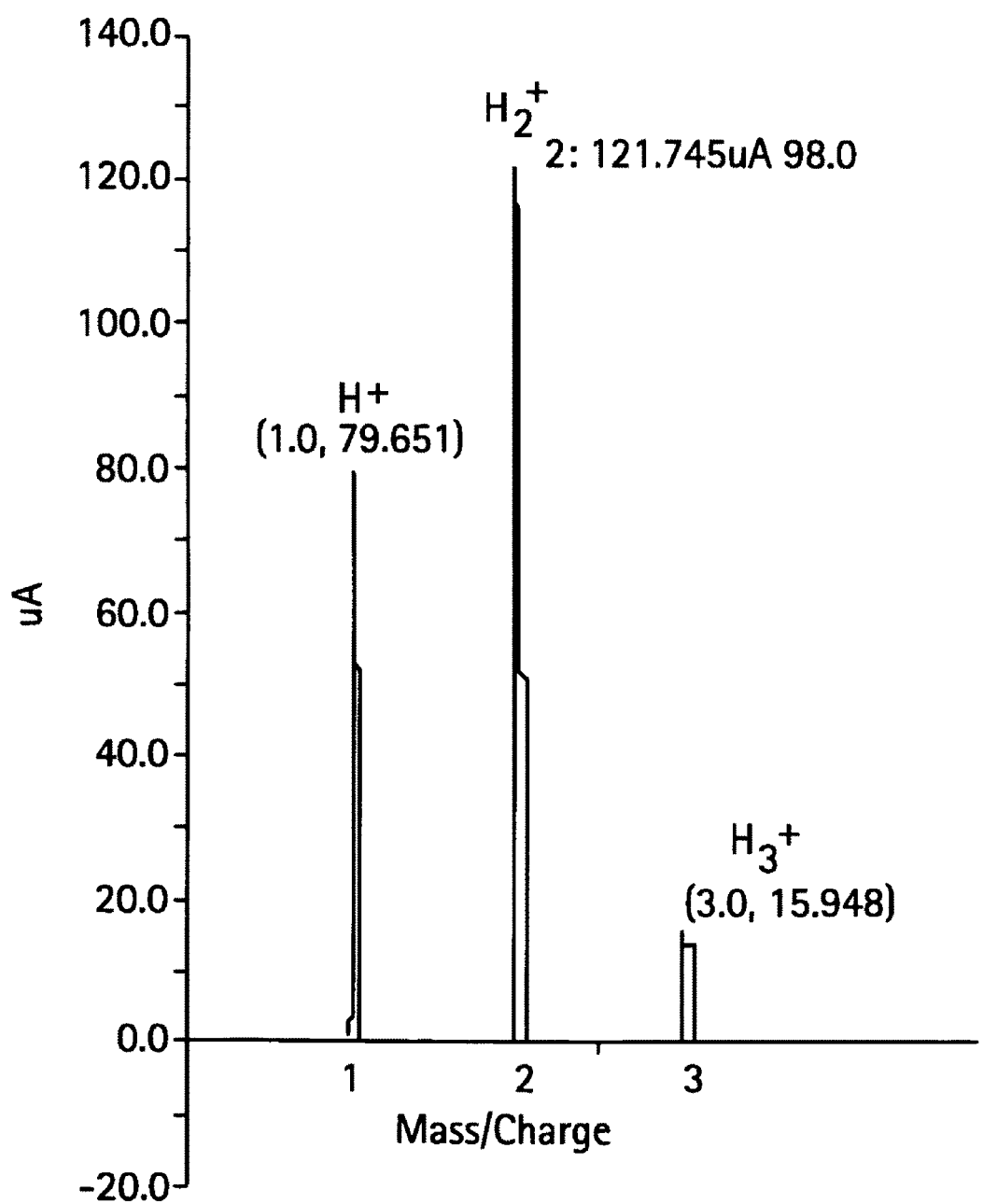
FIG. 23 is a diagram illustrating the results of ion mass spectrometry.

FIG. 23 is a graph illustrating the results of mass spectrometry of ions that are generated from $PH_3$ when an ion source different from that for the case of FIG. 22 is used and the pressure of the ion source is approximately $3 \times 10^{-3}$ Pa. The results of this mass spectrometry focus on the hydrogen ion species. In addition, the mass spectrometry was performed by measurement of ions that were extracted from the ion source. As in FIG. 22, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 23 that the ratio between ion species in plasma, i.e., the ratio between $H^+$, $H_2^+$, and $H_3^+$, is approximately 37:56:7. Note that although FIG. 23 illustrates the data obtained when the source gas is $PH_3$, the ratio between the hydrogen ion species is about the same when a 100% hydrogen gas is used as a source gas, as well.

In the case of the ion source from which the data illustrated in FIG. 23 is obtained, $H_3^+$, of $H^+$, $H_2^+$, and $H_3^+$, is generated at a proportion of only approximately 7%. On the other hand, in the case of the ion source from which the data illustrated in FIG. 22 is obtained, the proportion of $H_3^+$ can be greater than or equal to 50% (under the above-described conditions, approximately 80%). This is thought to result from the pressure and electric field inside a chamber, which is clearly illustrated in the above consideration.

($H_3^+$ Irradiation Mechanism)

When plasma that contains a plurality of ion species as illustrated in FIG. 22 is generated and a semiconductor wafer is irradiated with the generated ion species without any mass separation being performed, the surface of the semiconductor wafer is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 24:
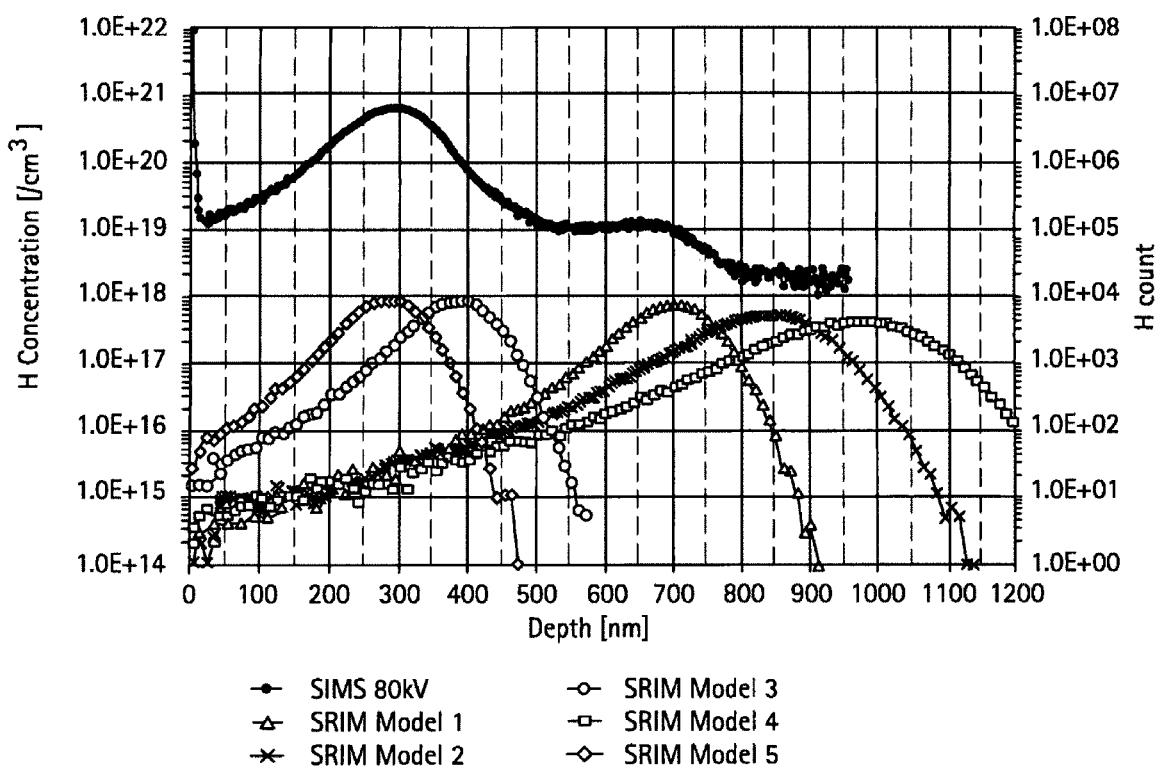
FIG. 24 is a diagram illustrating the profile (measured values and calculated values) of hydrogen in the depth direction when the accelerating voltage is 80 kV.

FIG. 24 illustrates the calculation results obtained when irradiation with the hydrogen ion species (irradiation with 100,000 atoms for H) is performed using Models 1 to 5. FIG. 24 also illustrates the hydrogen concentration (secondary ion mass spectrometry (SIMS) data) in a Si substrate irradiated with the hydrogen ion species of FIG. 22. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This illustrates that the contribution of each of Models 2 to 4 is relatively small. Considering that the kinetic energy of ions is on the order of kiloelectron volts whereas the H—H bond energy is only approximately several electron volts, it is thought that the contribution of each of Models 2 and 4 is small because $H_2^+$ and $H_3^+$ mostly split into $H^+$ or H by colliding with Si atoms.

Figure 25:
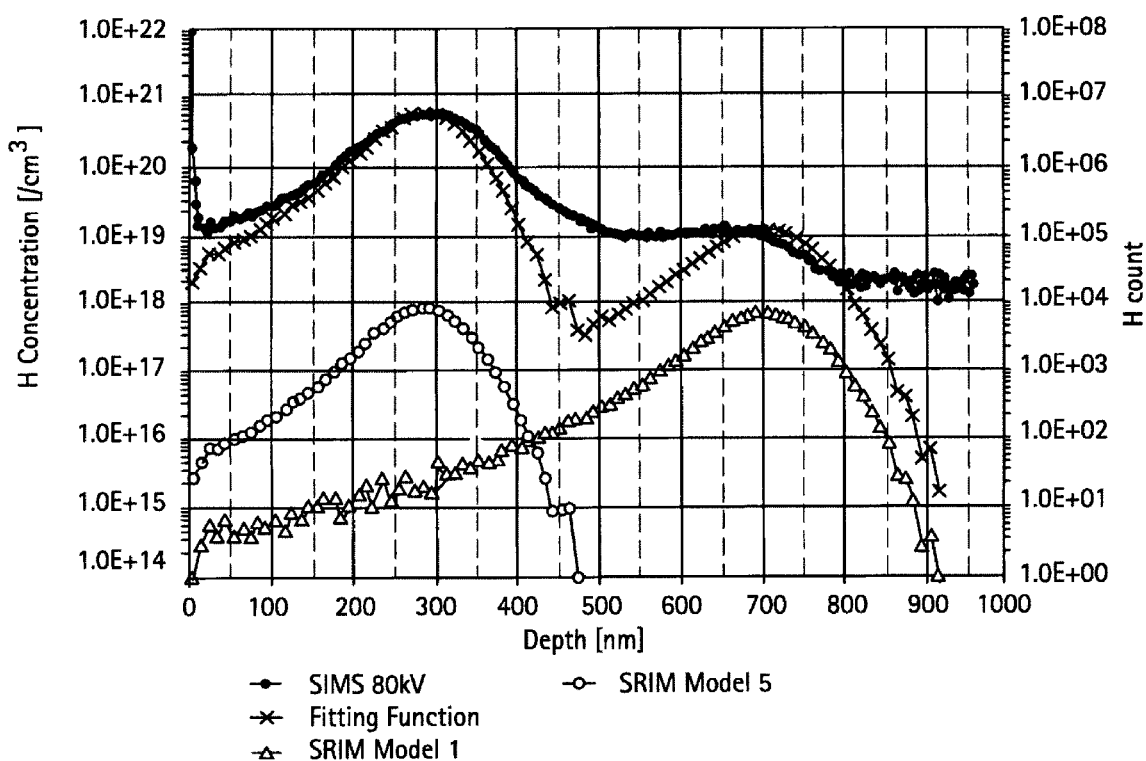
FIG. 25 is a diagram illustrating the profile (measured values, calculated values, and fitting function) of hydrogen in the depth direction when the accelerating voltage is 80 kV.
Figure 26:
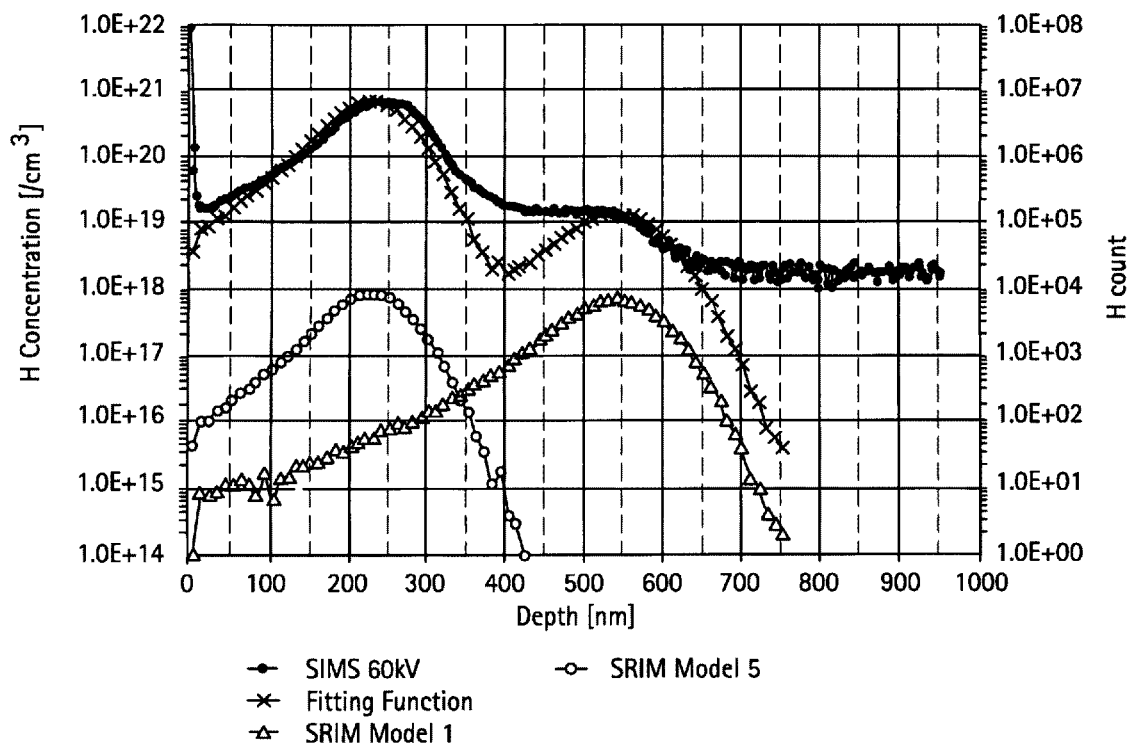
FIG. 26 is a diagram illustrating the profile (measured values, calculated values, and fitting function) of hydrogen in the depth direction when the accelerating voltage is 60 kV.
Figure 27:
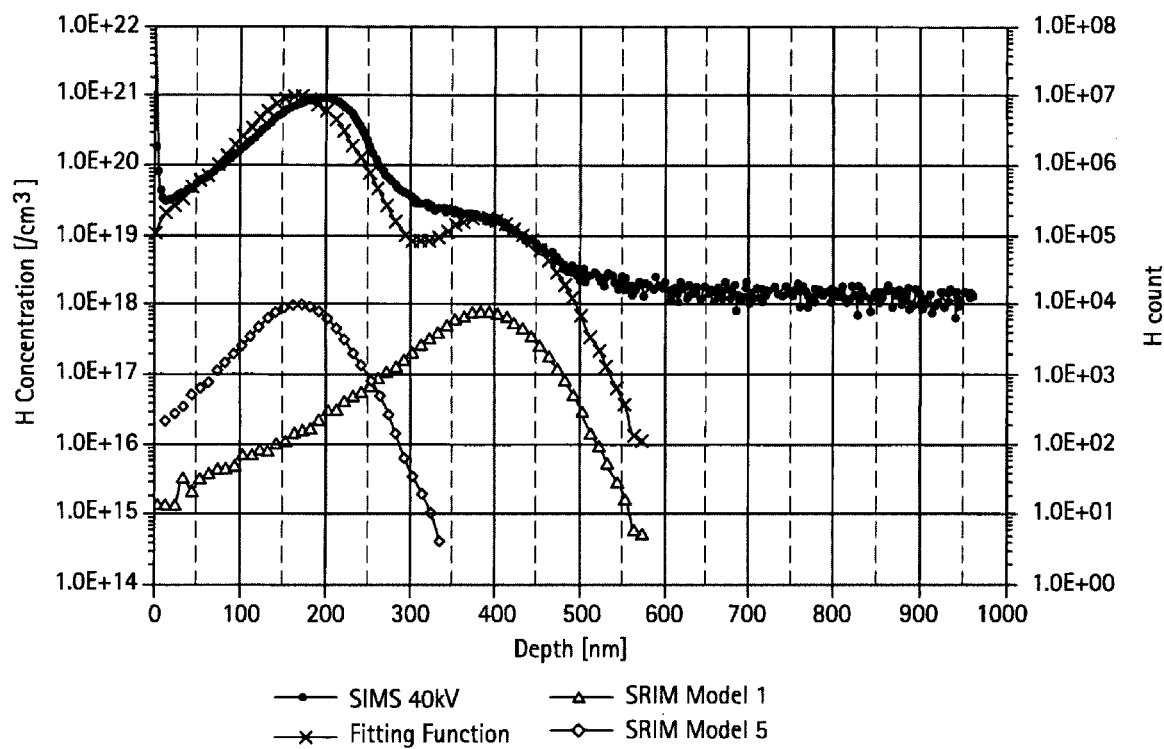
FIG. 27 is a diagram illustrating the profile (measured values, calculated values, and fitting function) of hydrogen in the depth direction when the accelerating voltage is 40 kV.

Accordingly, Models 2 to 4 will not be considered hereinafter. FIGS. 25 to 27 each illustrate the calculation results obtained when irradiation with the hydrogen ion species (irradiation with 100,000 atoms for H) is performed using Models 1 and 5. FIGS. 28 to 30 also each illustrate the hydrogen concentration (SIMS data) in an Si substrate irradiated with the hydrogen ion species of FIG. 22, and the simulation results fitted to the SIMS data (hereinafter referred to as a fitting function). Here, FIG. 25 illustrates the case where the acceleration voltage is 80 kV; FIG. 26, the case where the acceleration voltage is 60 kV; and FIG. 27, the case where the acceleration voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. Note that in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+$:$H_2^+$:$H_3^+$ is approximately 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si, and the influence due to crystallinity is not considered.

FIG. 28 lists the above-described fitting parameters. At any of the acceleration voltages, the ratio of the amount of H introduced according to Model 1 to that introduced according to Model 5 is approximately 1:42 to 1:45 (the amount of H in Model 5, when the amount of H in Model 1 is defined as 1, is approximately 42 to 45), and the ratio of the number of ions used for irradiation, $H^+$ (Model 1) to that of $H_3^+$ (Model 5) is approximately 1:14 to 1:15 (the amount of $H_3^+$ in Model 5, when the amount of $H^+$ in Model 1 is defined as 1, is approximately 14 to 15). Considering that Model 3 is not considered and the calculation assumes amorphous Si, it can be said that values close to that of the ratio between ion species used for actual irradiation ($H^+$:$H_2^+$:$H_3^+$ is approximately 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as illustrated in FIG. 22. For example, because $H_3^+$ splits into $H^+$, H, or the like to be introduced into a substrate, ion introduction efficiency can be improved compared with the case of irradiation mainly with $H^+$ or $H_2^+$. This leads to an improvement in SOI substrate production efficiency. In addition, because the kinetic energy of $H^+$ or H after $H_3^+$ splits similarly tends to be low, $H_3^+$ is suitable for manufacture of thin semiconductor layers.

Note that in this specification, a method is described in which an ion doping apparatus that is capable of irradiation with the hydrogen ion species as illustrated in FIG. 22 is used in order to efficiently perform irradiation with $H_3^+$. Ion doping apparatuses are inexpensive and excellent for use in large-area treatment. Therefore, by irradiation with $H_3^+$ with the use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion doping apparatus.

Figure 1C:
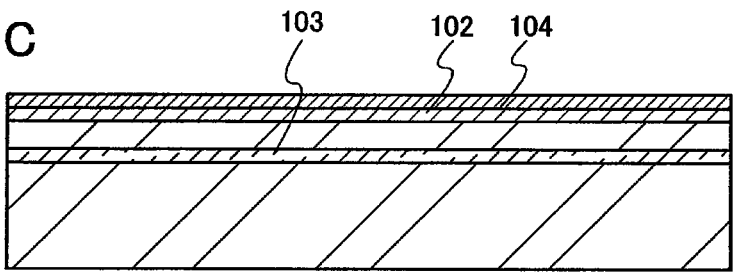

Next, a second insulating layer 104 (also referred to as a bonding layer) is formed over the semiconductor wafer 101 with the first insulating layer 102 interposed therebetween (see FIG. 1C). The second insulating layer 104 serves as a layer which is to form a bond between the semiconductor wafer 101 and the supporting substrate and is provided on a surface of the semiconductor wafer 101 where the bond with the supporting substrate is formed. The second insulating layer 104 may have a single layer structure or a stacked layer structure, and an insulating layer in which a surface which is to form a bond with the supporting substrate (hereinafter also referred to as a "bonding surface") has a smooth surface and becomes a hydrophilic surface is preferably used.

As the insulating layer which has a smooth surface and can form a hydrophilic surface, silicon oxide containing hydrogen, silicon nitride containing hydrogen, silicon nitride containing oxygen and hydrogen, silicon oxynitride, silicon nitride oxide, or the like can be used.

As silicon oxide containing hydrogen, for example, silicon oxide formed by a chemical vapor deposition method using organosilane is preferable. By using the second insulating layer 104 which is formed using organosilane, for example, a silicon oxide film, a bond between the supporting substrate and the single crystal semiconductor layer can be made strong. Examples of organosilane that can be used include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino) silane (chemical formula: $SiH(N(CH_3)_2)_3$).

A silicon oxide layer can also be formed by a chemical vapor deposition method using monosilane, disilane, or trisilane as a source gas. The silicon oxide layer may be a thermal oxide film, and it is preferable to contain chlorine.

Silicon nitride containing hydrogen can be formed by a plasma CVD method using a silane gas and an ammonia gas. Hydrogen may be added to the gases. Silicon nitride containing oxygen and hydrogen can be formed by a plasma CVD method using a silane gas, an ammonia gas and a nitrous oxide gas. In any case, any of silicon oxide, silicon oxynitride, or silicon nitride oxide, which contains hydrogen and is formed by a chemical vapor deposition method such as a plasma CVD method, a low-pressure CVD method, or a normal-pressure CVD method using a silane gas, or the like as a source gas can be used. Deposition by a chemical vapor deposition method is performed at a temperature at which degasification does not occur from the damaged layer 103 formed in the semiconductor wafer 101. For example, the deposition temperature is preferably less than or equal to 350° C. Note that, for heat treatment in separation of the single crystal semiconductor layer from the semiconductor wafer 101, a heat treatment temperature that is higher than the film formation temperature in a chemical vapor deposition method is applied. In any case, an insulating layer can be used as the second insulating layer 104 as long as it has a smooth surface and a surface to which a hydroxyl group is attached.

The thickness of the second insulating layer 104 can be greater than or equal to 10 nm and less than or equal to 200 nm. The preferable thickness is greater than or equal to 10 nm and less than or equal to 100 nm, and the more preferable thickness is greater than or equal to 20 nm and less than or equal to 50 nm.

Figure 1D:
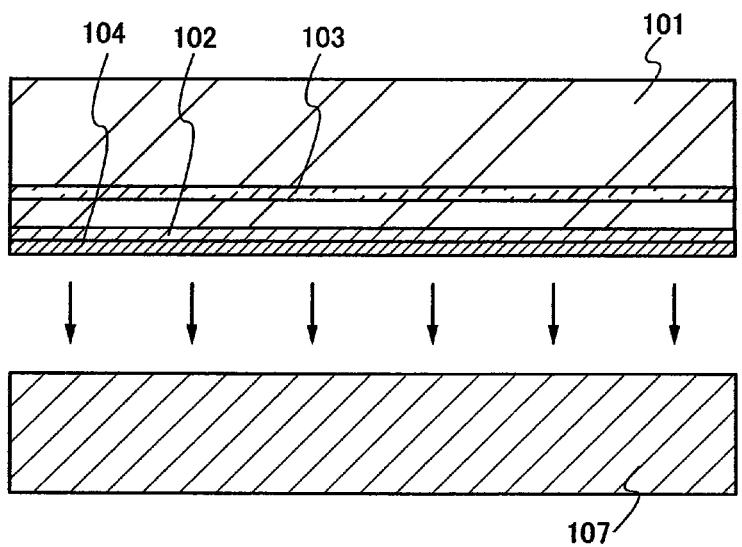

Next, the semiconductor wafer 101 and a supporting substrate 107 are bonded to each other (see FIG. 1D). A bond is formed by a surface of the second insulating layer 104 formed over the semiconductor wafer 101 and a surface of the supporting substrate 107 being placed in close contact with each other. This bond is made by a hydrogen bond or Van der Waals forces. Hydroxyl groups or water molecules over the surfaces of the semiconductor wafer 101 and the supporting substrate 107 which have become hydrophilic serve as an adhesive, whereby the bond is formed. The water molecules are diffused by heat treatment and silanol groups (Si—OH) of remaining components are bonded with each other by a hydrogen bond. Further, in this bonding portion, by hydrogen being released, a Si—O—Si bond (siloxane bond) is formed to, so that the semiconductor wafer 101 and the supporting substrate 107 can be bonded to each other strongly by a covalent bond.

As the supporting substrate 107, a substrate having an insulating surface is used. For example, variety of glass substrates used for electronic industries, such as aluminosilicate glass, aluminoborosilicate glass, or barium borosilicate glass, a quartz substrate, a ceramic substrate, or a sapphire substrate can be given. It is preferable to use a glass substrate for the supporting substrate 107: for example, a large-sized mother glass substrate called the sixth generation (1500 mm×1850 mm), the seventh generation (1870 mm×2200 mm), or the eighth generation (2200 mm×2400 mm) is used. By manufacturing an SOI substrate with a large-area mother glass substrate used as the supporting substrate 107, a large-area SOI substrate can be obtained. As a result, the number of display panels which is manufactured from a single substrate (panels yielded per substrate) can be increased, and accordingly, productivity can be improved.

A variety of glass substrates for the electronics industry such as an aluminosilicate glass substrate, an aluminoborosilicate glass substrate, or a barium borosilicate glass substrate, which have polished surfaces, are preferably used because of high planarity thereof. The polished surface of the glass substrate and the semiconductor wafer or the second insulating layer formed over the semiconductor wafer are bonded to each other, whereby defective bonding can be reduced. The glass substrate may be polished with cerium oxide or the like, for example. By polishing treatment, the semiconductor wafer can be bonded to almost the entire surface including an end region on a main surface of the glass substrate.

In order to favorably perform bonding between the supporting substrate 107 and the second insulating layer 104, a bonding surface may be activated. For example, one or both of the surfaces which are to form a bond are irradiated with an atom beam or an ion beam. When an atom beam or an ion beam is used, a neutral atom beam of an inert gas of argon or the like or an ion beam of an inert gas can be used. It is also possible to activate the bonding surface by plasma irradiation or radical treatment. Such surface treatment facilitates formation of a bond between different kinds of materials even at a temperature of less than or equal to 400° C.

Figure 2A:
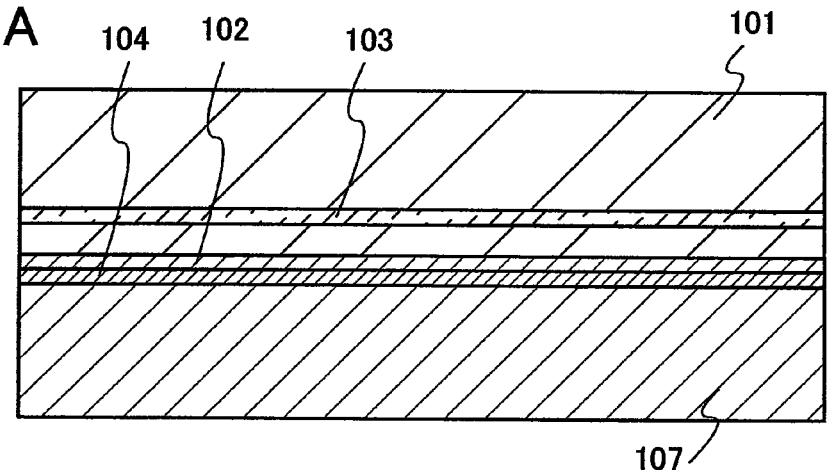
FIGS. 2A to 2C are views illustrating a method for manufacturing an SOI substrate according to the present invention.

After the supporting substrate 107 and the semiconductor wafer 101 are bonded to each other with the second insulating layer 104 interposed therebetween (see FIG. 2A), it is preferable that one or both of heat treatment and pressure treatment be performed. Heat treatment or pressure treatment makes it possible to increase bonding strength between the supporting substrate 107 and the semiconductor wafer 101. The heat treatment is performed at a temperature equal to or lower than the upper temperature limit of the supporting substrate 107. The pressure treatment is performed so that pressure is applied perpendicularly to the bonding surface, in consideration of the pressure resistance of the supporting substrate 107 and the semiconductor wafer 101.

Figure 2B:
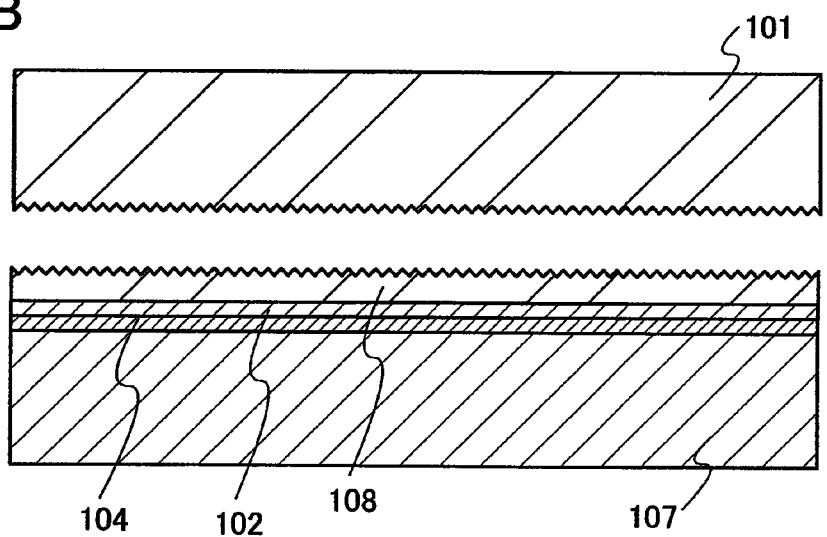

By performing heat treatment, part of the semiconductor wafer 101 is separated at the damaged layer 103 from the supporting substrate 107 (see FIG. 2B). The heat treatment is preferably performed at a temperature equal to or higher than the temperature at which the second insulating layer 104 is formed and equal to or lower than the upper temperature limit of the supporting substrate 107. By performing the heat treatment at, for example, 400° C. to 700° C., a change occurs in the volume of microvoids formed in the damaged layer 103, so that the part of the semiconductor wafer 101 is separated at the damaged layer 103. Since the second insulating layer 104 is bonded to the supporting substrate 107, a semiconductor layer 108 having the same crystallinity as that of the semiconductor wafer 101 remains over the supporting substrate 107. Note that in this specification, "transfer" means that the semiconductor wafer is bonded to the supporting substrate and the part of the semiconductor wafer is separated to form the semiconductor layer over the supporting substrate.

Heat treatment in a temperature range of 400° C. to 700° C. may be continuously performed with the same apparatus as the above heat treatment for improving the bonding strength or with another apparatus. For example, after heat treatment in a furnace at 200° C. for two hours, the temperature is increased to near 600° C. and held for two hours, the temperature is decreased to a temperature ranging from 400° C. to room temperature, and then the semiconductor wafer and the supporting substrate are taken out of the furnace. Alternatively, heat treatment may be performed with a temperature increasing from room temperature. Further alternatively, heat treatment may be performed in a furnace at 200° C. for 2 hours, and then, heat treatment may be performed in a temperature range of 600° C. to 700° C. with a rapid thermal annealing (RTA) device for 1 minute to 30 minutes (e.g., at 600° C. for 7 minutes, or at 650° C. for 7 minutes).

By heat treatment in a temperature range of 400° C. to 700° C., bonding between the insulating layer and the supporting substrate shifts from hydrogen bonding to covalent bonding, and a gas with which the damaged layer is irradiated is taken out and pressure rises, whereby the semiconductor layer can be separated from the semiconductor wafer at the damaged layer. After the heat treatment, the supporting substrate and the semiconductor wafer are in a state where one of the supporting substrate and the semiconductor wafer is provided over the other, and the supporting substrate and part of the semiconductor wafer can be separated from each other without application of large force. For example, a substrate provided over the other is lifted by a vacuum chuck, so that the substrate can be easily separated. At this time, if a substrate on a lower side is fixed with a vacuum chuck or a mechanical chuck, both the supporting substrate and the semiconductor wafer can be separated from each other without horizontal deviation.

Note that in FIGS. 1A to 1D, FIGS. 2A to 2C, FIGS. 3A to 3C, and FIGS. 4A to 4D, the semiconductor wafer 101 has the same size as that of the supporting substrate 107; however, the present invention is not limited thereto. The semiconductor wafer 101 and the supporting substrate 107 may have a smaller size or the semiconductor wafer 101 may have a larger size than the supporting substrate 107.

The damaged layer partially remaining on the surface of the semiconductor layer 108 which is transferred to the supporting substrate by separating the semiconductor wafer at the damaged layer is removed by wet etching. There exist defects generated in the ion irradiation step for forming the damaged layer 103 and in the separation step on the surface of the semiconductor layer 108 illustrated in FIG. 2B, and planarity of the surface of the semiconductor layer is impaired. It is difficult to form a thin gate insulating layer having high withstand voltage on such a surface which is uneven of the semiconductor layer 108. Therefore, planarization treatment is performed on the semiconductor layer 108. When there exists defects in the semiconductor layer 108, the local level density at the interface between the gate insulating layer and the semiconductor layer 108 is increased, which causes an adverse affect on performance and reliability of a transistor; therefore, treatment to decrease the defects of the semiconductor layer 108 is performed. Note that in FIG. 2B, the unevenness shape of the surface of the semiconductor layer 108 characteristically illustrates a rough surface and poor planarity, and an actual shape is not limited thereto.

Figure 2C:
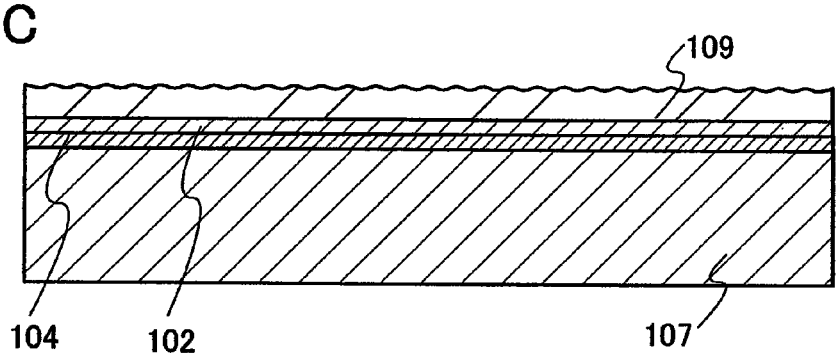

In order to remove the defects existing on the surface of the semiconductor layer 108, the surface of the semiconductor layer 108 is etched by wet etching (see FIG. 2C).

A natural oxide film is formed on the surface of the semiconductor layer 108. When the semiconductor layer 108 over which the natural oxide film is formed is etched by wet etching, variation in thickness of the semiconductor layer 108 is caused. Therefore, the surface of the semiconductor layer 108 is processed with dilute hydrofluoric acid, the natural oxide film is removed and a contaminant such as dust or the like which is attached to the surface is also removed, and the surface of the semiconductor layer 108 is cleaned.

The semiconductor layer 108 from which the natural oxide film is removed is etched by wet etching. By etching the surface of the semiconductor layer by wet etching, the defects formed on the surface of the semiconductor layer can be removed and the surface of the semiconductor layer can be planarized. As an etchant, for example, an aqueous solution of 2.38% of tetramethylammonium hydroxide (TMAH) or the like can be used. By using the TMAH solution at 0.0238 wt % to 0.0476 wt %, the semiconductor layer 108 can be thinned to a thickness of approximately 50 nm to 60 nm. Note that the thickness of the semiconductor layer 108 to be removed by wet etching may be set as appropriate in accordance with the thickness and the surface roughness of the semiconductor layer 108 before wet etching. Without limitation to TMAH, KOH, a mixed solution of ammonium and hydrogen peroxide solution, hydrazine, or the like which is diluted with water at a given concentration, may be used.

The surface of the semiconductor layer transferred to the supporting substrate by separating the semiconductor wafer is etched by wet etching, whereby the defects generated in the ion irradiation step and the separation step can be removed and the surface roughness of the semiconductor layer can be reduced.

Further, the semiconductor layer 108 can be thinned to a thickness which is most suitable for a semiconductor element to be formed later by the wet etching.

Figure 3A:
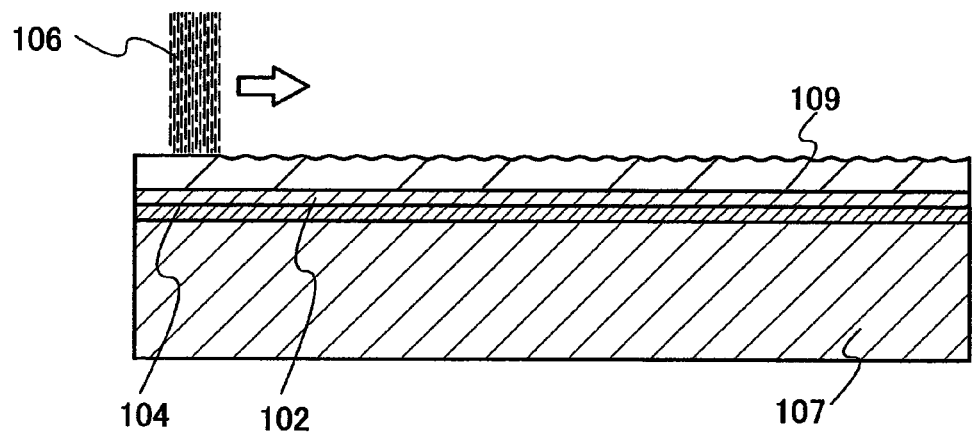
FIGS. 3A to 3C are views illustrating a method for manufacturing an SOI substrate according to the present invention.

Note that crystal defects are formed due to formation of the damaged layer 103 and separation at the damaged layer 103 in a semiconductor layer 109 transferred to the supporting substrate 107. In order to reduce the crystal defects and recover crystallinity in the semiconductor layer 109, as illustrated in FIG. 3A, the semiconductor layer 109 is irradiated with a laser beam 106.

Figure 3B:
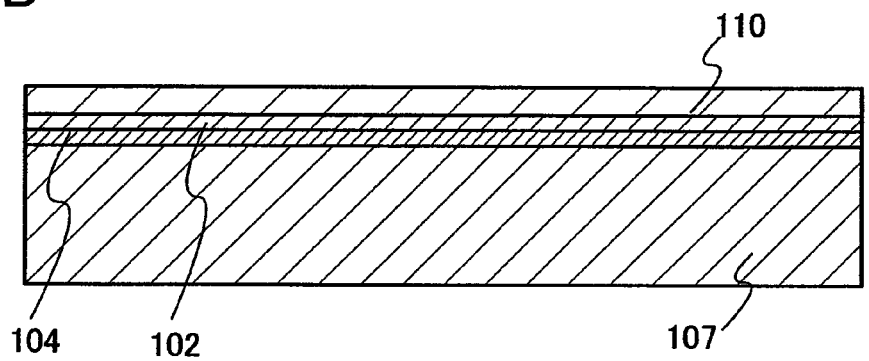

By irradiation with laser beam 106 from the semiconductor layer 109 side, the semiconductor layer 108 is melted from the upper surface. After melting, the semiconductor layer 109 is cooled and solidified, thereby forming a semiconductor layer 110 in which planarity of a surface thereof is improved, as illustrated in FIG. 3B.

Since the laser beam 106 is used in this laser beam irradiation step, the temperature rise of the supporting substrate 107 is suppressed; therefore, a substrate having low heat resistance, such as a glass substrate, can be used for the supporting substrate 107. It is preferable that the semiconductor layer 109 be partially melted by irradiation with the laser beam 106. This is because when the semiconductor layer 109 is completely melted, the recrystallization of the semiconductor layer 109 is accompanied with disordered nucleation of the semiconductor layer 109 in a liquid phase and crystallinity of the semiconductor layer 109 is lowered. By partial melting, so-called longitudinal growth in which crystal growth proceeds from a solid portion which is not melted occurs in the semiconductor layer 109. Due to recrystallization by the longitudinal growth, crystal defects of the semiconductor layer 109 are decreased and crystallinity thereof is recovered. Note that the state where the semiconductor layer 109 is completely melted indicates, in the case of the stack structure of FIG. 3A, that the semiconductor layer 109 is melted to the interface with the second insulating layer 104 and is in a liquid phase. On the other hand, the state where the semiconductor layer 109 is partially melted indicates that the upper layer thereof is melted and is in a liquid phase and the lower layer thereof is in a solid phase.

A laser of the laser beam 106 having oscillation wavelengths in a range of from ultraviolet light to a visible light region is used. The wavelength of the laser beam 106 is a wavelength that is absorbed by the semiconductor layer 109. The wavelength can be determined in consideration of the skin depth of the laser beam, or the like. For example, the wavelength can be in the range of greater than or equal to 250 nm and less than or equal to 700 nm.

The laser can be a continuous wave laser, a pseudo continuous wave laser, or a pulsed laser. A pulsed laser is preferable for partial melting. For example, the following lasers can be used: a pulsed laser which can emit a laser beam having a repetition rate of less than or equal to 1 MHz and a pulse width of greater than or equal to 10 nanosecond and less than or equal to 500 nanosecond and an XeCl excimer laser which can emit a laser beam having a repetition rate of 10 Hz to 300 Hz, a pulse width of 25 nanosecond, and a wavelength of 308 nm.

The energy of the laser beam 106 can be determined in consideration of a wavelength, the skin depth of the laser beam 106, and the like. The energy of the laser beam 106 can be, for example, in the range of greater than or equal to 300 mJ/cm$^2$ and less than or equal to 800 mJ/cm$^2$. For example, when the thickness of the semiconductor layer 109 is approximately 120 nm, a pulsed laser is used as a laser and the wavelength of the laser beam 106 is 308 nm, energy density of the laser beam 106 can be 600 mJ/cm$^2$ to 700 mJ/cm$^2$.

Irradiation with the laser beam 106 is preferably performed in an inert atmosphere such as a nitrogen atmosphere or a rare gas atmosphere or in a vacuum state. In order to perform irradiation with the laser beam 106 in an inert atmosphere, irradiation with the laser beam may be performed in an airtight chamber while the atmosphere in the chamber is controlled. When the chamber is not used, by blowing an inert gas such as a nitrogen gas to the surface irradiated with the laser beam 106, irradiation with the laser beam 106 in the inert atmosphere can be realized.

Since an inert atmosphere such as nitrogen or a vacuum state has higher effect of improving planarity of the semiconductor layer 109 than an air atmosphere, and an inert atmosphere or a vacuum state is more effective in suppressing generation of cracks and ridges than an air atmosphere, the applicable energy range for the laser beam 106 is widened.

It is preferable to make energy distribution of the laser beam 106 uniform and make a shape of the cross section linear by an optical system. Thus, irradiation with the laser beam 106 can be performed uniformly with high throughput. A beam length of the laser beam 106 is made longer than one side of the supporting substrate 107, whereby most of a main surface of the semiconductor layer 109 which is bonded to the supporting substrate 107 can be irradiated with the laser beam by being scanned at a time. The beam length of the laser beam 106 may be a length such that most of the main surface of the semiconductor layer 109 bonded to the supporting substrate 107 can be irradiated with the laser beam 106 by being scanned plural times, when shorter than one side of the supporting substrate 107.

Note that before irradiating the semiconductor layer 109 with the laser beam 106, treatment for removing an oxide film such as a natural oxide film which is formed on the surface of the semiconductor layer 109 is performed. The reason why the oxide film is removed is that an effect of planarization cannot be sufficiently obtained when irradiation with the laser beam 106 is performed in a state where the oxide film remains on the surface of the semiconductor layer 109. The oxide film can be removed by treatment of the semiconductor layer 109 with hydrofluoric acid. The treatment with hydrofluoric acid is preferably performed until the surface of the semiconductor layer 109 exhibits a water-repellent property. It can be confirmed, from the semiconductor layer 109 exhibiting a water-repellent property, that the oxide film is removed from the semiconductor layer 109.

A step of irradiating the semiconductor layer 109 with the laser beam 106 illustrated in FIG. 3A can be performed as follows: first, the semiconductor layer 109 is processed with hydrofluoric acid which is diluted to 1/100 for 110 seconds to remove the oxide film on the surface of the semiconductor layer 109; as the laser of the laser beam 106, an XeCl excimer laser (with a wavelength of 308 nm, a pulse width of 25 nanoseconds, and repetition rate of 60 Hz) is used; the cross section of the laser beam 106 is shaped into a linear form of 300 mm×0.34 mm by an optical system; the scanning speed of the laser beam 106 is 2.0 mm/sec; scanning pitch is 33 μm; and the number of beam shots is approximately 10. Scanning with the laser beam 106 is performed with a nitrogen gas blown to the surface to be irradiated. When the supporting substrate 107 is 730 mm×920 mm, since the beam length of the laser beam 106 is 300 mm, a region which is irradiated with the laser beam 106 is divided into 3 groups, whereby most of the main surface of the semiconductor layer 109 transferred to the supporting substrate 107 can be irradiated with laser beam 106.

Thus, by irradiating the semiconductor layer 109 with the laser beam, the defects due to the ion irradiation can be reduced, so that crystallinity of the semiconductor layer can be recovered. Further, planarity of the surface of the semiconductor layer 109 can be improved.

Furthermore, by irradiation with the laser beam, the surface of the supporting substrate can be heated and cooled in a short time; therefore, temperature rise of the supporting substrate can be suppressed and a substrate having low heat resistance such as a glass substrate can be used for the supporting substrate. Accordingly, damage by the ion irradiation step to the semiconductor layer can be sufficiently recovered.

The semiconductor layer transferred to the supporting substrate by separating the semiconductor wafer is etched by wet etching, whereby crystal defects of the surface of the semiconductor layer and surface roughness thereof can be reduced. Further, since the defects of the surface of the semiconductor layer are removed by wet etching, the defects can be prevented from being taken in the semiconductor layer when the semiconductor layer is melted by irradiation with the laser beam.

Next, by irradiation with the laser beam 106, an SOI substrate having a semiconductor layer 110 illustrated in FIG. 3B is manufactured and a treatment for thinning the semiconductor layer 110 to a thickness which is most suitable for a semiconductor element to be formed later is performed (see FIG. 3C).

In order to thin the semiconductor layer 110, one of dry etching and wet etching or a combination of the both etchings may be performed. For example, when the semiconductor wafer 101 is a silicon substrate, the semiconductor layer 110 can be thinned by dry etching using $SF_6$ and $O_2$ as a process gas (see FIG. 3C).

By etching after the laser beam irradiation, an SOI substrate having a semiconductor layer with a thickness which is most suitable for a semiconductor element can be manufactured. By this etching, the semiconductor layer is preferably thinned to a thickness of greater than or equal to 5 nm and less than or equal to 100 nm, more preferably greater than or equal to 5 nm and less than or equal to 50 nm. For example, when the thickness of the semiconductor layer transferred to the supporting substrate by separating the semiconductor wafer is 110 nm, wet etching is performed to thin the semiconductor layer by 15 nm and etching is performed after the laser beam irradiation, whereby a thickness of a semiconductor layer 111 can be 60 nm. Note that etching is not necessarily performed on the surface of the semiconductor layer 110 after irradiation with the laser beam 106. For example, when the thickness of the semiconductor layer transferred to the supporting substrate is 110 nm, wet etching can also be performed to thin the semiconductor layer to a thickness of 60 nm.

After irradiation with the laser beam 106, heat treatment is preferably performed on the semiconductor layer 111 at greater than or equal to 500° C. and less than or equal to 700° C. By this heat treatment, the defects of the semiconductor layer 111, which are not recovered by irradiation with the laser beam 106, can be eliminated and distortion of the semiconductor layer 111 can be relieved. An rapid thermal anneal (RTA) apparatus, a resistance heating furnace, or a microwave heating apparatus can be used for this heat treatment. As an RTA apparatus, a gas rapid thermal anneal (GRTA) apparatus or a lamp rapid thermal anneal (LRTA) apparatus can be used. For example, when a resistance heating furnace is used, heat treatment may be performed at 550° C. for four hours.

Figure 3C:
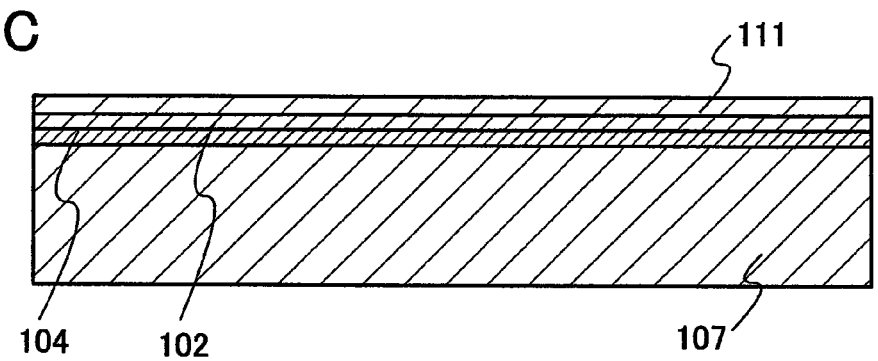

Through the above-described steps, an SOI substrate illustrated in FIG. 3C can be manufactured.

As described above, in this embodiment mode, wet etching and laser beam irradiation are performed on the semiconductor layer transferred to the supporting substrate by separating the semiconductor wafer, so that an SOI substrate having the semiconductor layer with reduced crystal defects and high planarity can be manufactured. Further, even when a substrate having a low heat-resistant temperature such as a glass substrate or the like is used, an SOI substrate provided with a semiconductor layer which can be used practically can be manufactured.

By forming a semiconductor element such as a transistor by using the semiconductor layer according to this embodiment mode, a gate insulating layer can be made thin and the localized interface state density with the gate insulating layer can be reduced. In addition, by making the thickness of the semiconductor layer small, a transistor of complete depletion type with a small subthreshold value can be manufactured using a single crystal semiconductor layer over the supporting substrate.

Figure 4A:
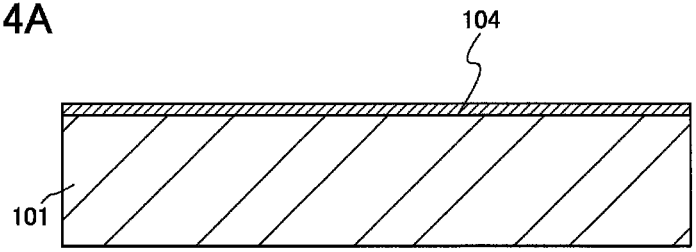
FIGS. 4A to 4D are views illustrating a method for manufacturing an SOI substrate according to the present invention.

Note that in FIGS. 1A to 1D, FIGS. 2A to 2C and FIGS. 3A to 3C, a process of forming the single crystal semiconductor layer by forming the insulating layers over the semiconductor wafer 101 is illustrated; however, in FIGS. 4A to 4D, a process of forming the single crystal semiconductor layer by forming the insulating layer over the supporting substrate as well will be illustrated. FIG. 4A illustrates the semiconductor wafer 101 which is similar to that illustrated in FIG. 1A. Next, the second insulating layer 104 is formed over the semiconductor wafer 101. Note that a step of forming the second insulating layer 104 is performed similarly to the case of FIG. 1C.

Figure 4B:
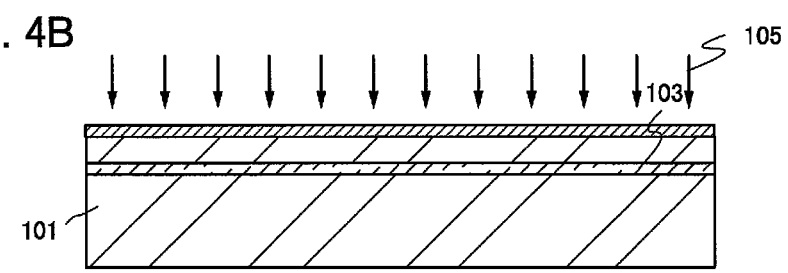

FIG. 4B illustrates a step of irradiating the semiconductor wafer 101 with ions accelerated by an electric field at a predetermined depth to form the damaged layer 103. Irradiation with ions is performed similarly to the case of FIG. 1B.

Figure 4C:
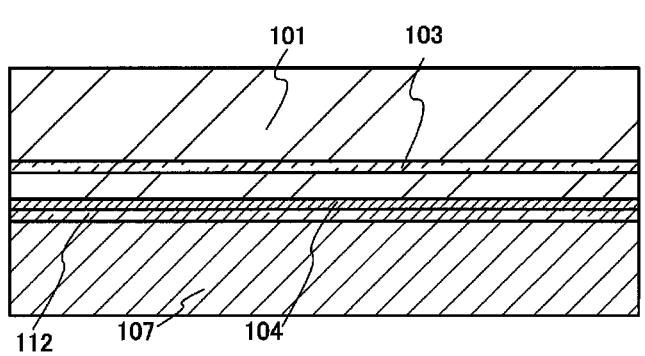

FIG. 4C illustrates a step of forming a bond by placing the surface of the semiconductor wafer 101 over which the second insulating layer 104 is formed in close contact with the supporting substrate 107 over which a third insulating layer 112 serving as a barrier layer is formed. The third insulating layer 112 formed over the supporting substrate 107 and the second insulating layer 104 formed on the semiconductor wafer 101 are placed in close contact with each other, whereby the bond is formed. When the supporting substrate 107 is a substrate including an impurity such as an alkali metal or an alkaline earth metal by which reliability of the semiconductor device is reduced, the third insulating layer 112 can prevent such an impurity from diffusing from the supporting substrate 107 into the semiconductor layer 108.

The third insulating layer 112 can be formed as a single layer structure or a stacked-layer structure of a silicon nitride layer, a silicon nitride oxide layer, a silicon oxynitride layer, and the like by a plasma CVD method. The third insulating layer 112 is preferably formed to have a thickness ranging from 50 nm to 200 nm. For example, a silicon oxynitride layer and a silicon nitride oxide layer are stacked from the supporting substrate 107 side, whereby the third insulating layer 112 can be formed.

Figure 4D:
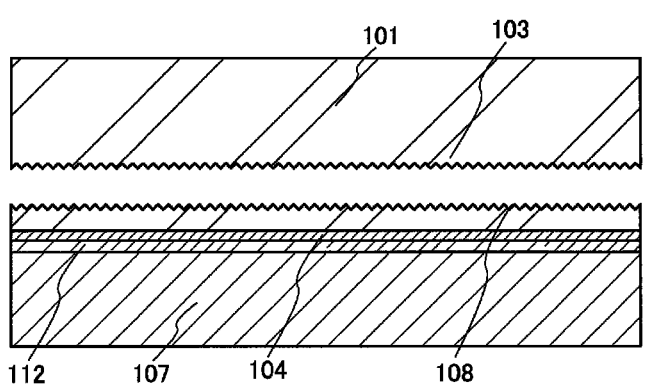

After that, the semiconductor wafer 101 is separated as illustrated in FIG. 4D. Heat treatment for separating the semiconductor layer is performed similarly to the case illustrated in FIG. 2B. The temperature of heat treatment in a bonding and separating step is set at equal to or lower than that of the heat treatment which has been performed on the supporting substrate 107 in advance. In this manner, the SOI substrate illustrated in FIG. 4D can be obtained.

The following steps can be performed similarly to the case of FIG. 2C and FIGS. 3A to 3C.

Figure 5:
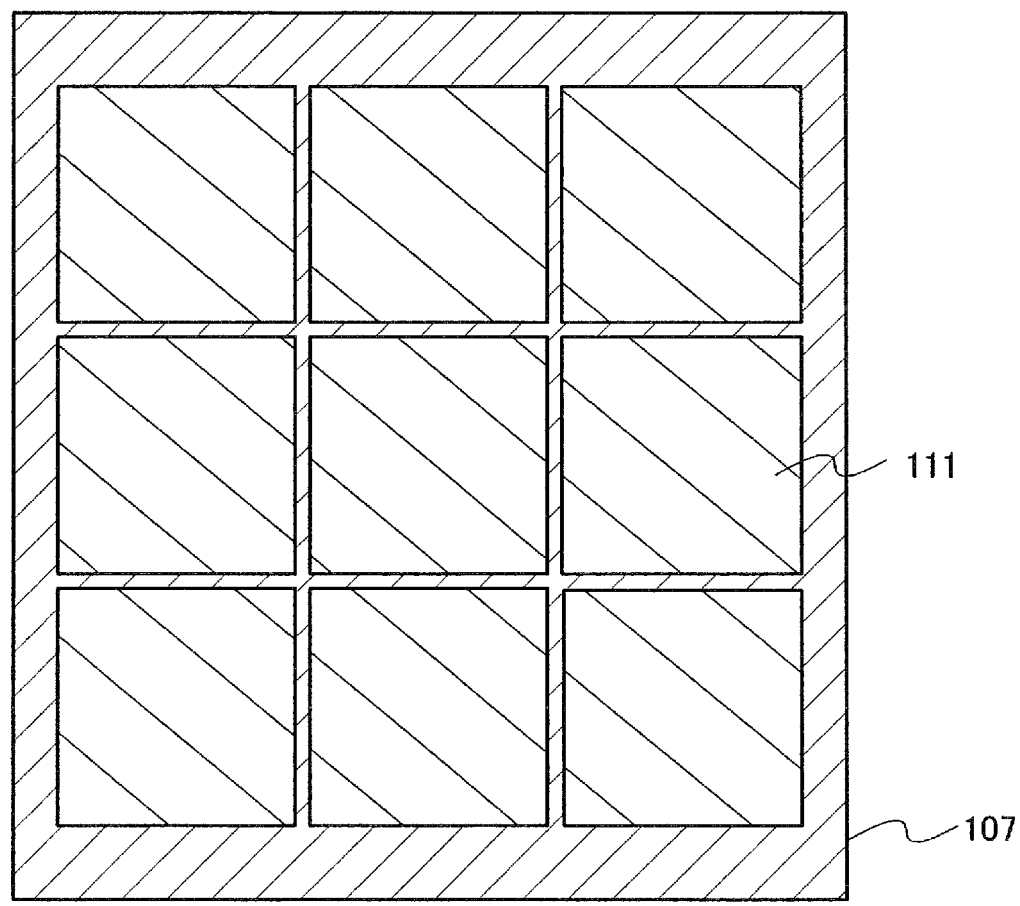
FIG. 5 is a view illustrating a method for manufacturing an SOI substrate according to the present invention.

Note that in order to achieve increase in size of the SOI substrate, a structure may be employed in which a plurality of the semiconductor layers 111 are bonded to one supporting substrate 107. For example, through the steps described with reference to FIGS. 1A to 1C, a plurality of the semiconductor wafers 101 in each of which the damaged layer 103 is formed are prepared. Next, through the bonding step in FIG. 1D and FIG. 2A, the plurality of semiconductor wafers 101 are temporarily bonded to one supporting substrate 107. Then, heat treatment in FIG. 2B is performed to separate each of the semiconductor wafers 101, whereby the plurality of semiconductor layers 111 are fixed to the supporting substrate 107. After that, through the steps illustrated in FIG. 2C and FIGS. 3A to 3C, the SOI substrate to which the plurality of semiconductor layers 111 are bonded can be manufactured (see FIG. 5).

In this embodiment mode, when a single crystal silicon substrate is used as the semiconductor wafer 101, a single crystal silicon can be obtained as the semiconductor layer 111.

In a method for manufacturing an SOI substrate according to this embodiment mode, a process temperature can be less than or equal to 700° C.; therefore, a glass substrate can be used as the supporting substrate 107. That is, a semiconductor layer can be formed over a glass substrate similarly to a conventional thin film transistor and a single crystal silicon layer can be used for the semiconductor layer. These make it possible to manufacture a transistor with high performance and high reliability in which high speed operation is possible and which can be driven with a low subthreshold value, high field effect mobility, and low consumption voltage can be formed over a supporting substrate such as a glass substrate or the like. Therefore, a semiconductor device which has high performance and high reliability can be manufactured with high yield.

Since CMP treatment which is unsuitable for increase in area is not necessary, increase in area of a semiconductor device having high performance can be realized. Of course, without limitation to the case of using a large-area substrate, even when a small substrate is used, a favorable semiconductor device can be provided.

Embodiment Mode 2

In this embodiment mode, a method of manufacturing a CMOS (complementary metal oxide semiconductor) will be described as an example of a method of manufacturing a semiconductor device including a semiconductor element having high performance and high reliability with high yield with reference to FIGS. 6A to 6E and FIGS. 7A to 7D. Note that repetitive descriptions for the same components as or components having similar functions to the components in Embodiment Mode 1 are omitted.

Figure 6A:
FIGS. 6A to 6E are views illustrating a method for manufacturing a semiconductor device according to the present invention.

In FIG. 6A, a third insulating layer 112 serving as a barrier layer, a second insulating layer 104, a first insulating layer 102 serving as a barrier layer, and a semiconductor layer 111 are formed over the supporting substrate 107. Note that here, although an example is described in which an SOI substrate having a structure illustrated in FIG. 6A is used, an SOI substrate having another structure described in this specification can also be used.

Since the semiconductor layer 111 is separated from a semiconductor wafer 101 and subjected to heat treatment by supplying high energy with the use of at least one kind of particles having the high energy and a first etching, the semiconductor layer 111 with reduced crystal defects and high planarity is obtained.

In the semiconductor layer 111, a p-type impurity such as boron, aluminum, gallium, or the like or an n-type impurity such as phosphorus, arsenic, or the like is preferably added to correspond to a formation region of an n-channel field-effect transistor or a p-channel field-effect transistor. In other words, a p-type impurity is added to a formation region of an n-channel field-effect transistor or an n-type impurity is added to a formation region of a p-channel field-effect transistor, whereby so-called well regions are formed. The dose of impurity ions may range from about $1\times10^{12}$ ions/cm$^2$ to $1\times10^{14}$ ions/cm$^2$. Furthermore, in the case of controlling the threshold voltage of the field-effect transistor, a p-type or n-type impurity may be added to the well regions.

Figure 6B:
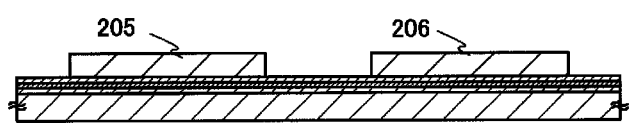

The semiconductor layer 111 is etched into island shapes in accordance with the position of the semiconductor element to form separated semiconductor layers 205 and 206 (see FIG. 6B).

An oxide film over the semiconductor layer is removed, and a gate insulating layer 207 that covers the semiconductor layers 205 and 206 is formed. Since the semiconductor layers 205 and 206 in this embodiment mode have high planarity, even if a gate insulating layer formed over the semiconductor layers 205 and 206 is a thin gate insulating layer, the gate insulating layer can cover the semiconductor layers 205 and 206 with favorable coverage. Therefore, a property defect due to a coverage defect of the gate insulating layer can be prevented, and a semiconductor device having high reliability can be manufactured with high yield. The thinned gate insulating layer 207 is effective in operating a thin film transistor with low voltage at high speed.

The gate insulating layer 207 may be formed of silicon oxide or a stacked structure of silicon oxide and silicon nitride. The gate insulating layer 207 may be formed by depositing an insulating film by a plasma CVD method or a low pressure CVD method or is preferably formed by solid phase oxidation or solid phase nitridation by plasma treatment. This is because a gate insulating layer which is formed using a semiconductor layer that is oxidized or nitrided by plasma treatment is dense and has high withstand voltage and is excellent in reliability.

As the gate insulating layer 207, a high dielectric constant material such as zirconium dioxide, hafnium oxide, titanium dioxide, tantalum pentoxide, or the like may be used. By using a high dielectric constant material for the gate insulating layer 207, gate leakage current can be reduced.

Figure 6C:
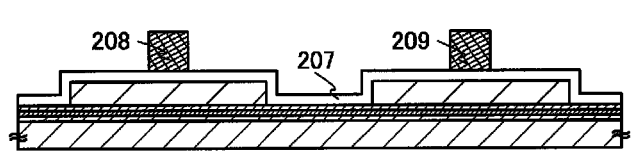
Figure 6D:
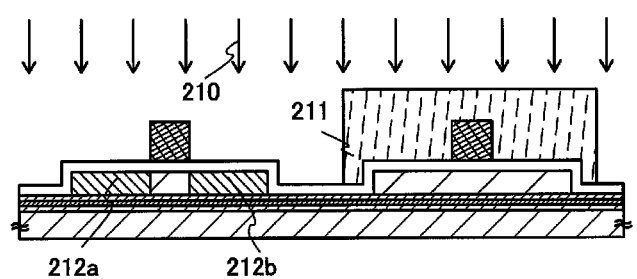
Figure 6E:
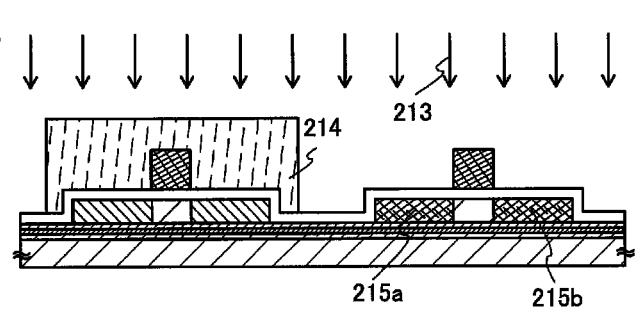

A gate electrode layer 208 and a gate electrode layer 209 are formed over the gate insulating layer 207 (see FIG. 6C). The gate electrode layers 208 and 209 can be formed by a sputtering method, an evaporation method, a CVD method, or the like. The gate electrode layers 208 and 209 may be formed of an element selected from tantalum (Ta), tungsten (W), titanium (Ti), molybdenum (Mo), aluminum (Al), copper (Cu), chromium (Cr), or neodymium (Nd); or an alloy material or a compound material that contains any of these elements as its main component. In addition, as the gate electrode layers 208 and 209, a semiconductor film typified by a polycrystalline silicon film doped with an impurity element such as phosphorus or the like, or an AgPdCu alloy may be used.

A mask 211 that covers the semiconductor layer 206 is formed. With the use of the mask 211 and the gate electrode layer 208 as masks, an impurity element 210 that imparts n-type conductivity is added to form first n-type impurity regions 212a and 212b (see FIG. 6D). In this embodiment mode, phosphine ($PH_3$) is used as a doping gas that contains an impurity element. Here, doping is performed so that the first n-type impurity regions 212a and 212b contain an impurity element that imparts n-type conductivity at a concentration of about $1\times10^{17}/cm^3$ to $5\times10^{18}/cm^3$. In this embodiment mode, phosphorus (P) is used as an impurity element that imparts n-type conductivity.

Next, a mask 214 that covers the semiconductor layer 205 is formed. With the use of the mask 214 and the gate electrode layer 209 as masks, an impurity element 213 that imparts p-type conductivity is added to form first p-type impurity regions 215a and 215b (see FIG. 6E). In this embodiment mode, diborane ($B_2H_6$) or the like is used as a doping gas that contains an impurity element because boron (B) is used as an impurity element.

Figure 7A:
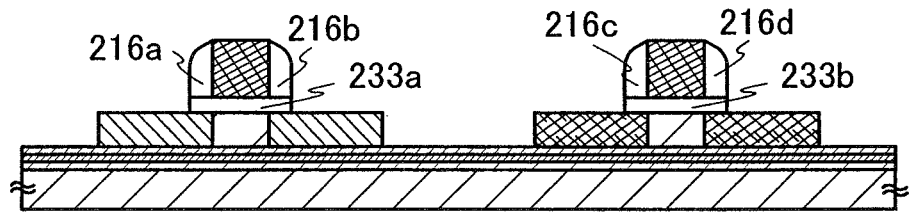
FIGS. 7A to 7D are views illustrating a method for manufacturing a semiconductor device according to the present invention.
Figure 7B:
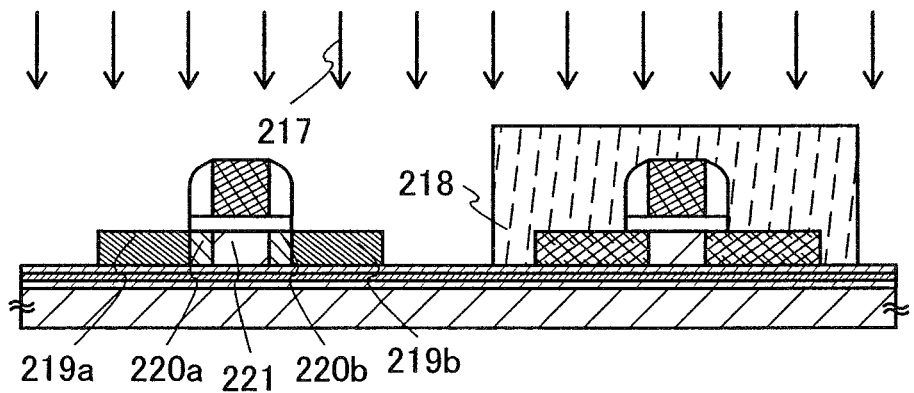
Figure 7C:
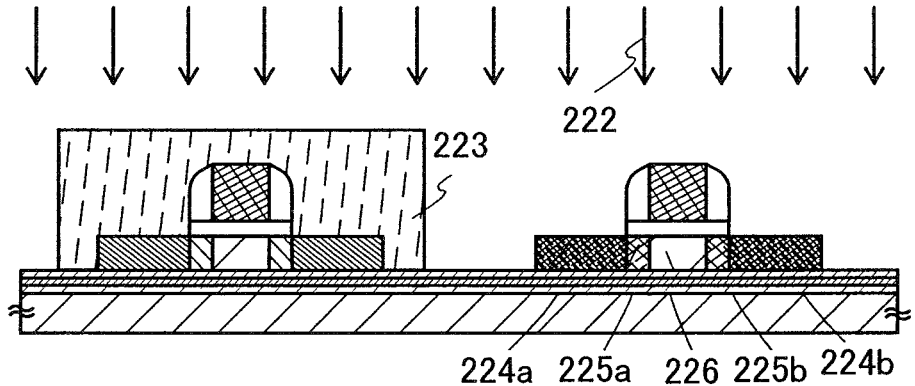

The mask 214 is removed, sidewall insulating layers 216a to 216d with a sidewall structure are formed on side surfaces of the gate electrode layers 208 and 209, and gate insulating layers 233a and 233b are formed (see FIG. 7A). The sidewall insulating layers 216a to 216d with a sidewall structure may be formed on the side surfaces of the gate electrode layers 208 and 209 in a self-aligning manner, in the following manner: an insulating layer covering the gate electrode layers 208 and 209 is formed and is processed by anisotropic etching using an RIE (reactive ion etching) method. Here, there is no particular limitation on the insulating layers and the insulating layers are preferably layers of silicon oxide with favorable step coverage, which are formed by reacting TEOS (tetraethyl orthosilicate), silane, or the like with oxygen, nitrous oxide, or the like. The insulating layers can be formed by a thermal CVD method, a plasma CVD method, a normal-pressure CVD method, a bias ECRCVD method, a sputtering method, or the like. The gate insulating layers 233a and 233b can be formed by etching the gate insulating layer 207 with the use of the gate electrode layers 208 and 209 and the sidewall insulating layers 216a to 216d as masks.

In this embodiment mode, in etching the insulating layer, the insulating layer over the gate electrode layers are removed to expose the gate electrode layers. However, the sidewall insulating layers 216a to 216d may be formed to have a shape in which the insulating layer over the gate electrode layers remains. In addition, a protective film may be formed over the gate electrode layers in a later step. By protecting the gate electrode layers in this manner, film reduction of the gate electrode layers can be prevented in an etching processing. In the case of forming silicide in a source region and a drain region, since a metal film formed for formation of the silicide is not in contact with the gate electrode layers, even when a material of the metal film can easily react with a material of the gate electrode layer, defects such as chemical reaction, diffusion, and the like can be prevented. Various etching methods such as a dry etching method or a wet etching method may be used for etching. In this embodiment mode, a dry etching method is used. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate.

Next, a mask 218 which covers the semiconductor layer 206 is formed. The mask 218, the gate electrode layer 208, and the sidewall insulating layers 216a and 216b are used as masks, and an impurity element 217 that imparts n-type conductivity is added to form second n-type impurity regions 219a and 219b and third n-type impurity regions 220a and 220b. In this embodiment mode, $PH_3$ is used as a doping gas that contains an impurity element. Here, the doping is performed so that the second n-type impurity regions 219a and 219b contain an impurity element that imparts n-type conductivity at a concentration of about $5\times10^{19}/cm^3$ to $5\times10^{20}/cm^3$. In addition, a channel formation region 221 is formed in the semiconductor layer 205 (see FIG. 7B).

The second n-type impurity regions 219a and 219b are high-concentration n-type impurity regions and function as a source and a drain. On the other hand, the third n-type impurity regions 220a and 220b are low-concentration impurity regions and function as LDD (lightly doped drain) regions. Since the third n-type impurity regions 220a and 220b are formed in Loff regions, which are not covered with the gate electrode layer 208, off current can be reduced. Accordingly, a semiconductor device with higher reliability and lower power consumption can be manufactured.

The mask 218 is removed, and a mask 223 that covers the semiconductor layer 205 is formed. With the use of the mask 223, the gate electrode layer 209, and the sidewall insulating layers 216c and 216d as masks, an impurity element 222 that imparts p-type conductivity is added to form second p-type impurity regions 224a and 224b, and third p-type impurity regions 225a and 225b.

Doping is performed so that the second p-type impurity regions 224a and 224b contain an impurity element that imparts p-type conductivity at a concentration of about $1\times10^{20}/cm^3$ to $5\times10^{21}/cm^3$. In this embodiment mode, the third p-type impurity regions 225a and 225b are formed in a self-aligning manner by the sidewall insulating layers 216c and 216d so as to have a lower concentration than the second p-type impurity regions 224a and 224b. In addition, a channel formation region 226 is formed in the semiconductor layer 206 (see FIG. 7C).

The second p-type impurity regions 224a and 224b are high-concentration p-type impurity regions and function as a source and a drain. On the other hand, the third p-type impurity regions 225a and 225b are low-concentration impurity regions and function as LDD (lightly doped drain) regions. Since the third p-type impurity regions 225a and 225b are formed in Loff regions, which are not covered with the gate electrode layer 209, off current can be reduced. Accordingly, a semiconductor device with higher reliability and lower power consumption can be manufactured.

The mask 223 is removed, and heat treatment, strong light irradiation, or laser beam irradiation may be performed in order to activate the impurity element. At the same time as the activation, plasma damage to the gate insulating layer and plasma damage to an interface between the gate insulating layer and the semiconductor layer can be repaired.

Next, an interlayer insulating layer which covers the gate electrode layers and the gate insulating layers is formed. In this embodiment mode, a stacked structure of an insulating film 227 that contains hydrogen to serve as a protective film and an insulating layer 228 is employed. The insulating film 227 and the insulating layer 228 may be formed by using a silicon nitride film, a silicon nitride oxide film, a silicon oxynitride film, or a silicon oxide film by a sputtering method or a plasma CVD method. Alternatively, a single layer structure or a stacked structure of three or more layers using another insulating film containing silicon may also be employed.

Further, a step in which heat treatment is performed at 300° C. to 550° C. for 1 to 12 hours in a nitrogen atmosphere and the semiconductor layer is hydrogenated is performed. Preferably, the temperature is 400° C. to 500° C. This step is a step for terminating a dangling bond of the semiconductor layer by hydrogen contained in the insulating film 227, which is an interlayer insulating layer. In this embodiment mode, heat treatment is performed at 410° C. for 1 hour.

The insulating film 227 and the insulating layer 228 can also be formed of a material selected from aluminum nitride (AlN), aluminum oxynitride (AlON), aluminum nitride oxide having a higher content of nitrogen than that of oxygen (AlNO), aluminum oxide, diamond-like carbon (DLC), nitrogen-containing carbon (CN), or other substances containing an inorganic insulating material. A siloxane resin may also be used. The siloxane resin is a resin including a Si—O—Si bond. Siloxane is composed of a skeleton formed by the bond of silicon (Si) and oxygen (O), in which an organic group containing at least hydrogen (such as an alkyl group and an aryl group) is used as a substituent. Alternatively, a fluoro group may be included in the organic group. Further, an organic insulating material such as polyimide, acrylic, polyamide, polyimide amide, resist, benzocyclobutene, or polysilazane may also be used. A coating film with a favorable planarity formed by a coating method may also be used.

The insulating film 227 and the insulating layer 228 can be formed by using dipping, spray coating, a doctor knife, a roll coater, a curtain coater, a knife coater, a CVD method, an evaporation method, or the like. The insulating film 227 and the insulating layer 228 may also be formed by a droplet discharge method. A droplet discharge method requires less material solution. In addition, a method capable of transferring or drawing a pattern similarly to a droplet discharge method, for example, a printing method (a method of forming a pattern such as screen printing, offset printing, or the like) can also be used.

Next, contact holes (openings) which reach the semiconductor layers are formed in the insulating film 227 and the insulating layer 228 using a mask made of a resist. Etching may be performed once or plural times depending on selectivity of a material to be used. The insulating film 227 and the insulating layer 228 are partly removed by the etching to form the openings which reach the second n-type impurity regions 219a and 219b and the second p-type impurity regions 224a and 224, which are source regions and drain regions. The etching may be performed by wet etching, dry etching, or both wet etching and dry etching. A hydrofluoric-acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate. Further, an inert gas may be added to an etching gas to be used. As an inert element to be added, one or a plurality of elements selected from He, Ne, Ar, Kr, or Xe can be used.

A conductive film is formed so as to cover the openings, and the conductive film is etched to form wiring layers 229a, 229b, 230a, and 230b which function as source and drain electrode layers which are electrically connected to parts of source regions and drain regions. The wiring layers can be formed by forming a conductive film by a PVD method, a CVD method, an evaporation method, or the like, and then, etching the conductive film into a desired shape. Further, a conductive film can be selectively formed in a predetermined position by a droplet discharge method, a printing method, an electroplating method, or the like. Moreover, a reflow method or a damascene method may also be used. As a material for the wiring layers, metal such as Ag, Au, Cu, Ni, Pt, Pd, Ir, Rh, W, Al, Ta, Mo, Cd, Zn, Fe, Ti, Zr, Ba, or the like; Si or Ge; or an alloy or nitride thereof can be used. A stacked structure of these materials may also be employed.

Figure 7D:
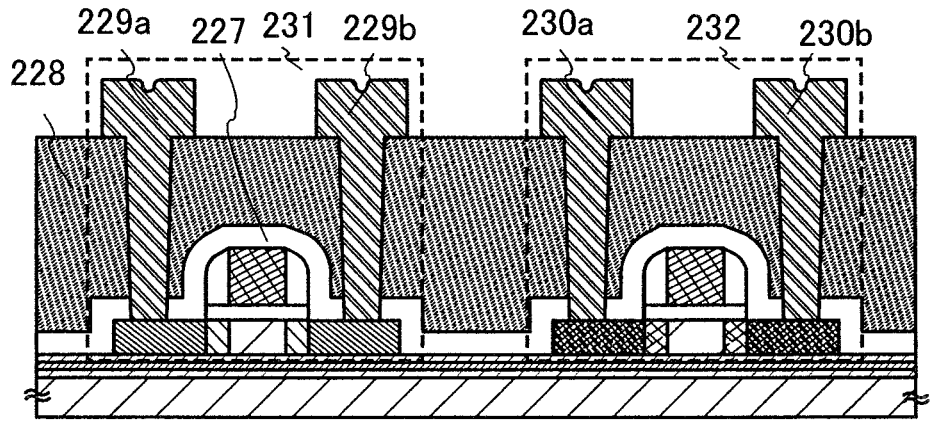

Through the above process, a semiconductor device having a CMOS structure which includes a thin film transistor 231, which is an n-channel thin film transistor, and a thin film transistor 232, which is a p-channel thin film transistor, can be formed (see FIG. 7D). Although not illustrated in the drawings, a CMOS structure is described in this embodiment mode; therefore, the thin film transistor 231 and the thin film transistor 232 are electrically connected to each other.

A structure of the thin film transistor is not limited to this embodiment mode, and a single gate structure in which one channel formation region is formed, a double gate structure in which two channel formation regions are formed, or a triple gate structure in which three channel formation regions are formed may be employed.

In this embodiment mode as described above, a semiconductor device which has high performance and high reliability can be formed with high yield by using an SOI substrate that has a semiconductor layer with reduced crystal defects and high planarity.

In this manner, thin film transistors can be manufactured using an SOI substrate. The semiconductor layer of the SOI substrate has almost no crystal defects and is a single crystal semiconductor layer with reduced interface state density between the semiconductor layer and the gate insulating layer 207. The semiconductor layer has a planarized surface and is thinned to a thickness of less than or equal to 50 nm. Accordingly, thin film transistors with excellent characteristics such as low driving voltage, high electron field-effect mobility, and a low subthreshold value can be manufactured over the supporting substrate 107. Further, plural transistors with high performance and no characteristic variation between the transistors can be formed over the same substrate. In other words, by using the SOI substrate according to the present invention, nonuniformity of the important characteristic value as transistor characteristics such as threshold voltage or mobility can be reduced and high performance such as high field-effect mobility can be obtained.

A semiconductor device with high added value can be manufactured by forming various semiconductor elements such as TFTs using the SOI substrates according to the present invention.

Embodiment Mode 3

In this embodiment mode, an example of a semiconductor device having high performance and high reliability will be described. Specifically, as examples of the semiconductor device, examples of a microprocessor and a semiconductor device which has an arithmetic function and can transmit and receive data without contact will be described.

Figure 8:
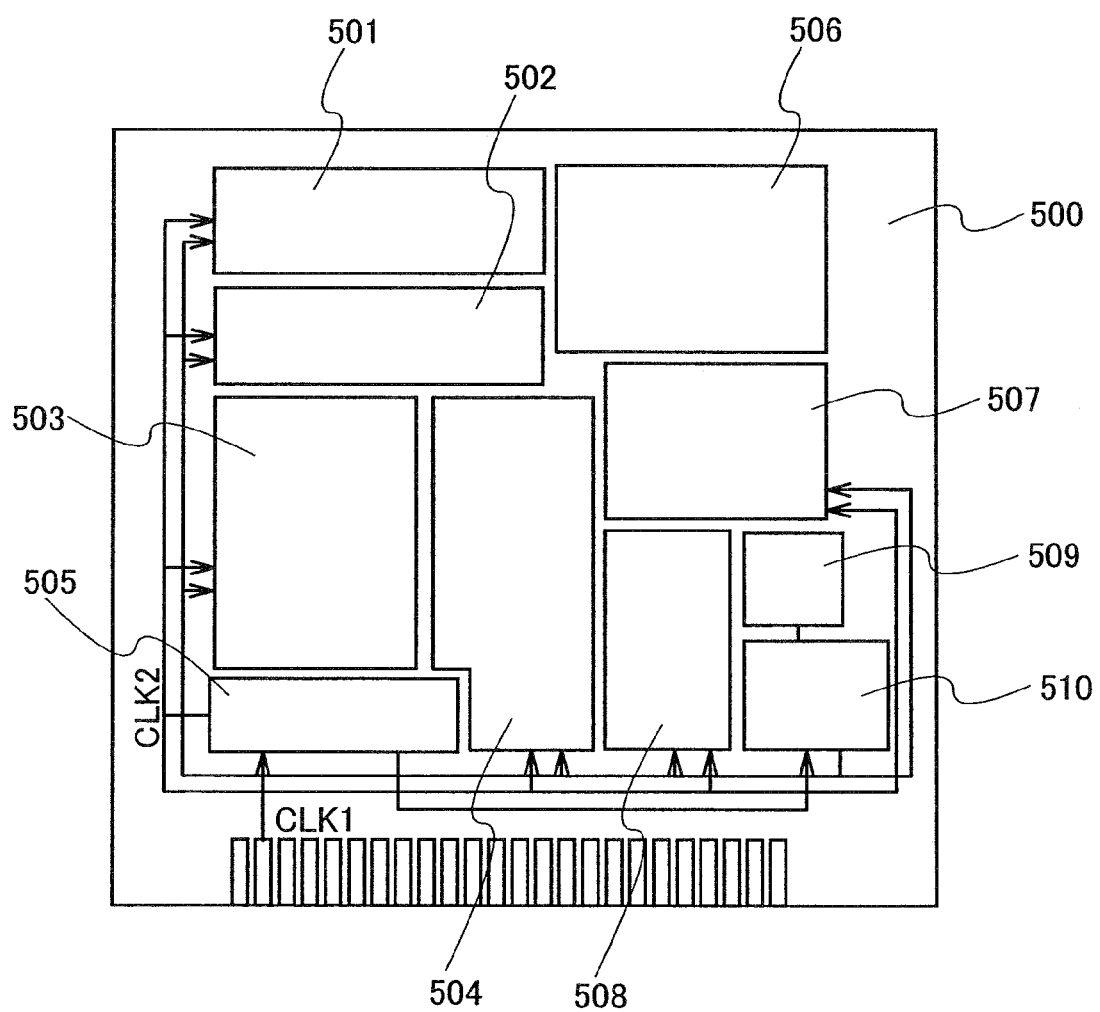
FIG. 8 is a block diagram illustrating a structure of a microprocessor manufactured using an SOI substrate.

First, as an example of the semiconductor device, a microprocessor will be described. FIG. 8 is a block diagram illustrating a structural example of a microprocessor 500.

The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory 509, and a ROM interface (ROM I/F) 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction.

Specifically, the ALU controller 502 generates signals for controlling operation of the ALU 501. While the microprocessor 500 is executing a program, the interrupt controller 504 processes an interrupt request from an external input/output device or a peripheral circuit based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507.

For example, the timing controller 505 is provided with an internal clock generator for generating an internal clock signal CLK2 based on a reference clock signal CLK1, and supplies the clock signal CLK2 to the various above-mentioned circuits. Note that the microprocessor 500 illustrated in FIG. 8 is only an example in which the configuration is simplified, and an actual microprocessor may have various configurations depending on the uses.

The microprocessor 500 can achieve not only an increase in processing speed but also a reduction in power consumption because an integrated circuit is formed using a single crystal semiconductor layer (an SOI layer) with uniform crystal orientation which is bonded over a substrate having an insulating surface or an insulating substrate.

Figure 9:
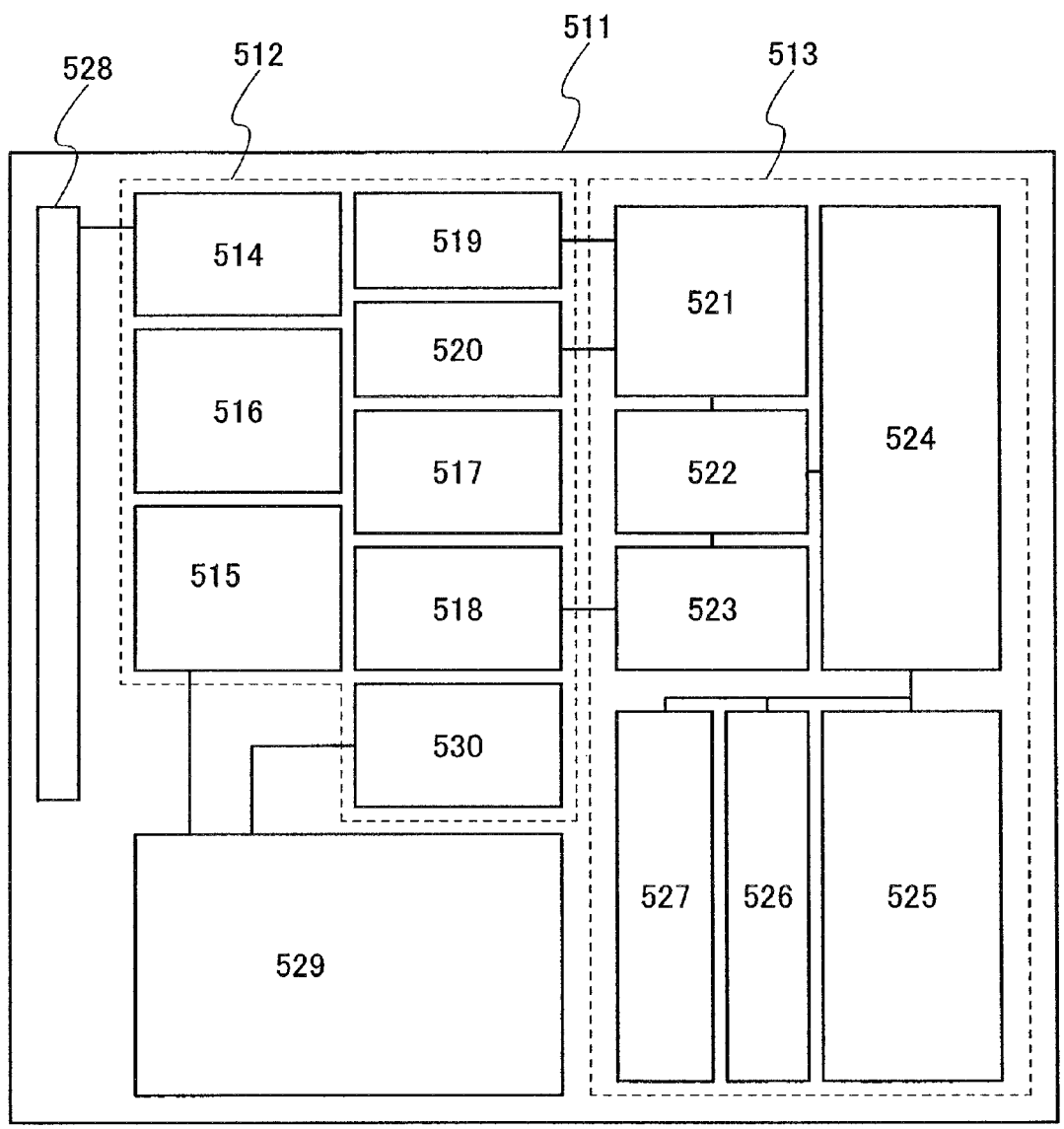
FIG. 9 is a block diagram a structure of an RFCPU manufactured using an SOI substrate.

Next, an example of a semiconductor device having a function of transmitting and receiving data without contact and also having an arithmetic function is described. FIG. 9 is a block diagram illustrating a structural example of a semiconductor device. The semiconductor device illustrating in FIG. 9 can be regarded as a computer (hereinafter also referred to as an "RFCPU") which operates to transmit and receive signals to and from an external device by wireless communication.

As illustrated in FIG. 9, an RFCPU 511 includes an analog circuit portion 512 and a digital circuit portion 513. The RFCPU 511 includes, as the analog circuit portion 512, a resonance circuit 514 with a resonance capacitor, a rectifier circuit 515, a constant voltage circuit 516, a reset circuit 517, an oscillator circuit 518, a demodulator circuit 519, and a modulator circuit 520. The digital circuit portion 513 includes an RF interface 521, a control register 522, a clock controller 523, a CPU interface 524, a central processing unit 525, a random access memory 526, and a read only memory 527.

The operation of the RFCPU 511 is as follows. The resonance circuit 514 generates an induced electromotive force based on a signal received by an antenna 528. The induced electromotive force is stored in a capacitor portion 529 through the rectifier circuit 515. This capacitor portion 529 is preferably formed using a capacitor such as a ceramic capacitor or an electric double layer capacitor. The capacitor portion 529 is not necessarily formed over the same substrate as the RFCPU 511 and can be attached as another component to a substrate having an insulating surface which partially constitutes the RFCPU 511.

The reset circuit 517 generates a signal for resetting and initializing the digital circuit portion 513. For example, the reset circuit 517 generates, as a reset signal, a signal that rises with delay after increase in the power supply voltage. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data that is to be transmitted.

For example, the demodulator circuit 519 is formed using a low-pass filter and binarizes a received signal of an amplitude shift keying (ASK) system based on the fluctuation of the received signal. The modulation circuit 520 transmits transmission data by changing the amplitude of a transmission signal of an amplitude shift keying (ASK) system. The modulation circuit 520 changes the resonance point of the resonance circuit 514, thereby changing the amplitude of a communication signal.

The clock controller 523 generates a control signal for changing the frequency and duty ratio of a clock signal in accordance with the power supply voltage or a consumption current of the central processing unit 525. The power supply voltage is managed by the power management circuit 530.

A signal input from the antenna 528 to the RFCPU 511 is demodulated by the demodulator circuit 519 and then decomposed into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the CPU interface 524. The CPU interface 524 has a function of generating an access signal for any of the read only memory 527, the random access memory 526, and the control register 522 based on an address which is requested by the central processing unit 525.

As an arithmetic method of the central processing unit 525, a method may be employed in which the read only memory 527 stores an operating system (OS) and a program is read and executed at the time of starting operation. Alternatively, a method may be employed in which a circuit dedicated to arithmetic is formed as an arithmetic circuit and arithmetic processing is conducted using hardware. In a method in which both hardware and software are used, part of processing can be conducted by a circuit dedicated to arithmetic, and the other part of the arithmetic processing can be conducted by the central processing unit 525 using a program.

The RFCPU 511 described above can achieve not only an increase in processing speed but also a reduction in power consumption because an integrated circuit is formed using a semiconductor layer with uniform crystal orientation which is bonded over a substrate having an insulating surface or an insulating substrate. Accordingly, even when the capacitor portion 529 which supplies electric power is miniaturized, long-term operation is ensured.

Embodiment Mode 4

In this embodiment mode, a display device as an example of a semiconductor device having high performance and high reliability will be described with reference to FIG. 10, FIGS. 11A and 11B, FIGS. 12A and 12B, and FIGS. 13A to 13C.

Figure 10:
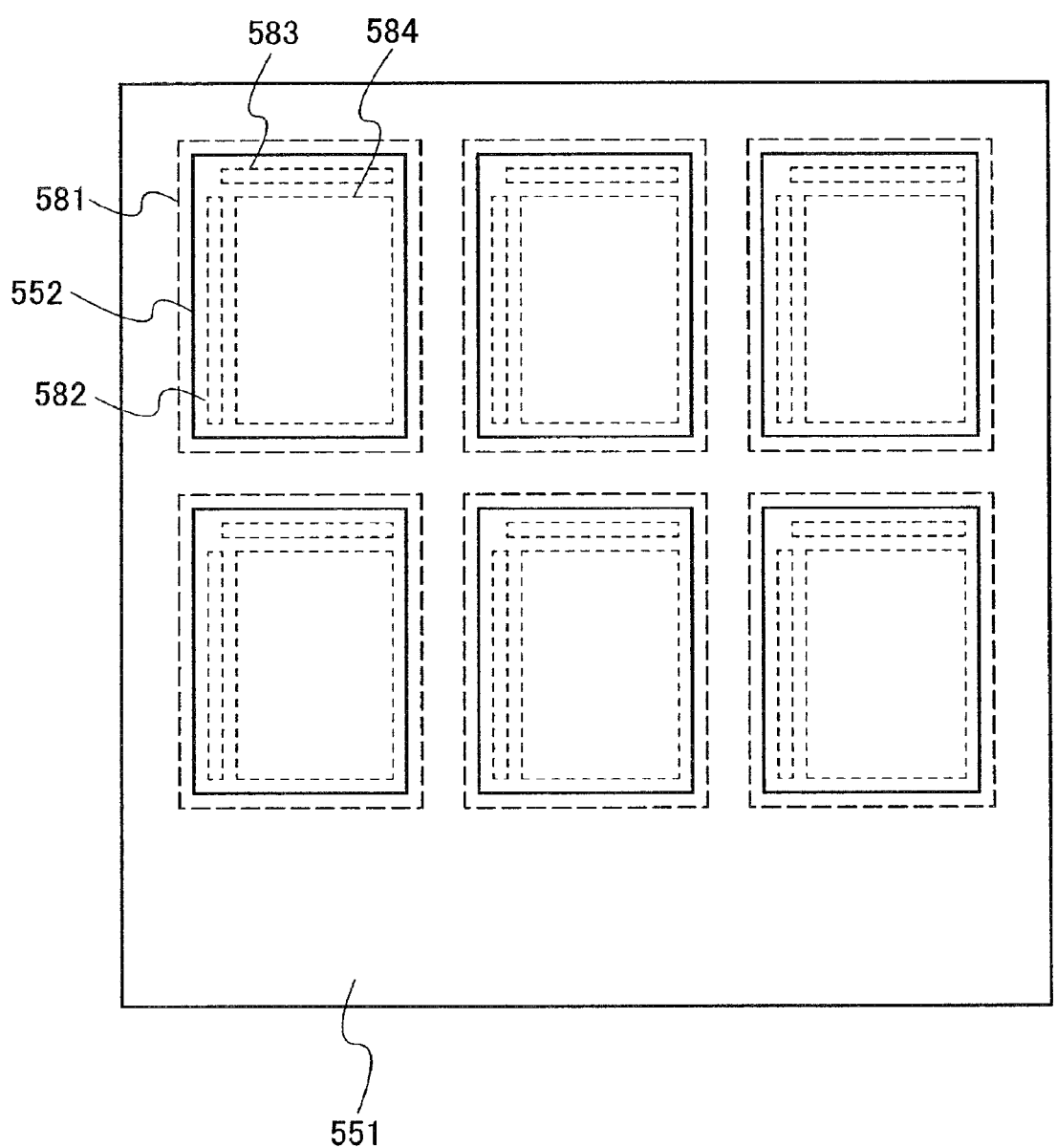
FIG. 10 is a front view of an SOI substrate using a mother glass for a supporting substrate.

A large-sized glass substrate called mother glass over which a display panel is manufactured can be used as a supporting substrate of an SOI substrate. FIG. 10 is a front view of an SOI substrate in which mother glass is used for a supporting substrate 107.

Semiconductor layers 552 which are separated from a plurality of semiconductor wafers are bonded to one mother glass 551. In order to divide the mother glass 551 to produce a plurality of display panels, the semiconductor layers 552 are preferably bonded to the inside of formation regions 581 of the display panels. Each of the display panels includes a scanning line driver circuit, a signal line driver circuit, and a pixel portion. Therefore, the semiconductor layers 552 are bonded to the regions where the above-described driver circuits and pixel portion are formed (a scanning line driver circuit formation region 582, a signal line driver circuit formation region 583, and a pixel formation region 584) in the formation regions 581 of the display panels.

Figure 11A:
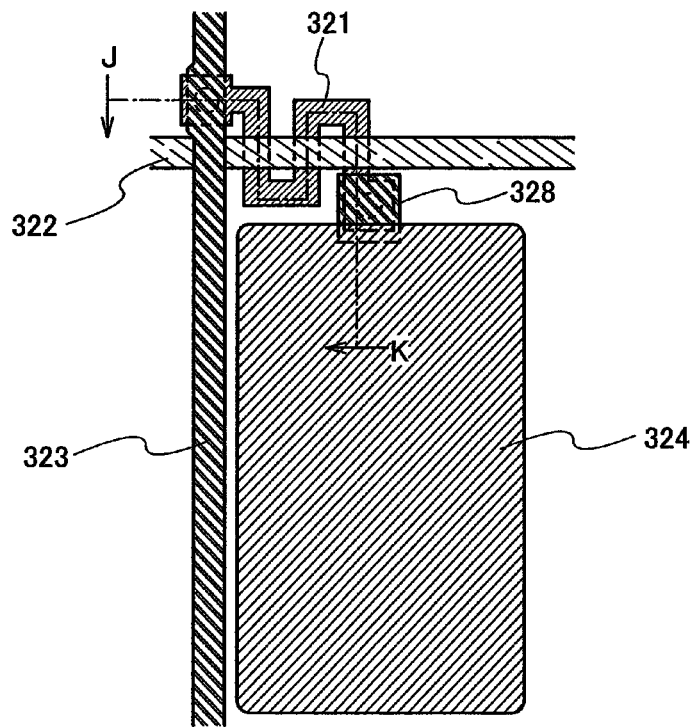
FIG. 11A is a plan view of a pixel of a liquid crystal display device and FIG. 11B is a cross-sectional view taken along a line J-K in FIG. 11A.
Figure 11B:
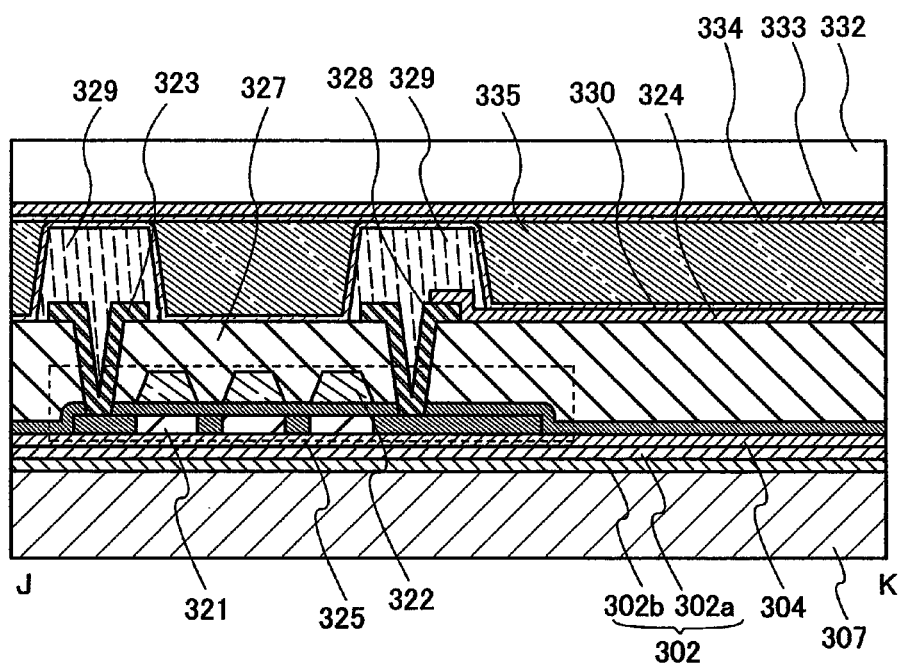

FIGS. 11A and 11B are views for illustrating a liquid crystal display device manufactured using the SOI substrate illustrated in FIG. 10. FIG. 11A is a plane view of a pixel of the liquid crystal display device and FIG. 11B is a cross-sectional view taken along the section line J-K in FIG. 11A.

In FIG. 11A, a semiconductor layer 321 is a layer formed of the semiconductor layer 552 which is attached to the mother glass and included in a TFT of the pixel. Here, the SOI substrate manufactured by the method of Embodiment Mode 1 is used as the SOI substrate. As illustrated in FIG. 11B, over a supporting substrate 307, a substrate in which an insulating layer 302, a second insulating layer 304, and a semiconductor layer are stacked is used. The supporting substrate 307 is the divided mother glass 551. As illustrated in FIG. 11A, the pixel includes the semiconductor layer 321, a scanning line 322 which intersects with the semiconductor layer 321, a signal line 323 which intersects with the scanning line 322, a pixel electrode 324, and an electrode 328 which electrically connects the pixel electrode 324 and the semiconductor layer 321 to each other.

As illustrated in FIG. 11B, a TFT 325 of the pixel is formed over the second insulating layer. A gate electrode of the TFT 325 is included in the scanning line 322, and a source electrode or a drain electrode of the TFT 325 is included in the signal line 323. The signal line 323, the pixel electrode 324, and the electrode 328 are provided over an interlayer insulating film 327. Column spacers 329 are formed over the interlayer insulating film 327, and an orientation film 330 is formed covering the signal line 323, the pixel electrode 324, the electrode 328, and the column spacers 329. A counter substrate 332 is provided with a counter electrode 333 and an orientation film 334 which covers the counter electrode 333. The column spacers 329 are formed in order to maintain a gap between the supporting substrate 307 and the counter substrate 332. A liquid crystal layer 335 is formed in the gap formed by the column spacers 329. At portions where the semiconductor layer 321 is connected to the signal line 323 and the electrode 328, steps are generated in the interlayer insulating film 327 due to formation of the contact holes. The steps disorder the orientation of liquid crystals of the liquid crystal layer 335. Therefore, the column spacers 329 are formed at the steps to prevent disorder of the orientation of liquid crystals.

Figure 12A:
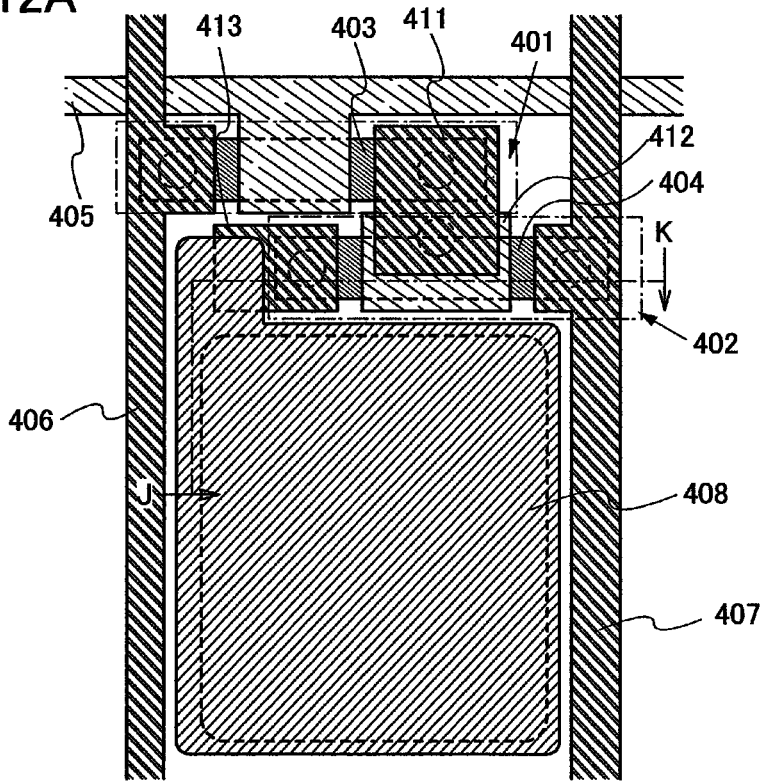
FIG. 12A is a plan view of a pixel of an electroluminescence display device.
Figure 12B:
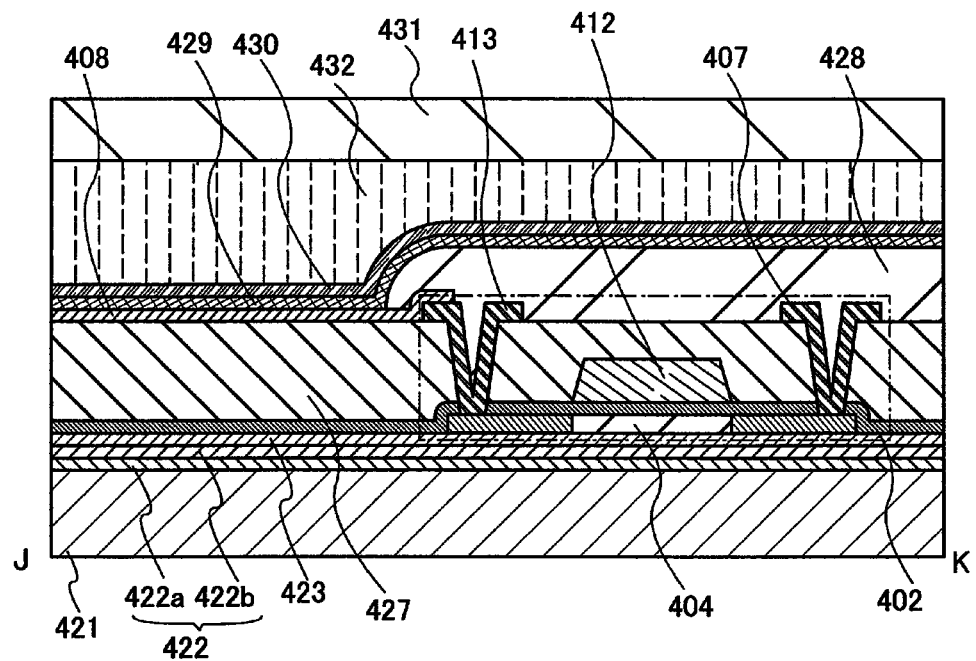
FIG. 12B is a cross-sectional view taken along a line J-K in FIG. 12A.

Next, an electroluminescence display device (hereinafter the device is referred to as an "EL display device") will be described. FIGS. 12A and 12B are drawings illustrating an EL display device manufactured using the SOI substrate illustrated in FIG. 10. FIG. 12A is a plane view of a pixel of the EL display device, and FIG. 12B is a cross-sectional view of the pixel.

FIG. 12A illustrates an example of an electroluminescence display device in which a transistor in a pixel portion is formed of a single crystal semiconductor layer. FIG. 12A is a plane view of a pixel, where a selection transistor 401 and a display control transistor 402 which are TFTs are formed. FIG. 12B is a cross-sectional view illustrating a main part including the display control transistor 402.

A semiconductor layer 403 of the selection transistor 401 and a semiconductor layer 404 of the display control transistor 402 are layers formed by processing of the semiconductor layer 552 of the SOI substrate of FIG. 10. The pixel includes a scanning line 405, a signal line 406, a current supply line 407, and a pixel electrode 408. In the EL display device, each pixel is provided with a light-emitting element having a structure in which a layer including an electroluminescent material (hereinafter this layer is referred to as an "EL layer") is sandwiched between a pair of electrodes. One electrode of the light-emitting element is the pixel electrode 408.

In the selection transistor 401, a gate electrode is included in the scanning line 405, one of a source electrode and a drain electrode is included in the signal line 406, and the other thereof is formed as an electrode 411. In the display control transistor 402, a gate electrode 412 is electrically connected to the electrode 411, one of a source electrode and a drain electrode is formed as an electrode 413 which is electrically connected to the pixel electrode 408, and the other thereof is included in the current supply line 407.

As the SOI substrate, the substrate manufactured by the method of Embodiment Mode 3 is used. Similarly to FIG. 11B, over the supporting substrate 107, a first insulating layer 422, a second insulating layer 423, and a semiconductor layer 404 are stacked. The supporting substrate 107 is the divided mother glass 551.

As illustrated in FIG. 12B, an interlayer insulating film 427 is formed to cover the gate electrode 412 of the display control transistor 402. Over the interlayer insulating film 427, the signal line 406, the current supply line 407, the electrode 411, the electrode 413, and the like are formed. Further, the pixel electrode 408 which is electrically connected to the electrode 413 is formed over the interlayer insulating film 427. The periphery of the pixel electrode 408 is surrounded by a partition wall layer 428, which has an insulating property. An EL layer 429 is formed over the pixel electrode 408, and a counter electrode 430 is formed over the EL layer 429. A counter substrate 431 is provided as a reinforcing plate, and the counter substrate 431 is fixed to the supporting substrate 107 with a resin layer 432. The pixel illustrated in FIGS. 12A and 12B is arranged in a matrix in the pixel portion of an EL display device.

The grayscale of the EL display device is controlled by either a current driving method by which the luminance of the light-emitting element is controlled by current or a voltage driving method by which the luminance thereof is controlled by voltage. The current drive method is difficult to employ when transistors have characteristics which are largely different for each pixel; therefore, a compensation circuit for compensating variation in characteristics is needed. When the SOI substrate of the present invention is used, there is no characteristic variation of the selection transistor 401 and the display control transistor 402 between pixels; therefore, the current driving method can be employed.

As illustrated in FIGS. 11A and 11B and FIGS. 12A and 12B, an SOI substrate can be manufactured using mother glass for manufacturing a display device, and a display device can be manufactured using the SOI substrate. Moreover, since a microprocessor illustrated in FIG. 8 and FIG. 9 can also be formed on this SOI substrate, a display device can be equipped with a computer function. Furthermore, a display device capable of inputting and outputting data without contact can be manufactured.

That is, with use of the SOI substrate of the present invention, various electric appliances can be manufactured. As the electric appliances, there are cameras such as video cameras and digital cameras, navigation systems, audio reproducing devices (such as car audios and audio components), computers, game machines, portable information terminals (such as mobile computers, cellular phones, portable game machines, and electronic books), and image reproducing devices each of which is provided with a recording medium (specifically, devices that can reproduce image data recorded in a recording medium such as a digital versatile disk (DVD) and are equipped with a display device capable of displaying the image).

Figure 13A:
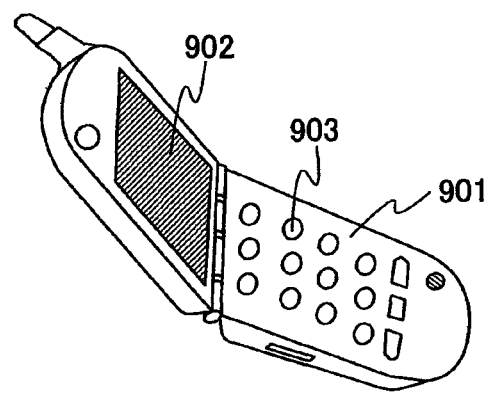
FIGS. 13A to 13C are views each illustrating an electronic device to which the present invention is applied.
Figure 13B:
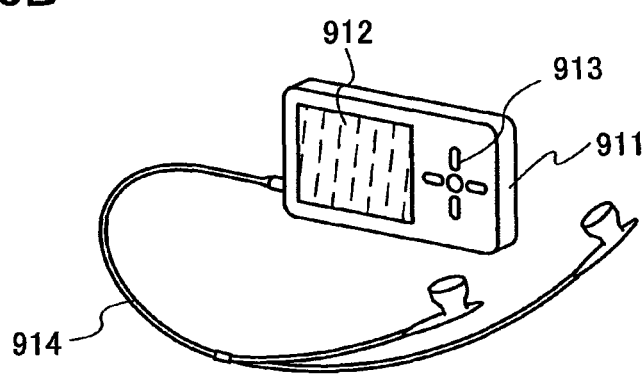
Figure 13C:
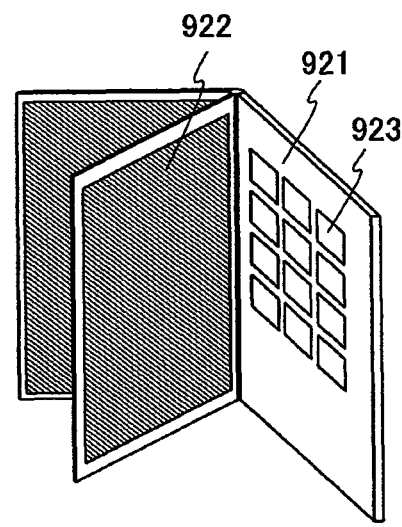

With reference to FIG. 13A to 13C, specific modes of the electric appliances will be described. FIG. 13A is an external view illustrating an example of a cellular phone 901. This cellular phone 901 includes a display portion 902, operation switches 903, and the like. The liquid crystal display device illustrated in FIGS. 11A and 11B or the EL display device illustrated in FIGS. 12A and 12B is applied to the display portion 902, so that the display portion 902 can have little display unevenness and excellent image quality. A semiconductor device formed using the SOI substrate of the present invention can also be applied to a microprocessor, a memory, or the like included in the cellular phone 901.

FIG. 13B is an external view illustrating an example of a structure of a digital player 911. The digital player 911 includes a display portion 912, operation portions 913, an earphone 914, and the like. The earphone 914 can be replaced by a headphone or a wireless earphone. The liquid crystal display device illustrated in FIGS. 11A and 11B or the EL display device illustrated in FIGS. 12A and 12B is applied to the display portion 912, so that high definition images or a large amount of textual information can be displayed even when the screen size is about 0.3 inches to 2 inches. A semiconductor device manufactured using the SOI substrate of the present invention can be applied to a memory portion which stores music information or a microprocessor which are included in the digital player 911.

FIG. 13C is an external view illustrating an e-book reader 921. This e-book reader 921 includes a display portion 922 and operation switches 923. The e-book reader 921 may incorporate a modem or may incorporate the RFCPU illustrated in FIG. 9, so that information can be transmitted and received wirelessly. The liquid crystal display device illustrated in FIGS. 11A and 11B or the EL display device illustrated in FIGS. 12A and 12B is applied to the display portion 922, images with high image quality can be displayed. In the e-book reader 921, a semiconductor device formed using an SOI substrate of the present invention can be applied to a memory portion which stores information or a microprocessor which makes the electronic book 921 operate.

Embodiment Mode 5

With use of a semiconductor device having a display element formed by the present invention, a television device can be completed. An example of a television device having high performance and high reliability will be described.

Figure 14:
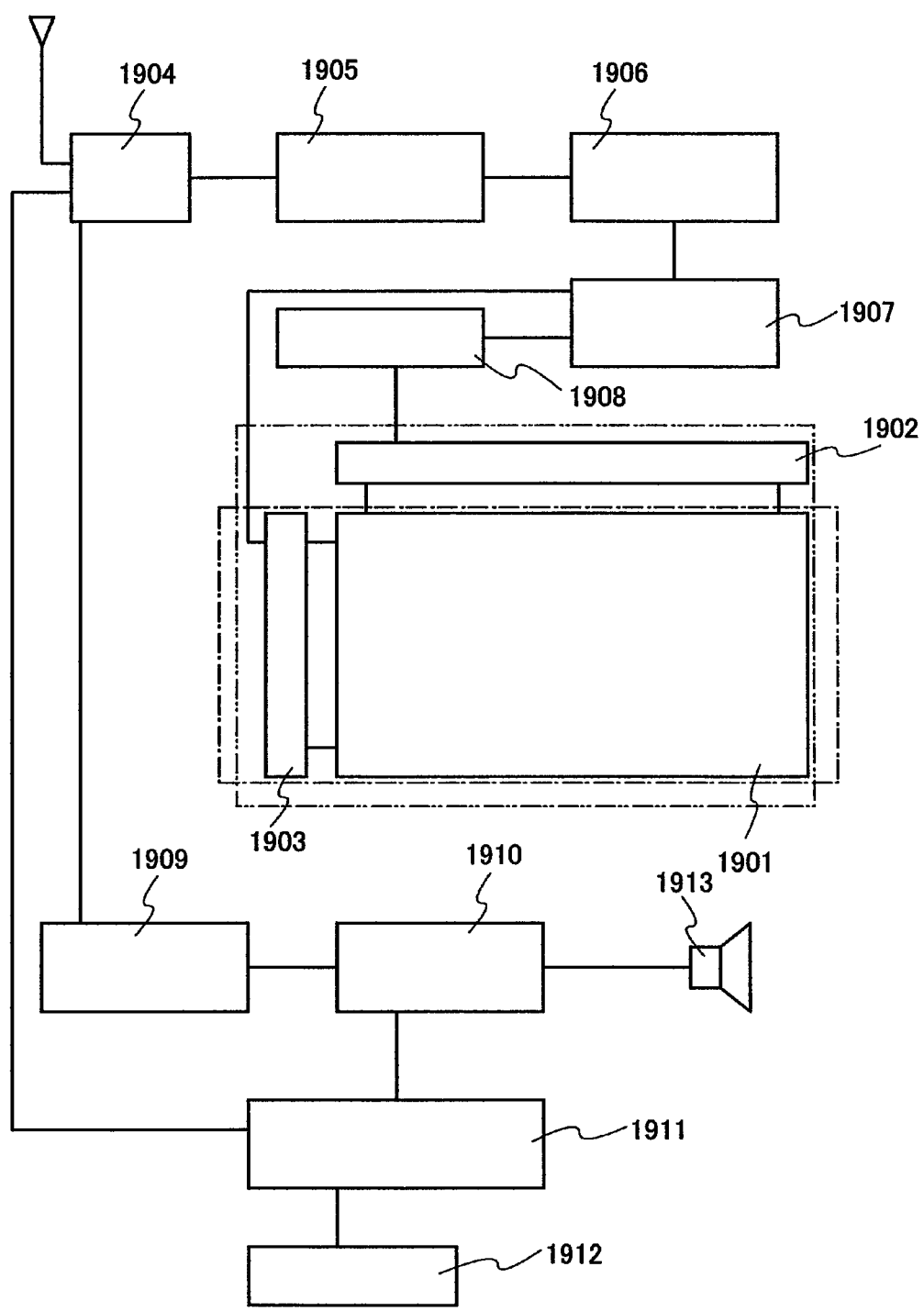
FIG. 14 is a block diagram illustrating a main structure of an electronic device to which the present invention is applied.

FIG. 14 is a block diagram illustrating a main configuration of a television device (e.g., a liquid crystal television device or an EL television device).

As for the structures of other external circuits, a video signal amplifier circuit 1905 for amplifying video signals among signals received by a tuner 1904; a video signal processing circuit 1906 for converting signals outputted from the video signal amplifier circuit 1905 into color signals corresponding to red, green, and blue; a control circuit 1907 for converting the video signals so as to be inputted into the driver ICs; and the like are provided on the input side of the video signals. The control circuit 1907 outputs a signal to each of the scanning line side and the signal line side. In the case of digital driving, a signal divider circuit 1908 may be provided on the signal line side so that input digital signals can be divided into m pieces to be supplied.

Among the signals received by the tuner 1904, an audio signal is transmitted to an audio signal amplifier circuit 1909, and output thereof is supplied to a speaker 1913 through an audio signal processing circuit 1910. A control circuit 1911 receives control information on a receiving station (receiving frequency) or sound volume from an input portion 1912 and transmits the signal to the tuner 1904 or the audio signal processing circuit 1910.

Figure 15A:
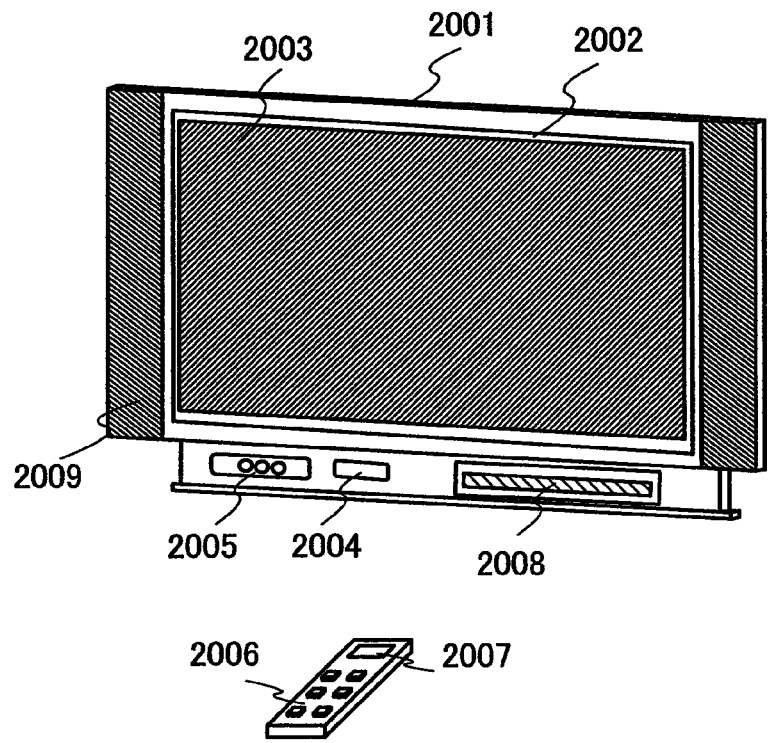
FIGS. 15A and 15B are views each illustrating an electronic device to which the present invention is applied.
Figure 15B:
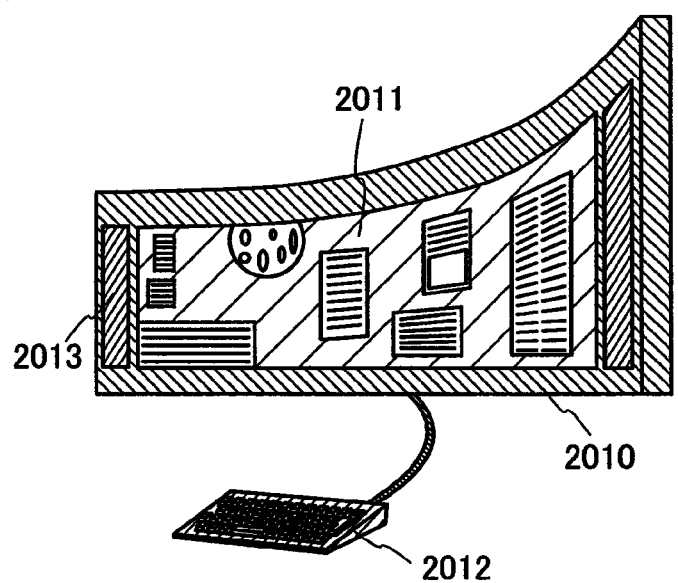

A display module is incorporated into a chassis as illustrated in FIGS. 15A and 15B, so that a television device can be completed. A display panel in which components up to an FPC are set is also generally called an EL display module. Thus, when an EL display module is used, an EL television device can be completed, and when a liquid crystal display module is used, a liquid crystal television device can be completed. A main screen 2003 is formed using the display module, and speaker portions 2009, operation switches, and the like are provided as its accessory equipment. As described above, the television device can be completed by the present invention.

In addition, reflected light of light entering from outside may be blocked with use of a retardation plate or a polarizing plate. In a top-emission semiconductor device, an insulating layer serving as a partition wall may be colored to be used as a black matrix. The partition wall can be formed by a droplet discharging method or the like as well, using pigment-based black resin or a resin material such as polyimide mixed with carbon black or the like, or a stack of these. The partition wall may also be formed in such a manner that different materials are discharged to the same region plural times by a droplet discharging method. A quarter wave plate or a half wave plate may be used as the retardation plate and may be designed to be able to control light. A structure is employed in which a light-emitting element, a sealing substrate (sealing material), a retardation plates (a quarter wave plate and a half wave plate), and a polarizing plate are provided in this order over a TFT element substrate. Light emitted from the light-emitting element travels through these to be emitted outside from the polarizing plate. The retardation plate or the polarizing plate may be provided on the side from which light is emitted or may be provided on the both sides in the case of a dual-emission semiconductor device in which light is emitted from the both sides. In addition, an anti-reflection film may be provided outside the polarizing plate. Accordingly, images with higher resolution and precision can be displayed.

As illustrated in FIG. 15A, a display panel 2002 using display elements is incorporated into a chassis 2001, and in addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. The television device can be operated using switches incorporated into the chassis or by a remote control device 2006 provided separately. A display portion 2007 which displays information to be outputted may be provided for the remote control device 2006.

Further, the television device may include a sub-screen 2008 formed using a second display panel to display channels, volume, or the like, in addition to the main screen 2003. In this structure, the main screen 2003 may be formed of an EL display panel which is excellent in a viewing angle, and the sub-screen may be formed of a liquid crystal display panel capable of displaying images with low power consumption. In order to prioritize low power consumption, a structure may also be employed in which the main screen 2003 is formed using a liquid crystal display panel, the sub-screen 2008 is formed using an EL display panel, and the sub-screen is able to be turned on or off. When the present invention is used, a high-performance and high-reliability semiconductor device can be manufactured with high productivity even with use of many TFTs and electronic components using such a large substrate.

FIG. 15B illustrates a television device which has a large display portion, for example, 20-inch to 80-inch display portion and includes a chassis 2010, a keyboard portion 2012 which is an operation portion, a display portion 2011, speaker portions 2013, and the like. The present invention is applied to the manufacture of the display portion 2011. Since a substance which can be curved is used for the display portion in FIG. 15B, a television device having a curved display portion is obtained. Since the shape of a display portion can be freely designed as described above, a television device having a desired shape can be manufactured.

By the present invention, a high-performance and high-reliability semiconductor device which has a display function can be manufactured with high productivity.

Needless to say, the present invention is not limited to application to a television device, and can be applied to a variety of uses, such as a monitor of a personal computer, a large display medium such as an information display board at the train station, the airport, or the like, or an advertisement display board on the street.

As described above, the application range of the present invention is so wide that the present invention can be applied to electronic devices and information displaying means of various fields.

Embodiment 1

Hereinafter, the present invention will be described in more detail based on Embodiment. Needless to say, the present invention is not limited at all by this embodiment and is specified by the scope of claims. In this embodiment, surface roughness of a semiconductor layer of an SOI substrate will be described.

A manufacturing method of an SOI substrate of this embodiment will be described with reference to FIGS. 16A to 16D. The manufacturing method illustrated in FIGS. 16A to 16D corresponds to the manufacturing method described in Embodiment Mode 1.

A single crystal silicon substrate is prepared as a semiconductor wafer. The single crystal silicon substrate is a p-type silicon substrate of 5 inches in diameter, and the plane orientation thereof is (100) and the side orientation thereof is <110>. Hereinafter, the single crystal silicon substrate is referred to as a "c-Si substrate 601".

The c-Si substrate 601 is washed with pure water, and then dried. Then, with a plasma CVD apparatus, a silicon oxynitride layer 602*a* is formed over the c-Si substrate 601, and a silicon nitride oxide layer 602*b* is formed over the silicon oxynitride layer 602*a* (see FIG. 16A).

When using a parallel plate plasma CVD apparatus, the silicon oxynitride layer 602*a* and the silicon nitride oxide layer 602*b* are successively formed without exposing the c-Si substrate 601 to atmosphere. The film-formation conditions at that time are described below. In this embodiment, before forming the silicon oxynitride layer 602*a*, a step of removing an oxide film of the c-Si substrate 601 by washing of the c-Si substrate 601 with hydrofluoric acid for 60 seconds is performed.

Figure 16A:
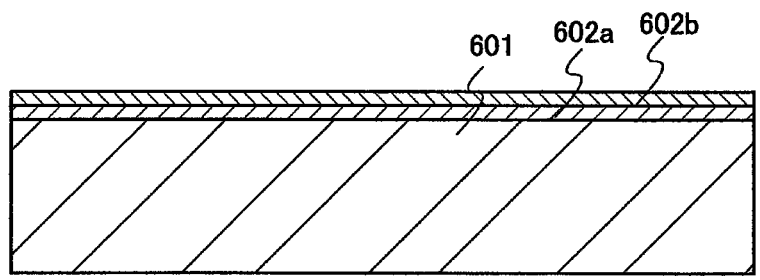
FIGS. 16A to 16D are views illustrating a method for manufacturing an SOI substrate according to Embodiment 1.
Figure 16B:
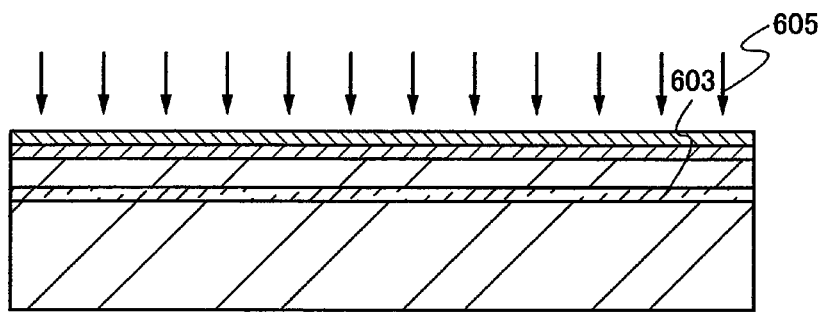

<Silicon Oxynitride Layer 602*a*>
Thickness: 50 nm
Type of gas (flow rate): $SiH_4$ (4 sccm), $N_2O$ (800 sccm)
Substrate temperature: 400° C.
Pressure: 40 Pa
RF frequency: 27 MHz
RF power: 50 W
Distance between electrodes: 15 mm
Electrode area: 615.75 cm$^2$ <Silicon Nitride Oxide Layer 602*b*>
Thickness: 50 nm
Type of gas (flow rate): $SiH_4$ (10 sccm), $NH_3$ (100 sccm), $N_2O$ (20 sccm), $H_2$ (400 sccm)
Substrate temperature: 300° C.
Pressure: 40 Pa
RF frequency: 27 MHz
RF power: 50 W
Distance between electrodes: 30 mm
Electrode area: 615.75 cm$^2$ Next, as illustrated in FIG. 16B, with an ion doping apparatus, the c-Si substrate 601 is irradiated with hydrogen ions to form a damaged layer 603. As a source gas, 100% hydrogen gas is used, and without mass separation of ionized hydrogen, the ionized hydrogen is accelerated by an electric field and the c-Si substrate 601 is irradiated with the ionized hydrogen. Detailed conditions are described below.

Source gas: $H_2$
RF power: 100 W
Acceleration voltage: 40 kV
Dose: $2.0 \times 10^{16}$ ions/cm$^2$ In the ion doping apparatus, three types of ion species that are $H^+$, $H_2^+$, and $H_3^+$ are generated from the hydrogen gas, and the c-Si substrate 601 is doped with all of the ion species. The proportion of $H_3^+$ in the ion species generated from the hydrogen gas is about 80%.

Figure 16C:
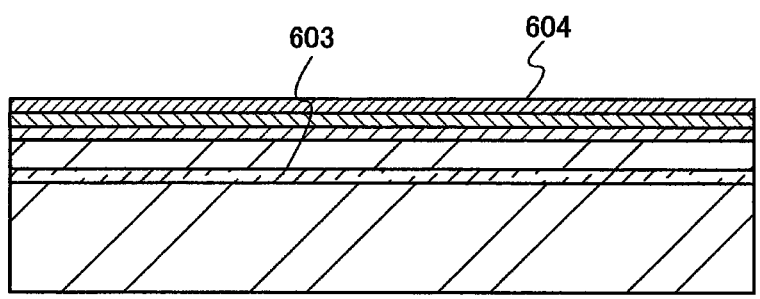
Figure 16D:
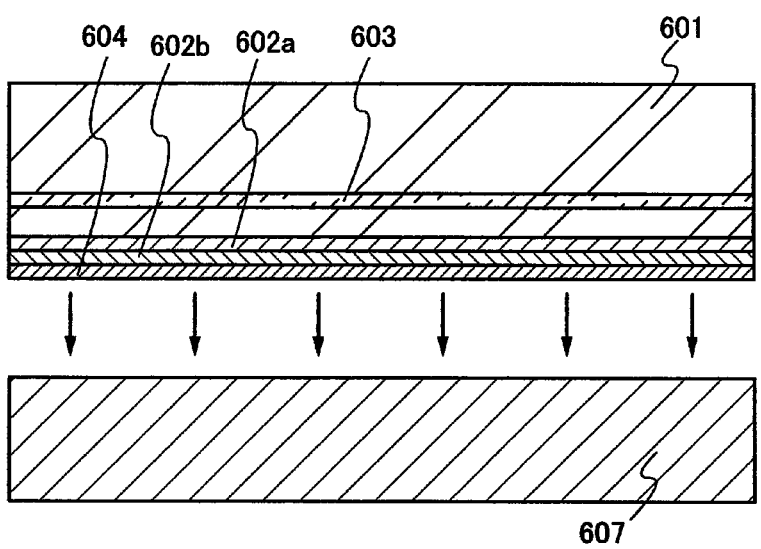

After forming the damaged layer 603, the c-Si substrate 601 is washed with pure water, and a silicon oxide film 604 with a thickness of 50 nm is formed over the silicon nitride oxide layer 602*b* with a plasma CVD apparatus (see FIG. 16C). For a source gas of the silicon oxide film 604, tetraethoxysilane (TEOS: $Si(OC_2H_5)_4$) gas and an oxygen gas are used. Film-formation conditions of the silicon oxide film 604 are described below.

<Silicon Oxide Film 604>
Thickness: 50 nm
Type of gas (flow rate): TEOS (15 sccm), $O_2$ (750 sccm)
Substrate temperature: 300° C.
Pressure: 100 Pa
RF frequency: 27 MHz
RF power: 300 W
Distance between electrodes: 14 mm
Electrode area: 615.75 cm$^2$ A glass substrate 607 is prepared (see FIG. 16D). As the glass substrate 607, an aluminosilicate glass substrate (product name: AN100) manufactured by Asahi Glass Co., Ltd. is used. The glass substrate 607 and the c-Si substrate 601 over which the silicon oxide film 604 is formed are washed. They are washed in pure water with ultrasonic waves and then with pure water containing ozone.

Figure 17A:
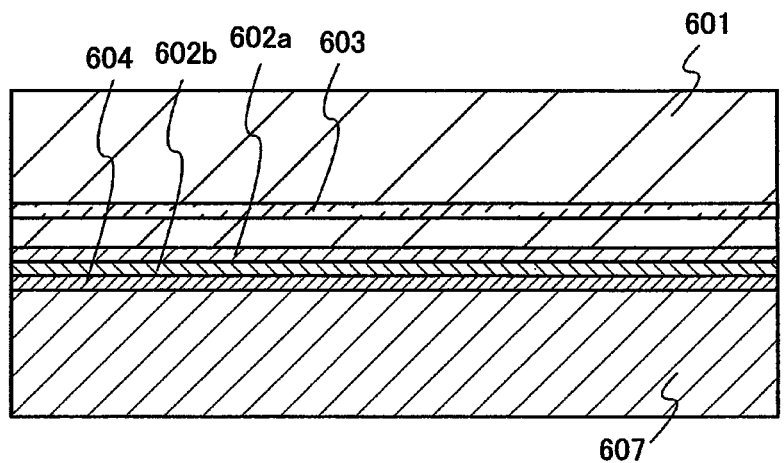
FIGS. 17A to 17C are views illustrating a method for manufacturing an SOI substrate according to Embodiment 1.

Next, as illustrated in FIG. 17A, the glass substrate 607 and the c-Si substrate 600 are made in close contact with each other, so that the glass substrate 607 and the silicon oxide film 604 are bonded. By this step, the glass substrate 607 and the c-Si substrate 601 are bonded to each other. This step is performed at room temperature without heat treatment.

Figure 17B:
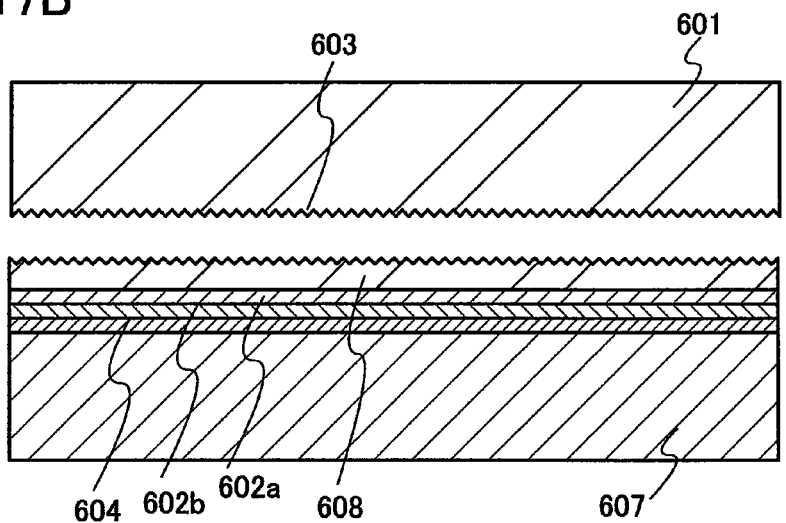

Next, heat treatment is performed in a diffusion furnace, so that separation is performed at the damaged layer 603 as illustrated in FIG. 17B. First, heating at 200° C. is performed for two hours, and the heating temperature is increased to 600° C. to perform heating for another two hours. By this series of heat treatment, a crack is generated at the damaged layer 603 in the c-Si substrate 601, so that the c-Si substrate 601 is separated at the damaged layer 603. When the c-Si substrate 601 is heated at 600° C. or higher in this step, the crystallinity of the silicon layer after separation can be made closer to the crystallinity of a single crystal semiconductor substrate.

After the heat treatment, the glass substrate 607 and the c-Si substrate 601 are taken out of the diffusion furnace. Since the glass substrate 607 and the c-Si substrate 601 are in the state of being able to be separated from each other by the heat treatment, an SOI substrate in which a silicon layer 608 separated from the c-Si substrate 601 is attached to the glass substrate 607 is formed when the c-Si substrate 601 is removed.

The SOI substrate has a structure in which the silicon oxide film 604, the silicon nitride oxide layer 602b, the silicon oxynitride layer 602a, and the silicon layer 608 are stacked in this order over the glass substrate 607. In this embodiment, the thickness of the silicon layer 608 is about 120 nm.

Figure 17C:
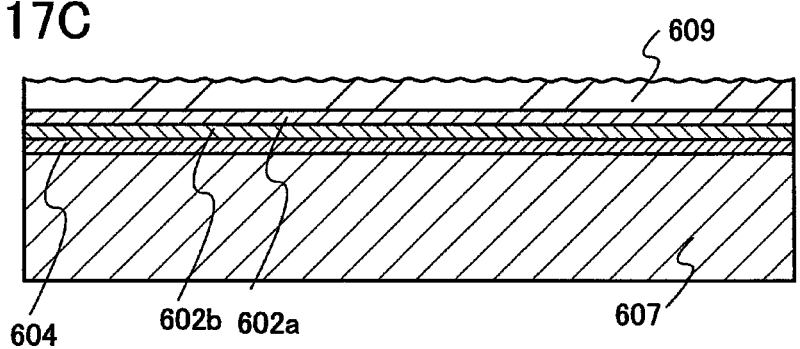

Next, as illustrated in FIG. 17C, a surface of the silicon layer 608 of the SOI substrate is etched by wet etching. The silicon layer 608 is etched by wet etching, so that the thickness thereof becomes 95 nm. The etching conditions of the silicon layer 608 are as follows:
Etchant (wt %): TMAH (0.034 wt %)
Processing temperature: 30° C.

Figure 18A:
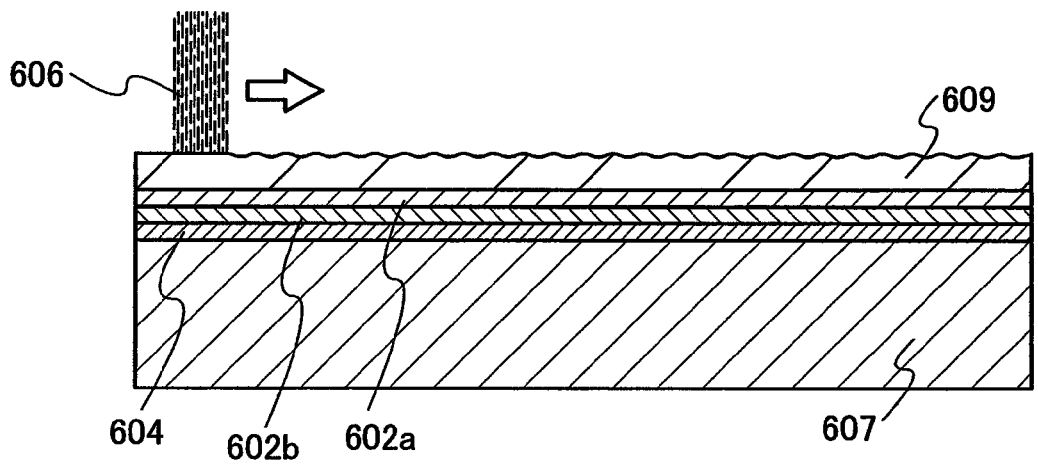
FIGS. 18A to 18C are views illustrating a method for manufacturing an SOI substrate according to Embodiment 1.
Figure 18B:
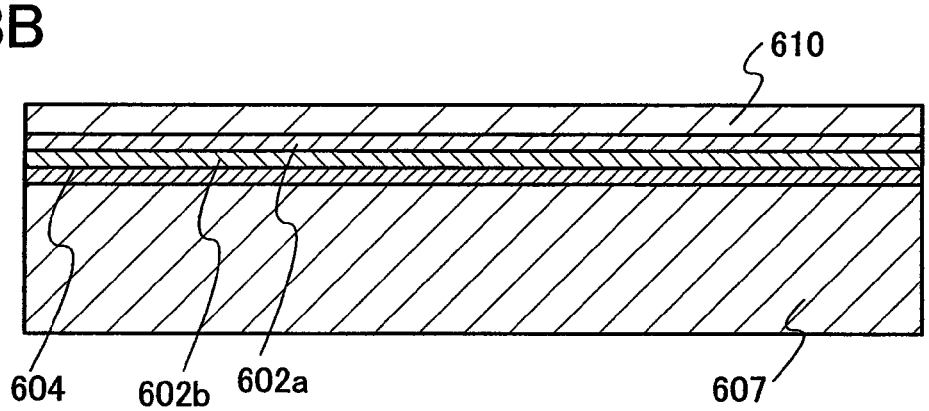

Next, as illustrated in FIG. 18A, a silicon layer 609 of the SOI substrate is irradiated with a laser beam 606 to form the SOI substrate having a silicon layer 610. The silicon layer 610 of FIG. 18B corresponds to the silicon layer 609 after irradiation with the laser beam 606.

Figure 18C:
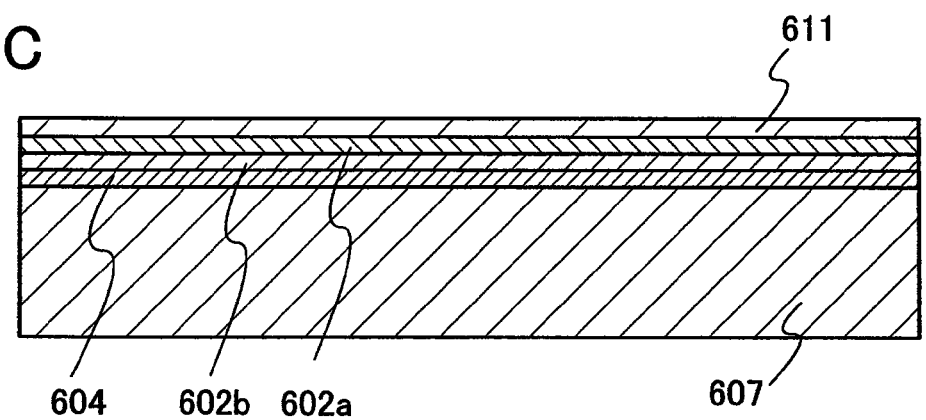

Then, the silicon layer 610 is etched by dry etching to reduce the thickness thereof to 60 nm. Through the above-described steps, the SOI substrate illustrated in FIG. 18C is formed.

The specification of the laser used for laser beam irradiation of FIG. 18A is described below.
<Specification of the Laser>
XeCl excimer laser
Wavelength: 308 nm
Pulse width: 25 nsec
Repetition frequency: 30 Hz The laser beam 606 is a linear beam whose beam spot is linear and which is formed by an optical system including a cylindrical lens or the like. The glass substrate 607 is irradiated with the laser beam 606 while being moved relative to the laser beam 606. At this time, the scanning speed of the laser beam 606 is set at 1.0 mm/sec, and the same region is irradiated with 12 shots of the laser beam 606.

Further, the atmosphere of the laser beam 606 is set to be an air atmosphere or a nitrogen atmosphere. In this embodiment, the nitrogen atmosphere is formed in such a manner that while irradiation with the laser beam 606 is performed in an air atmosphere, a nitrogen gas is blown to the surface to be irradiated.

The irradiation with the laser beam 606 was performed with an energy density of about 540 mJ/cm$^2$ to 700 mJ/cm$^2$.

The inventors measured the surface roughness of the silicon layer due to the irradiation with the laser beam 606 after wet etching. Moreover, they measured the surface roughness of the silicon layer due to dry etching or wet etching after the irradiation with the laser beam 606.

The surface roughness of the silicon layer and the crystallinity thereof can be analyzed by observation with an optical microscope, an atomic force microscope (AFM), and a scanning electron microscope (SEM), by observation of an electron back scatter diffraction pattern (EBSP), by Raman spectroscopy, or the like.

In this embodiment, for the analysis of the surface roughness of the silicon layer 611, the mean surface roughness (Ra) of the silicon layer, the root-mean-square surface roughness (RMS) thereof, and the maximum difference in height between peak and valley (P–V) thereof were measured with an atomic force microscope (AFM).

In this embodiment, the mean surface roughness (Ra) refers to a mean surface roughness obtained by three-dimensional expansion of a centerline mean roughness (Ra) that is defined by JISBO601:2001 (ISO4287:1997) so as to be able to be applied to a measurement surface. The Ra can be represented by a mean value of the absolute values of the deviation from a reference surface to a specified surface, and is calculated by the formula below.

$$R_a = \frac{1}{S_0} \int_{Y_1}^{Y_2} \int_{X_1}^{X_2} |F(X, Y) - Z_0| dX dY \quad \text{[Formula 1]}$$

Note that the measurement surface refers to a surface illustrated by all measurement data and is calculated by the formula below.

$$Z = F(X, Y) \quad \text{[Formula 2]}$$

The specified surface refers to a surface which is an object of roughness measurement, and a rectangular region surrounded by four points represented by the coordinates $(X_1, Y_1)$, $(X_1, Y_2)$, $(X_2, Y_1)$, and $(X_2, Y_2)$. The area of the specified surface when the specified surface is ideally flat is represented by $S_0$. Note that $S_0$ is obtained by the formula below.

$$S_0 = (X_2 - X_1) \cdot (Y_2 - Y_1) \quad \text{[Formula 3]}$$

The reference surface refers to a plane surface represented by $Z = Z_0$ when the mean value of the height of the specified surface is represented by $Z_0$. The reference surface is parallel to the XY plane. Note that $Z_0$ can be obtained by the formula below.

$$Z_0 = \frac{1}{S_0} \int_{Y_1}^{Y_2} \int_{X_1}^{X_2} F(X, Y) dX dY \quad \text{[Formula 4]}$$

The root-mean-square surface roughness (RMS) refers to a root-mean-square surface roughness obtained by three-dimensional expansion of the RMS of a cross section curve so as to be able to be applied to the measurement surface, similarly to the mean surface roughness (Ra). The RMS can be represented by the square root of the mean value of the square of the deviation from the reference surface to the specified surface, and is obtained by the formula below.

$$R_{ms} = \sqrt{\frac{1}{S_0} \int_{Y_1}^{Y_2} \int_{X_1}^{X_2} \{F(X, Y) - Z_0\}^2 dX dY} \quad \text{[Formula 5]}$$

The maximum difference in height between peak and valley (P–V) can be represented by a difference between the height of the highest peak $Z_{max}$ and the height of the lowest valley $Z_{min}$ in the specified surface, and is obtained by the formula below.

$$P-V = Z_{max} - Z_{min} \quad \text{[Formula 6]}$$

The peak and the valley in this embodiment refer to a peak and a valley obtained by three-dimensional expansion of the "peak" and the "valley" defined by JISB0601:2001 (ISO4287:1997). The peak is represented by the highest part of the peaks in the specified surface. The valley is represented by the lowest part of the valleys in the specified surface.

The measurement conditions of the mean surface roughness (Ra), the root-mean-square surface roughness (RMS), and the maximum difference in height between peak and valley (P–V) in this embodiment are described below.
Atomic force microscope (AFM): scanning probe microscope SPI3800N/SPA500 (manufactured by Seiko Instruments Inc.)
Measurement mode: dynamic force mode (DFM mode)
Cantilever: SI-DF40 (made of silicon, a spring constant of 42 N/m, resonance frequency of 250 kHz to 390 kHz inclusive, edge of probe R≤10 nm)
Scanning speed: 1.0 Hz
Measurement area: 10×10 μm
Measurement point: 256×256 points
Note that DMF mode is a measurement mode in which a surface shape is measured while the distance between a probe and a sample is controlled with a cantilever resonated at a certain frequency (a frequency peculiar to the cantilever) so that the oscillation amplitude of the lever becomes constant. Since the surface of the sample is measured without contact in this DFM mode, the measurement can be carried out while maintaining the original shape without damaging the surface of the sample.

In this embodiment, surface roughness of each of (A) a silicon layer after separation of the c-Si substrate (unprocessed silicon layer), (B) a silicon layer after wet etching, (C) a silicon layer after laser irradiation, (D) a silicon layer irradiated with a laser beam after wet etching, (E) a silicon layer irradiated with a laser beam after wet etching and then etched by dry etching, and (F) a silicon layer irradiated with a laser beam after wet etching and then etched by wet etching was measured under the above-described conditions, so that images of three-dimensional surface shapes were obtained. In consideration of the curvature of a cross section of a substrate of each obtained measured image, all the data of the images were fitted for one-dimensional plane by a least-squares method with attached software to perform the first gradient correction for correcting the gradient in the plane, followed by the second gradient correction for correcting the quadratic curve, which was performed in a similar manner to the first gradient correction. After that, the surface roughness was analyzed with the attached software, so that each of the mean surface roughness (Ra), the root-mean-square surface roughness (RMS), and the maximum difference in height between peak and valley (P–V) was calculated.

Figure 19A:
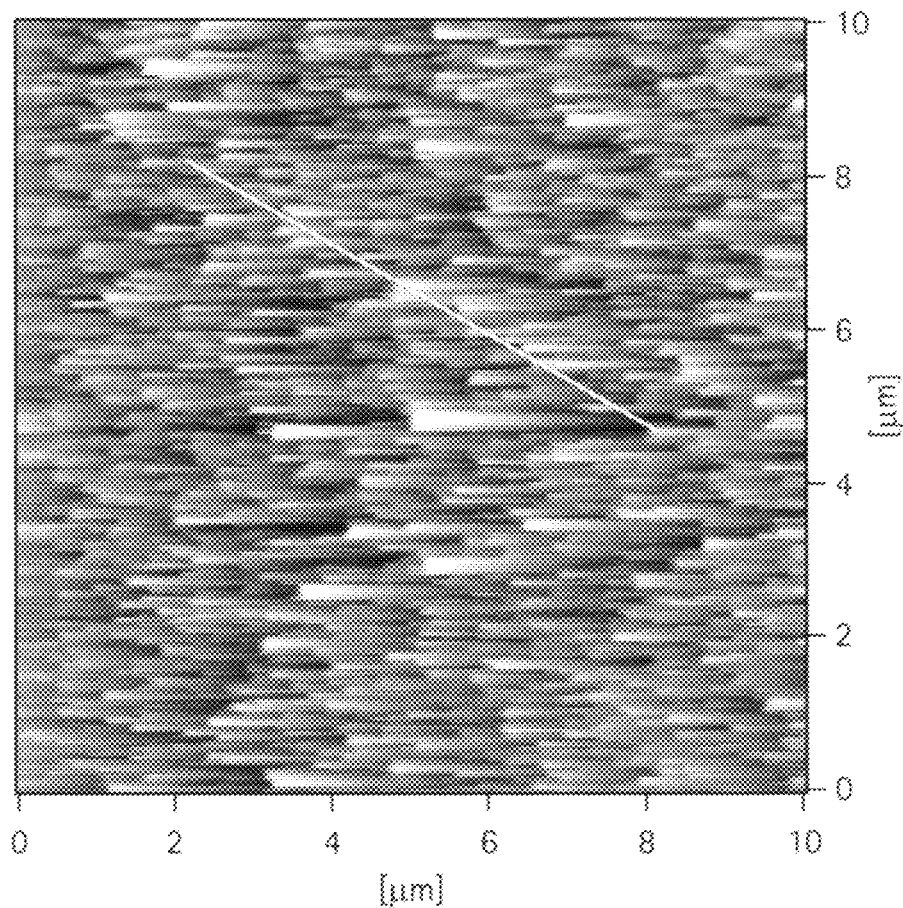
FIGS. 19A to 19F are DFM images of silicon layers observed with an AFM.
Figure 19B:
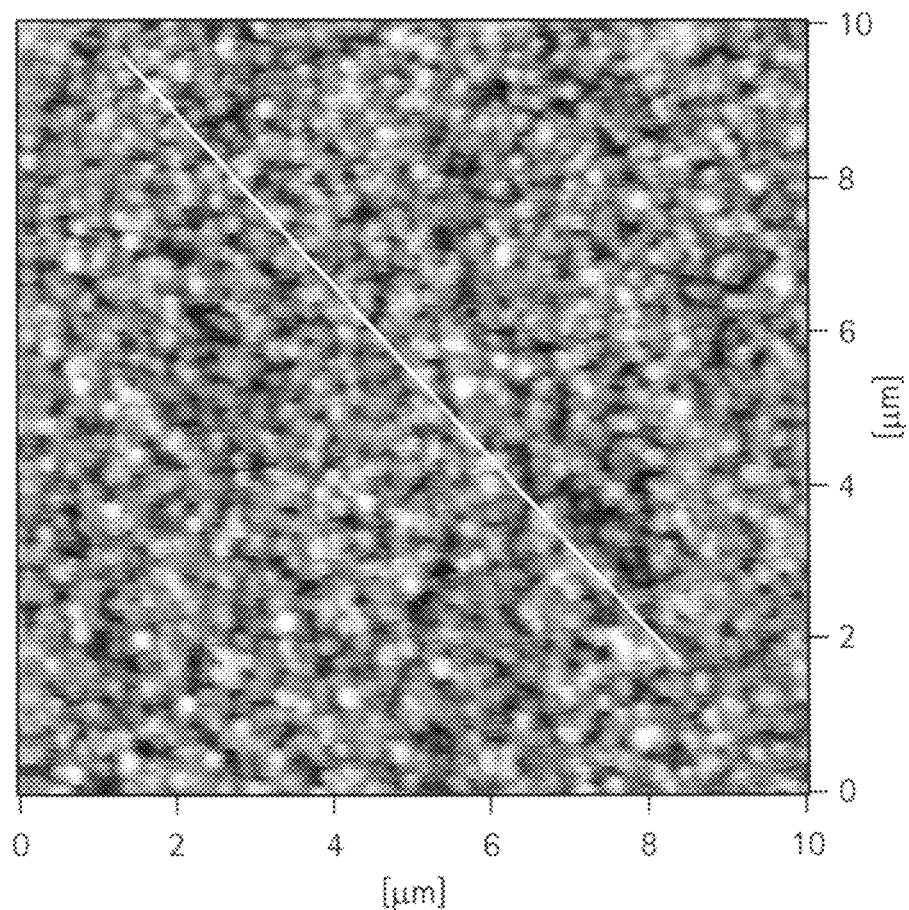
Figure 19C:
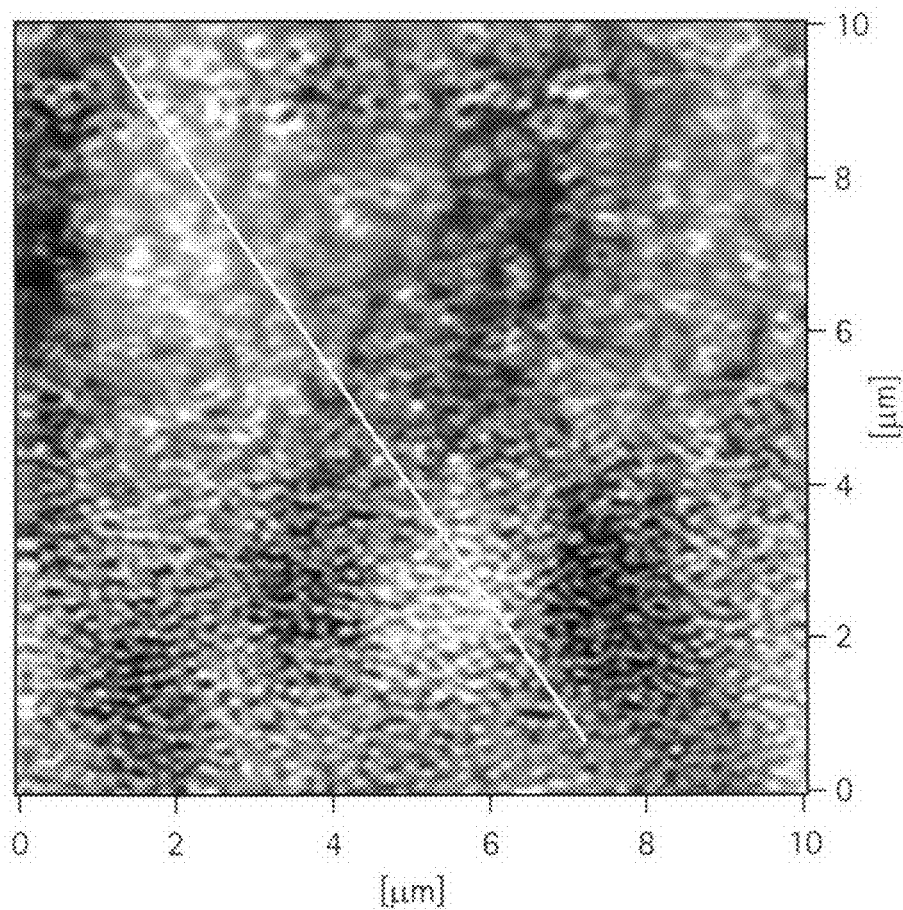
Figure 19D:
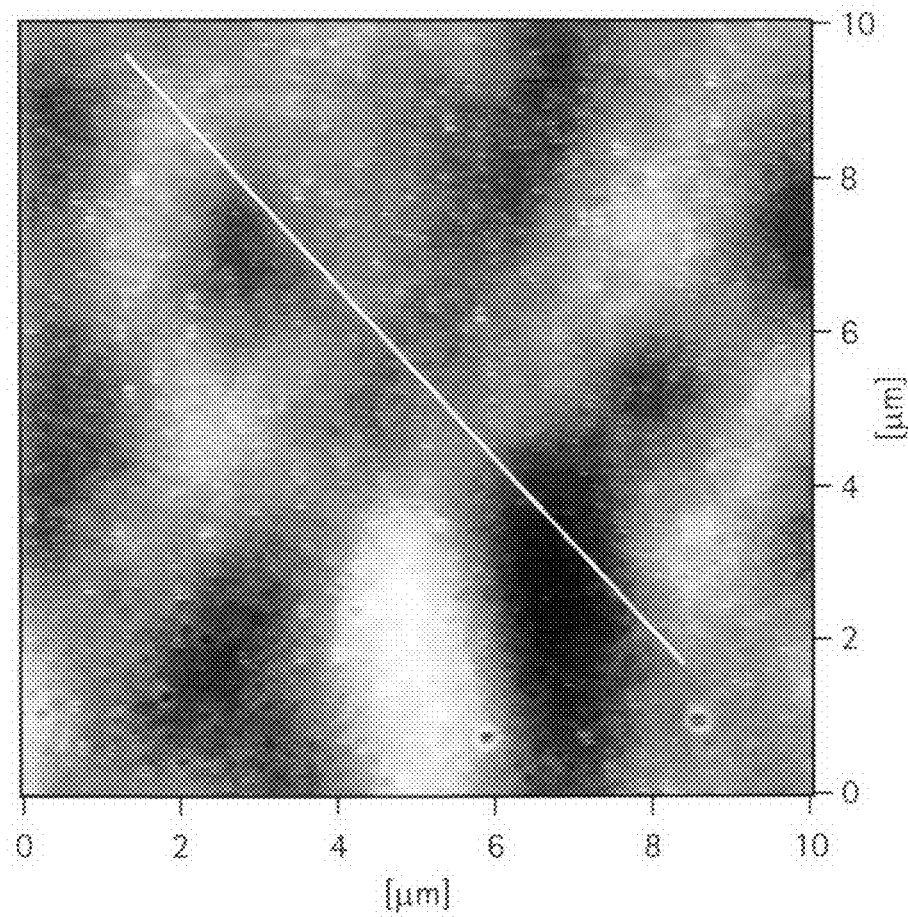
Figure 19E:
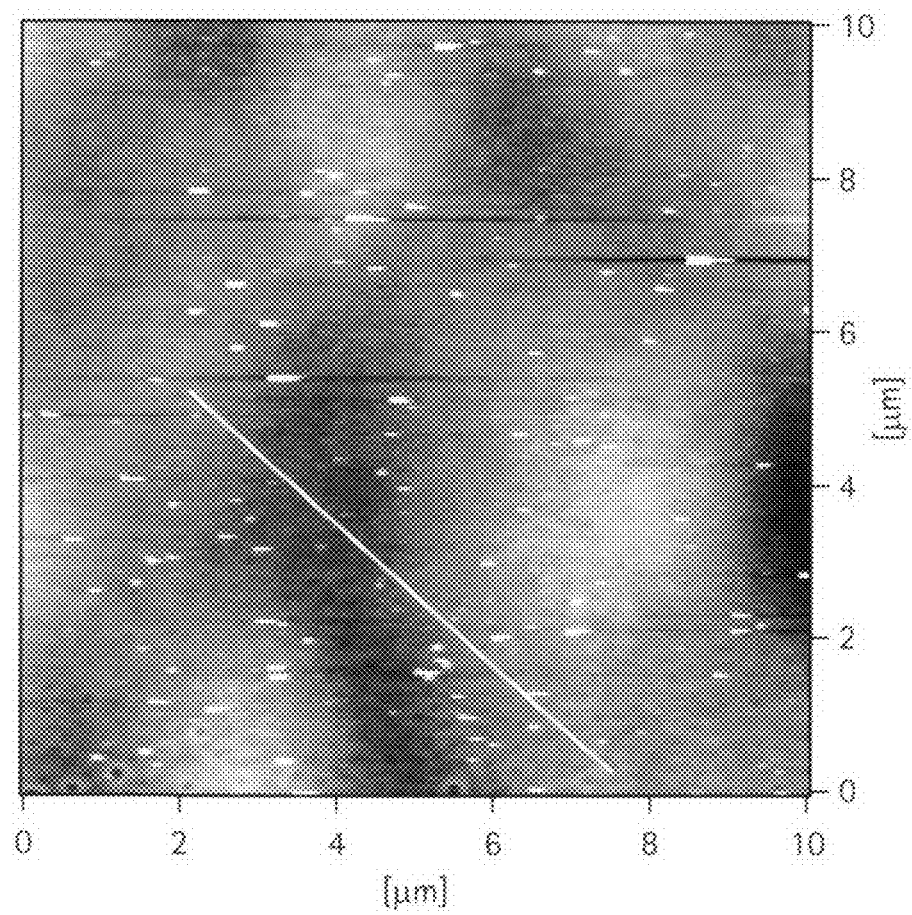
Figure 19F:
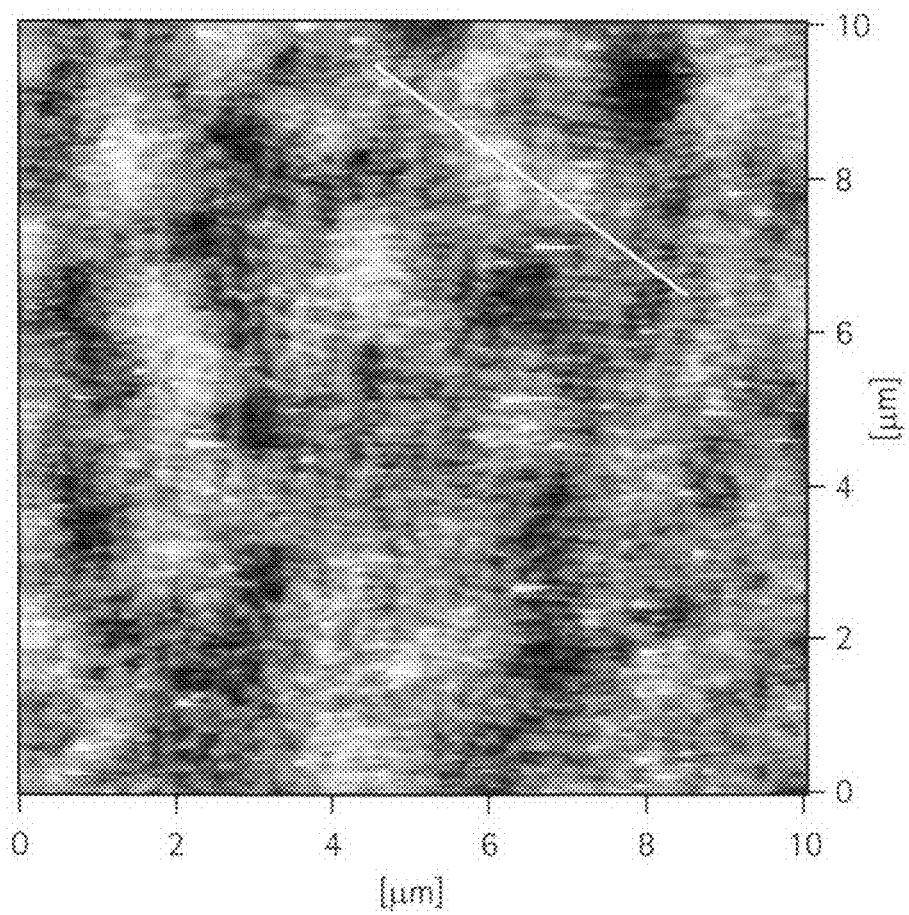
Figure 20A:
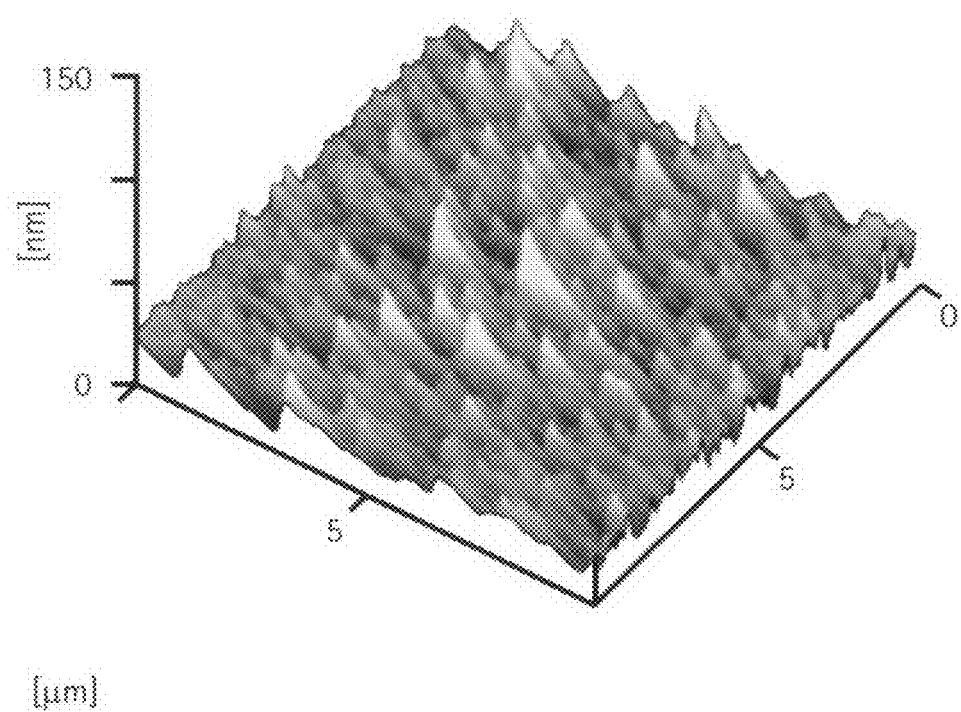
FIGS. 20A to 20F are DFM images of silicon layers observed with an AFM.

FIGS. 19A to 19F illustrate observation results with AFM. FIG. 19D illustrates an observation image of the surface of the silicon layer irradiated with a laser beam after wet etching. In order to confirm an effect of the laser beam irradiation after wet etching, an observation image of the surface of the silicon layer (unprocessed silicon layer) after separating the c-Si substrate is illustrated in FIG. 19A, an observation image of the surface of the silicon layer after wet etching is illustrated in FIG. 19B, and an observation image of the surface of the silicon layer after laser beam irradiation is illustrated in FIG. 19C. FIG. 19E illustrates an observation image of the surface of the silicon layer irradiated with a laser beam after wet etching, and then further etched by dry etching. FIG. 19F illustrates an observation image of the surface of the silicon layer irradiated with a laser beam after wet etching, and then further etched by wet etching. Moreover, FIGS. 19A to 19F correspond to bird's-eye views of FIGS. 20A to 20F, respectively. Note that, in the observation image of the surface of the silicon layer which is illustrated in FIG. 19A and the bird's-eye view thereof which is illustrated in FIG. 20A, the images flow laterally; however, it does not affect the analysis of the surface roughness due to the definition formulae of the mean surface roughness (Ra), the root-mean-square surface roughness (RMS), and the maximum different in height between peak and valley (P–V).

The surface roughness calculated according to the DFM images of FIGS. 19A to 19F is illustrated in Table 1.

TABLE 1

| | Mean Surface Roughness (Ra) [nm] | Root-Mean-Square Surface Roughness (RMS) [nm] | Maximum Difference between Peak and Valley (P-V) [nm] |
| --- | --- | --- | --- |
| (A) Without Processing | 5.89 | 7.74 | 85.8 |
| (B) Wet Etching | 5.03 | 6.34 | 51.0 |
| (C) Laser Beam Irradiation | 1.17 | 1.49 | 11.4 |
| (D) Wet Etching + Laser Beam Irradiation | 0.575 | 0.808 | 10.0 |
| (E) Wet Etching + Laser Beam Irradiation + Dry Etching | 0.439 | 0.738 | 17.3 |
| (F) Wet Etching + Laser Beam Irradiation + Wet Etching | 1.81 | 2.39 | 27.1 |

Figure 20B:
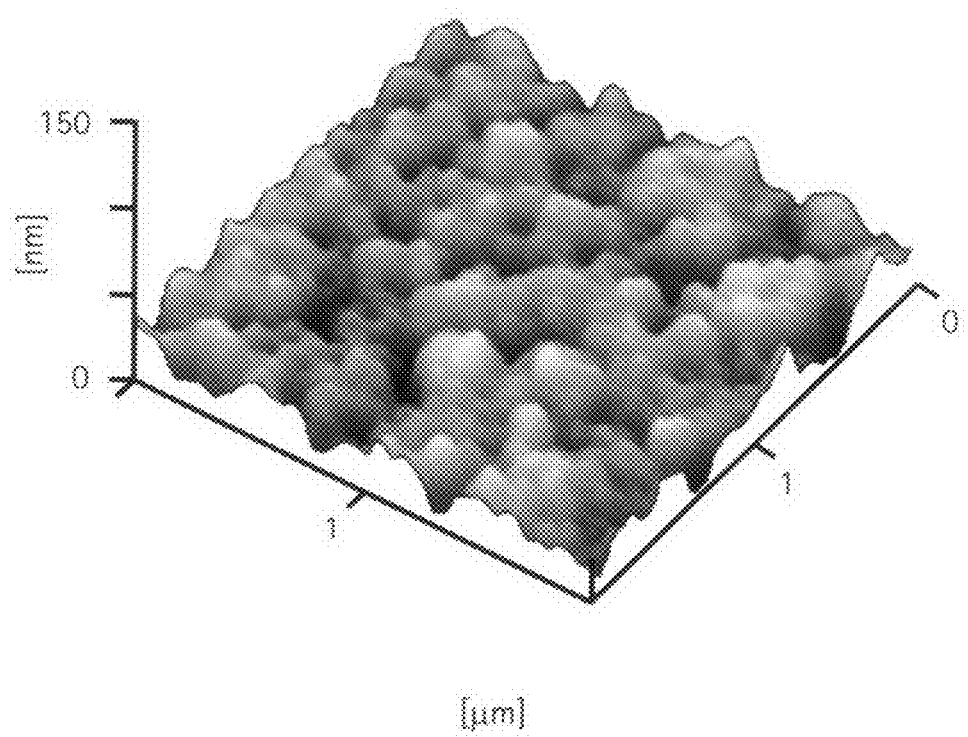
Figure 20C:
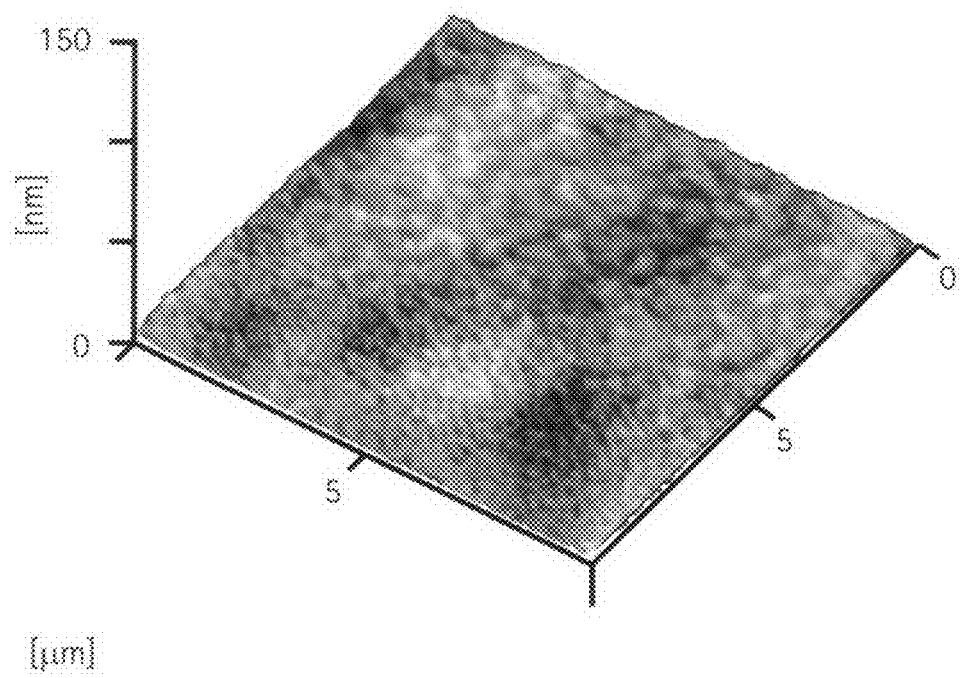
Figure 20D:
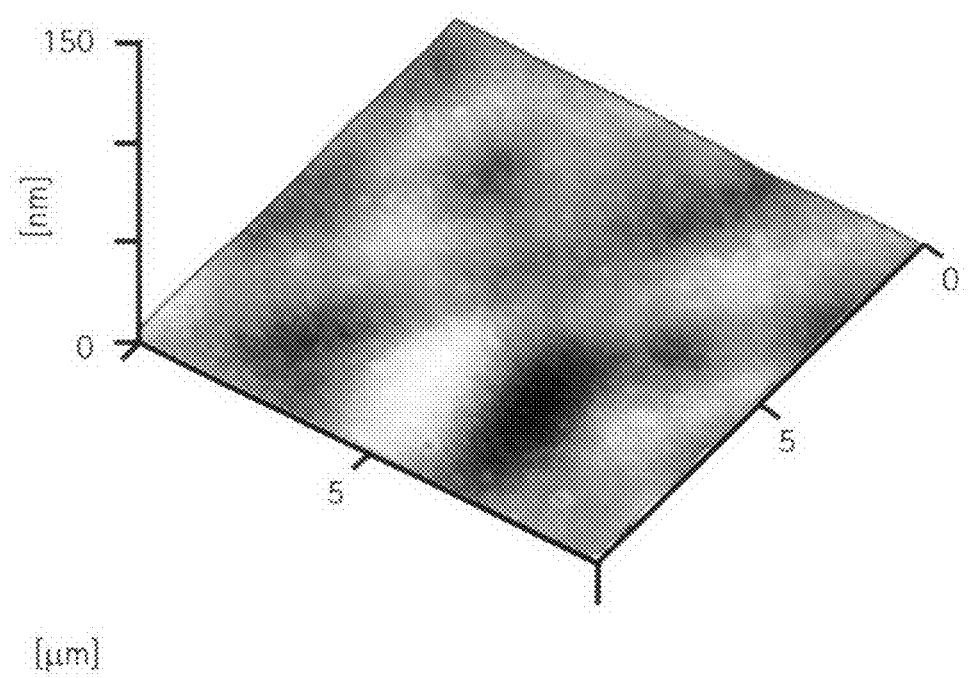
Figure 20E:
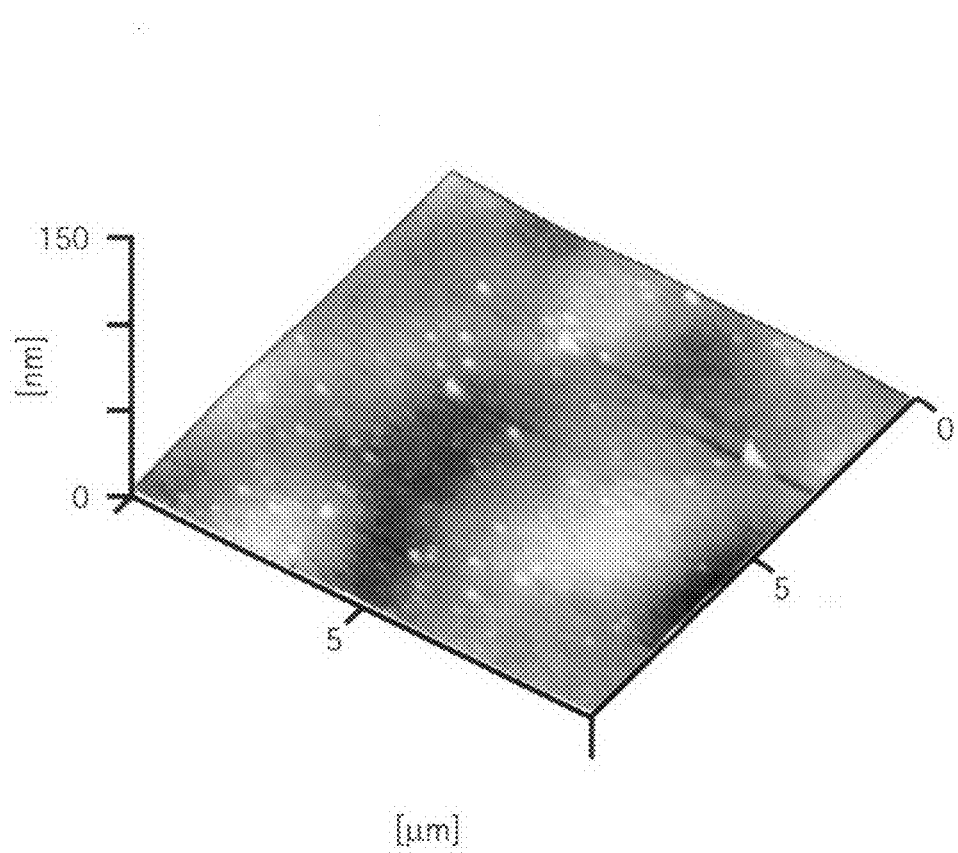
Figure 20F:
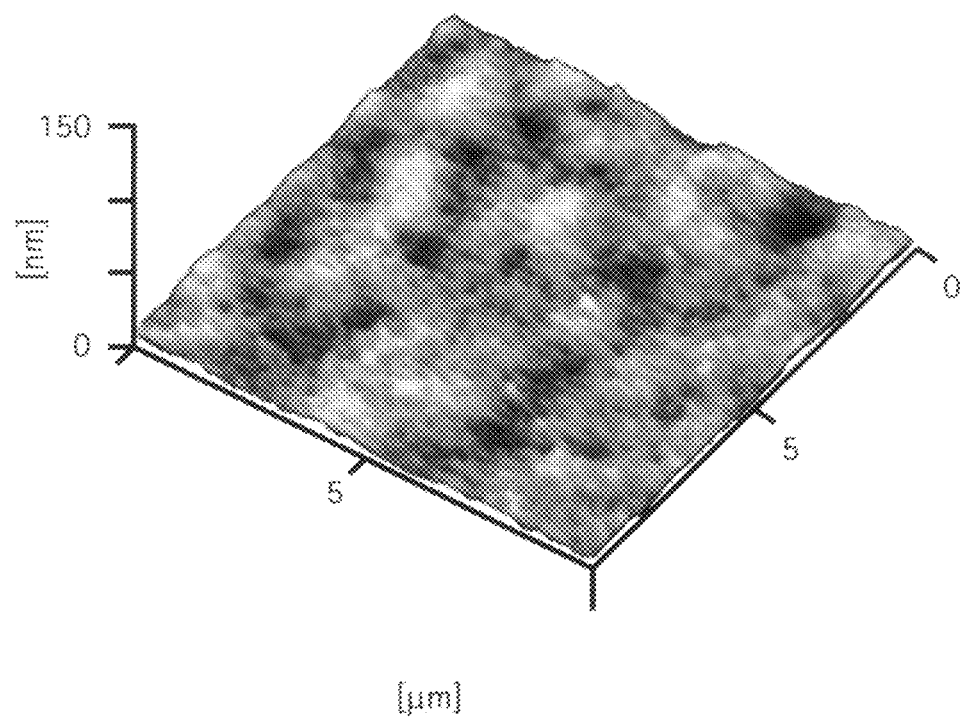

Since the bird's-eye view of the unprocessed silicon layer illustrated in FIG. 20A keeps a shape at the time of separation, the surface of the silicon layer has steep projections. When the silicon layer is etched by wet etching, the crystal defects or damage at the time of separation of the surface of the silicon layer can be removed; therefore, the steep projections with a large superficial area can be made smooth as illustrated in FIG. 20B. However, crystal defects in the silicon layer are not removed, and thus the crystallinity of the silicon layer is not recovered. In addition, the crystallinity in the silicon layer can be recovered by irradiation of the silicon layer with a laser beam; however, crystal defects or damage at the time of separation of the surface of the semiconductor layer of FIG. 20C is taken into the semiconductor layer. Thus, the crystal defects remain in the silicon layer. The crystal defects or the damage at the time of separation of the surface of the semiconductor layer is removed by wet etching, and the silicon layer from which the crystal defects or the damage at the time of separation is removed is irradiated with a laser beam, whereby a silicon layer which is planarized and whose crystallinity is recovered can be obtained.

The Ra of the unprocessed silicon layer illustrated in Table 1 is greater than or equal to 5 nm and the RMS thereof is greater than or equal to 7 nm; however, the Ra of the silicon layer which is irradiated with laser beam after wet etching is decreased to about 0.5 nm and the RMS thereof is decreased to about 0.8 nm. The Ra and the RMS of the silicon layer on which laser annealing is performed after wet etching are smaller than those of the silicon layer on which only laser annealing is performed. Therefore, by reduction in the thickness of the silicon layer having planarity, a high-performance transistor which makes the most use of advantages of the single crystal silicon layer whose thickness is reduced can be manufactured.

According to Table 1, FIGS. 19A to 19F, and FIGS. 20A to 20F, it was found that improvement in planarity of the silicon layer which is separated from the single crystal silicon substrate can be realized by laser beam irradiation after wet etching.

This application is based on Japanese Patent Application serial No. 2007-265012 filed with Japan Patent Office on Oct. 10, 2007, the entire contents of which are hereby incorporated by reference.

What is claimed is:

1. A method for manufacturing an SOI substrate, comprising the steps of:
    irradiating a semiconductor wafer with ions to form a damaged layer in the semiconductor wafer;
    bonding the semiconductor wafer to a supporting substrate;
    heating the semiconductor wafer to separate the semiconductor wafer at the damaged layer so that a single crystal semiconductor layer on which at least a part of the damaged layer remains is formed over the supporting substrate;
    performing wet etching to remove the damaged layer on the single crystal semiconductor layer; and
    after performing the wet etching, irradiating the single crystal semiconductor layer with a laser beam,
    wherein the ions include $H^+$, $H_2^+$ and $H_3^+$, and
    wherein $H_3^+$ is included in the ions at greater than or equal to 50%.

2. The method for manufacturing an SOI substrate according to claim 1, further comprising the step of:
    performing dry etching of the single crystal semiconductor layer after the step of irradiating the single crystal semiconductor layer with the laser beam.

3. The method for manufacturing an SOI substrate according to claim 1, further comprising the step of:
    performing an additional wet etching of the single crystal semiconductor layer after the step of irradiating the single crystal semiconductor layer with the laser beam.

4. The method for manufacturing an SOI substrate according to claim 1, wherein the supporting substrate is a glass substrate.

5. A method for manufacturing a semiconductor device with use of an SOI substrate manufactured by the manufacturing method according to claim 1, wherein a semiconductor element including the single crystal semiconductor layer over the supporting substrate is manufactured.

6. The method for manufacturing an SOI substrate according to claim 1, wherein a part of the single crystal semiconductor layer is removed in the step of wet etching.

7. The method for manufacturing an SOI substrate according to claim 1, further comprising a step of forming a barrier layer over one surface of the semiconductor wafer, wherein the barrier layer includes nitrogen.

8. The method for manufacturing an SOI substrate according to claim 1, further comprising a step of forming a barrier layer over the supporting substrate, wherein the barrier layer includes nitrogen.

9. A method for manufacturing an SOI substrate, comprising the steps of:
    forming a first insulating layer over one surface of a semiconductor wafer, wherein the first insulating layer includes nitrogen;
    irradiating the semiconductor wafer with ions from the one surface of the semiconductor wafer through the first insulating layer to form a damaged layer in the semiconductor wafer;
    forming a second insulating layer over the first insulating layer;
    bonding the semiconductor wafer to a supporting substrate with the second insulating layer interposed between the semiconductor wafer and the supporting substrate;
    heating the semiconductor wafer to separate the semiconductor wafer at the damaged layer so that a single crystal semiconductor layer on which at least a part of the damaged layer remains is formed over the supporting substrate;
    performing wet etching to remove the damaged layer on the single crystal semiconductor layer; and
    after performing the wet etching, irradiating the single crystal semiconductor layer with a laser beam,
    wherein the ions include $H^+$, $H_2^+$ and $H_3^+$, and
    wherein $H_3^+$ is included in the ions at greater than or equal to 50%.

10. The method for manufacturing an SOI substrate according to claim 9, further comprising the step of:
    performing dry etching of the single crystal semiconductor layer after the step of irradiating the single crystal semiconductor layer with the laser beam.

11. The method for manufacturing an SOI substrate according to claim 9, further comprising the step of:
    performing an additional wet etching of the single crystal semiconductor layer after the step of irradiating the single crystal semiconductor layer with the laser beam.

12. The method for manufacturing an SOI substrate according to claim 9, wherein the supporting substrate is a glass substrate.

13. A method for manufacturing a semiconductor device with use of an SOI substrate manufactured by the manufacturing method according to claim 9, wherein a semiconductor element including the single crystal semiconductor layer over the supporting substrate is manufactured.

14. The method for manufacturing an SOI substrate according to claim 9, wherein a part of the single crystal semiconductor layer is removed in the step of wet etching.

15. The method for manufacturing an SOI substrate according to claim 9, further comprising a step of forming a barrier layer over the supporting substrate, wherein the barrier layer includes nitrogen.

16. A method for manufacturing an SOI substrate, comprising the steps of:
    forming a bonding layer over a semiconductor wafer;
    irradiating the semiconductor wafer with ions through the bonding layer to form a damaged layer in the semiconductor wafer;
    bonding the semiconductor wafer to a supporting substrate with the bonding layer interposed between the semiconductor wafer and the supporting substrate;
    heating the semiconductor wafer to separate the semiconductor wafer at the damaged layer so that a single crystal semiconductor layer on which at least a part of the damaged layer remains is formed over the supporting substrate;
    performing wet etching to remove the damaged layer on the single crystal semiconductor layer; and
    after performing the wet etching, irradiating the single crystal semiconductor layer with a laser beam,
    wherein the ions include $H^+$, $H_2^+$ and $H_3^+$, and
    wherein $H_3^+$ is included in the ions at greater than or equal to 50%.

17. The method for manufacturing an SOI substrate according to claim 16, further comprising the step of:
    forming an insulating layer over the supporting substrate before the step of bonding the semiconductor wafer to the supporting substrate.

18. The method for manufacturing an SOI substrate according to claim 16, further comprising the step of:
performing dry etching of the single crystal semiconductor layer after the step of irradiating the single crystal semiconductor layer with the laser beam.

19. The method for manufacturing an SOI substrate according to claim 16, further comprising the step of:
performing an additional wet etching of the single crystal semiconductor layer after the step of irradiating the single crystal semiconductor layer with the laser beam.

20. The method for manufacturing an SOI substrate according to claim 16, wherein the supporting substrate is a glass substrate.

21. A method for manufacturing a semiconductor device with use of an SOI substrate manufactured by the manufacturing method according to claim 16, wherein a semiconductor element including the single crystal semiconductor layer over the supporting substrate is manufactured.

22. The method for manufacturing an SOI substrate according to claim 16, wherein a part of the single crystal semiconductor layer is removed in the step of wet etching.

23. The method for manufacturing an SOI substrate according to claim 16, further comprising a step of forming a barrier layer over the supporting substrate, wherein the barrier layer includes nitrogen.

* * * * *